United States Patent
Nezuka

(10) Patent No.: US 10,484,003 B2
(45) Date of Patent: Nov. 19, 2019

(54) A/D CONVERTER

(71) Applicant: DENSO CORPORATION, Kariya, Aichi-pref. (JP)

(72) Inventor: Tomohiro Nezuka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/224,213

(22) Filed: Dec. 18, 2018

(65) Prior Publication Data

US 2019/0215004 A1    Jul. 11, 2019

(30) Foreign Application Priority Data

Jan. 11, 2018    (JP) .................... 2018-002771

(51) Int. Cl.
*H03M 3/00*   (2006.01)
*H03M 3/02*   (2006.01)
*H03F 3/45*   (2006.01)

(52) U.S. Cl.
CPC .............. *H03M 3/02* (2013.01); *H03F 3/45* (2013.01); *H03F 2203/45514* (2013.01)

(58) Field of Classification Search
CPC .............. H03M 3/02; H03M 3/30; H03F 3/45
USPC ........................................ 341/144, 155, 143
See application file for complete search history.

(56) References Cited

U.S. PATENT DOCUMENTS

| | | | |
|---|---|---|---|
| 6,967,611 B2* | 11/2005 | Atriss | H03M 1/162 341/155 |
| 6,999,014 B2 | 2/2006 | Oliaei et al. | |
| 2004/0008133 A1* | 1/2004 | Manganaro | H03M 1/804 341/150 |

OTHER PUBLICATIONS

Pieter Rombouts et al., "A 13.5-b 1.2V Micropower Extended Counting A/D Converter," IEEE Journal of Solid-State Circuits, vol. 36, No. 2, Feb. 2001, pp. 176-183.
Pedram Payandehnia et al., "Multi-Step Counting ADC," MWSCAS 2014, Aug. 2014, pp. 17-20.
Chia-Hung Chen et al., "Incremental Analog-to-Digital Converters for High-Resolution Energy-Efficient Sensor Interfaces," IEEE Journal on Emerging and Selected Topics in Circuits and Systems, vol. 5, No. 4, Dec. 2015, pp. 612-623.

* cited by examiner

*Primary Examiner* — Peguy Jean Pierre
(74) *Attorney, Agent, or Firm* — Posz Law Group, PLC

(57) ABSTRACT

An A/D converter includes an integrator having an operational amplifier, a first feedback capacitor, and a second feedback capacitor, a quantizer outputting a quantization result of an output signal of the operational amplifier, and a D/A converter having a D/A converter capacitor. The D/A converter capacitor has a first terminal connected to an input terminal of the operational amplifier and a second terminal connected to an output terminal of the operational amplifier. The D/A converter performs a subtraction operation by repeating subtraction of charges accumulated in the first and second feedback capacitors based on the quantization result, and performs a cyclic operation by sequentially repeating subtraction and amplification of the charges accumulated in one of the first and second feedback capacitors based on the quantization result.

8 Claims, 49 Drawing Sheets

ABBREVIATED - acknowledging length

A/D CONVERTER

CROSS REFERENCE TO RELATED APPLICATION

The present application claims the benefit of priority from Japanese Patent Application No. 2018-2771 filed on Jan. 11, 2018. The entire disclosure of the above application is incorporated herein by reference.

TECHNICAL FIELD

The present disclosure relates to an A/D converter.

BACKGROUND

Control circuits for controlling automobiles and industrial equipment are becoming increasingly digitized, and it is common to convert an analog signal output from a sensor for detecting a physical state of the equipment into a digital signal by an A/D converter, and then control the equipment using a result of digital signal processing.

SUMMARY

The present disclosure provides an A/D converter that includes an integrator having an operational amplifier, a first feedback capacitor, and a second feedback capacitor, a quantizer outputting a quantization result of an output signal of the operational amplifier, and a D/A converter having a D/A converter capacitor. The D/A converter performs a subtraction operation by repeating subtraction of charges accumulated in the first and second feedback capacitors based on the quantization result, and performs a cyclic operation by sequentially repeating subtraction and amplification of the charges accumulated in one of the first and second feedback capacitors based on the quantization result.

BRIEF DESCRIPTION OF THE DRAWINGS

Additional objects and advantages of the present disclosure will be more readily apparent from the following detailed description when taken together with the accompanying drawings. In the drawings.

DETAILED DESCRIPTION

Figure 1:
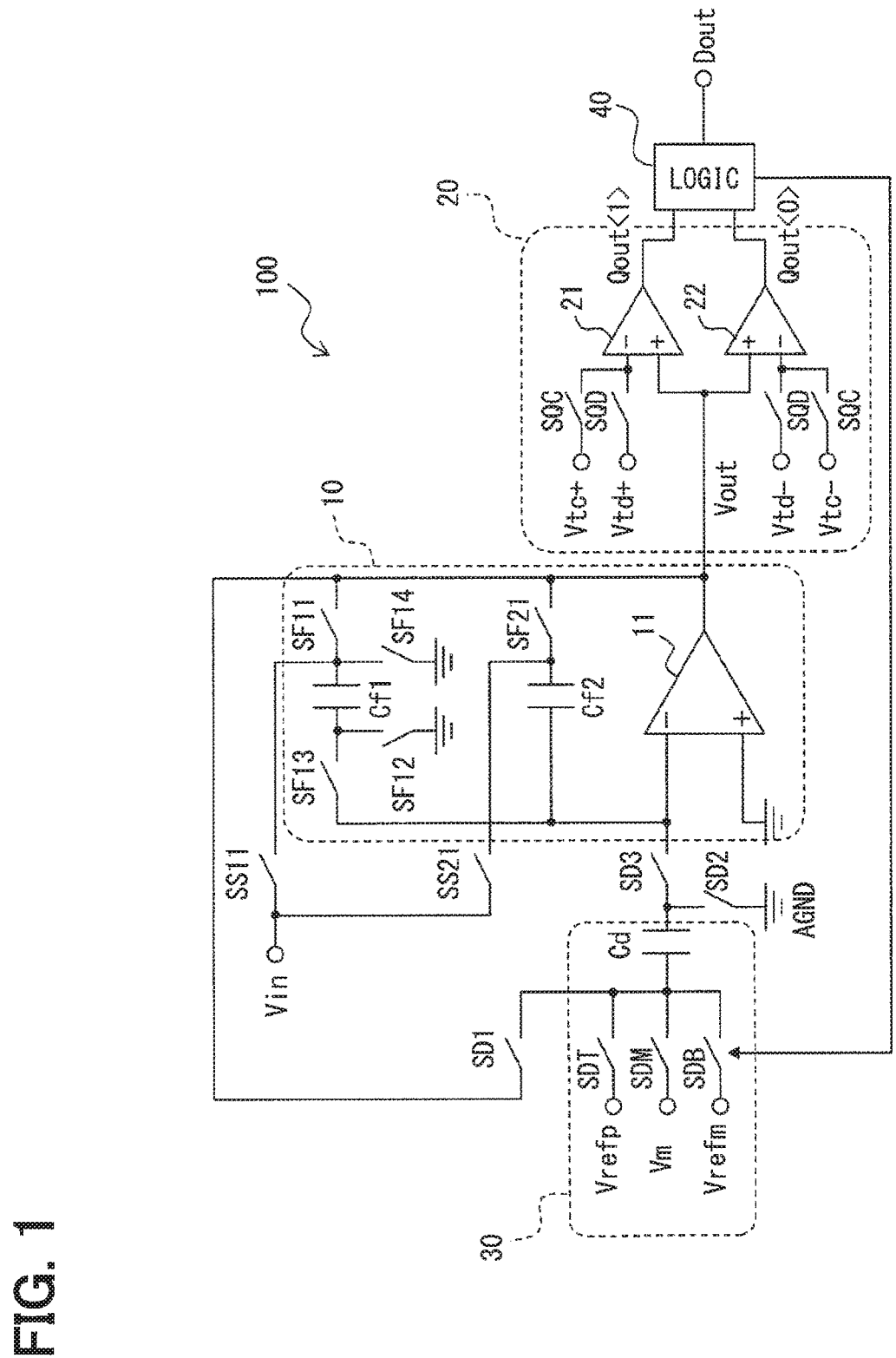
FIG. 1 is a circuit diagram showing a schematic configuration of an A/D converter according to a first embodiment.

Before describing embodiments of the present disclosure, a comparative example will be described.

In an incremental delta (incremental Δ) type A/D converter according to a comparative example, a feedback amount by a D/A converter is made variable. In the A/D converter, with the use of different feedback amounts, the number of cycles of circuit operation required for A/D conversion can be reduced as compared to a system using a single amount of feedback, and high-speed A/D conversion can be realized in a range in which the resolution of A/D conversion is relatively low.

However, the A/D converter has an issue that the number of cycles required for A/D conversion increases exponentially as the resolution of the A/D conversion increases.

In addition, since the signal is not amplified in a process of transitioning from the operation of the A/D conversion using a large feedback amount by the D/A converter to the operation of the A/D conversion using a small feedback amount, there is an issue that the accuracy required for the comparator used in a quantizer for quantizing an output of an operational amplifier becomes higher as the resolution becomes higher, that is, as the accuracy becomes higher.

In order to realize high precision A/D conversion, a ratio of the large feedback amount to the small feedback amount needs to be high in accuracy. Although the magnitude of the feedback amount is generally determined according to an element value of a capacitive element or a resistance element, there is an error in the element value of the capacitive element or the resistive element. This makes it difficult to realize the ratio of the multiple feedback amounts of different magnitudes with high accuracy, and there is an issue that it becomes more difficult to realize the ratio when the ratio is increased with the higher resolution.

An A/D converter according to an aspect of the present disclosure includes an integrator, a quantizer, and a D/A converter. The integrator includes an operational amplifier, and a first feedback capacitor and a second feedback capacitor which are connected in parallel with each other between a first input terminal and an output terminal of the operational amplifier. The quantizer outputs a quantization result (Qout) obtained by quantizing an output signal (Vout) output from the output terminal of the operational amplifier. The D/A converter includes a D/A converter capacitor having a first terminal connected to the first input terminal of the operational amplifier. The integrator includes a first feedback switch interposed between the first feedback capacitor and the output terminal of the operational amplifier and a second feedback switch interposed between the second feedback capacitor and the output terminal of the operational amplifier. An input signal is input to at least one of a portion between the first feedback capacitor and the first feedback switch, and a portion between the second feedback capacitor and the second feedback switch. The D/A converter capacitor has a second terminal on an opposite side to the first terminal of the D/A converter capacitor, and the second terminal of the D/A converter is connected to the output terminal of the operational amplifier. The D/A converter repeatedly subtracts charges from charges accumulated in the first feedback capacitor and the second feedback capacitor based on the quantization result to perform A/D conversion of the input signal, and performs subtraction operation for outputting a residual of the A/D conversion as the output signal of the operational amplifier. The D/A converter transfers the charges accumulated in the first feedback capacitor to the second feedback capacitor after the subtraction operation to perform amplification operation for amplifying the residual of the A/D conversion in the subtraction operation. The D/A converter repeats subtraction and amplification sequentially based on the quantization result for the residual of the A/D conversion in the subtraction operation amplified by the amplification operation, to perform cyclic operation for A/D converting the residual of the A/D conversion in the subtraction operation. The D/A converter performs the A/D conversion of the input signal by adding a result of the A/D conversion in the cyclic operation to a result of the A/D conversion in the subtraction operation.

According to the above configuration, since the residual of the A/D conversion by the subtraction operation is A/D converted by the cyclic A/D conversion through the cyclic operation, it is possible to reduce an increase in the number of cycles in the high resolution as compared with a mode in which only the A/D conversion by the subtraction operation is performed in multiple stages and the A/D conversion is performed.

Further, since the A/D conversion by the cyclic operation is performed after the A/D conversion by the subtraction operation has been performed, the accuracy required for the comparator used in the quantizer for quantizing the output of the operational amplifier can be kept low even in the high-resolution A/D conversion.

In addition, since the D/A converter used for the subtraction operation is realized by a single D/A converter capacitor and the feedback amount is not switched in the process of A/D conversion by the subtraction operation, it is possible to realize the high-precision A/D conversion without being affected by the error of the element value of the element for determining the feedback amount by the D/A converter.

Embodiments of the present disclosure will be described below with reference to the drawings. The same reference numerals are assigned to the same or equivalent parts in the following drawings.

First Embodiment

First, a schematic configuration of an A/D converter according to the present embodiment will be described with reference to FIG. 1.

As shown in FIG. 1, an A/D converter 100 according to the present embodiment includes an integrator 10, a quantizer 20, a D/A converter 30, and a logic circuit (LOGIC) 40.

An analog signal is input to the A/D converter 100 as an input signal (Vin), and a digital signal is output from the A/D converter 100 as an A/D conversion result (Dout).

The integrator 10 includes an operational amplifier 11, a first feedback capacitor Cf1 and a second feedback capacitor Cf2, and a first feedback switch SF11 and a second feedback switch SF21.

The first feedback capacitor Cf1 and the second feedback capacitor Cf2 are connected in parallel with each other between an inverting input terminal and an output terminal of the operational amplifier 11. The first feedback switch SF11 is inserted between the first feedback capacitor Cf1 and the output terminal of the operational amplifier 11. A switching SF13 is inserted between the first feedback capacitor Cf1 and the inverting input terminal of the operational amplifier 11. In other words, the switch SF13, the first feedback capacitor Cf1, and the first feedback switch SF11 are connected in series with each other and are disposed between the inverting input terminal and the output terminal of the operational amplifier 11. The second feedback switch SF21 is inserted between the second feedback capacitor Cf2 and the output terminal of the operational amplifier 11. In other words, the second feedback capacitor Cf2 and the second feedback switch SF21 are connected in series with each other and are disposed between the inverting input terminal and the output terminal of the operational amplifier 11.

A non-inverting input terminal of the operational amplifier 11 is connected to an analog ground (AGND). AGND is a reference potential of the overall A/D converter 100, and is not necessarily 0 V. The inverting input terminal in the present embodiment corresponds to a first input terminal.

The input signal Vin is connected between the first feedback capacitor Cf1 and the first feedback switch SF11 through a sampling switch SS11. The input signal Vin is connected between the second feedback capacitor Cf2 and the second feedback switch SF21 through a sampling switch SS21.

An intermediate point between the first feedback capacitor Cf1 and the first feedback switch SF11 is connected to AGND through a switch SF14, and an intermediate point between the first feedback capacitor Cf1 and the switch SF13 is connected to AGND through a switch SF12.

With the configuration described above, the first feedback switch SF11, the second feedback switch SF21, and the switch SF14 are turned off, and the switches SS11, SS21, SF12, and SF13 are turned on, whereby charges based on the input signal Vin are accumulated in the first feedback capacitor Cf1 and the second feedback capacitor Cf2. In other words, the input signal Vin is sampled by the first feedback capacitor Cf1 and the second feedback capacitor Cf2.

Hereinafter, the potential of the output terminal of the operational amplifier 11 is referred to as an output voltage Vout or simply as Vout.

The quantizer 20 quantizes an output of the integrator 10, that is, an output voltage Vout of the operational amplifier 11, and outputs a quantization result Qout. That is, the quantizer 20 quantizes Vout, which is an analog value, and converts it into a quantization result Qout, which is a digital value. The quantizer 20 is a 1.5-bit quantizer having two comparators 21 and 22.

The output voltage Vout of the operational amplifier 11 is connected to a non-inverting input terminal of the comparator 21. The inverting input terminal of the comparator 21 is connected to Vtd+ through a switch SQD and to Vtc+ through a switch SQC. As a result, the comparator 21 can select a threshold to be compared with the output voltage Vout of the operational amplifier 11 to be Vtd+ or Vtc+. An output Qout<1> of the comparator 21 is connected to logic circuits 40 to be described later.

The output voltage Vout of the operational amplifier 11 is connected to a non-inverting input terminal of the comparator 22. An inverting input terminal of the comparator 22 is connected to Vtd− through a switch SQD and to Vtc− through a switch SQC. As a result, the comparator 22 can select a threshold to be compared with the output voltage Vout of the operational amplifier 11 to be Vtd− or Vtc−. An output Qout<0> of the comparator 22 is connected to the logic circuit 40 to be described later.

Hereinafter, the output Qout<1> of the comparator 21 and the output Qout<0> of the comparator 22 may be collectively referred to as a quantization result Qout or simply as Qout.

The switches SQD and SQC for switching the thresholds of the comparators 21 and 22 are provided in the comparators 21 and 22, respectively, but the operations of the switches SQD and SQC are synchronized in the comparators 21 and 22, respectively, and the same designation is used for convenience. The comparator 21 and the comparator 22 compare Vout with Vtc+ and Vtc−, respectively, when the switch SQC is on, and compare Vout with Vtd+ and Vtd−, respectively, when the switch SQD is on.

The logic circuit 40 controls the D/A converter 30 based on the quantization result Qout output from the quantizer 20. Each time quantization is performed by the quantizer 20 in a process of A/D conversion by the A/D converter 100, the logic circuit 40 sequentially integrates or weights and adds the quantization result Qout to generate the A/D conversion result Dout.

The D/A converter 30 is controlled by the logic circuit 40 based on the quantization result Qout to subtract the charges corresponding to the quantization result Qout from the charges accumulated in the first feedback capacitor Cf1 and the second feedback capacitor Cf2. The D/A converter 30 is a three-level D/A converter having Vm set to, for example, AGND, Vrefp set to a potential higher than AGND, and Vrefm set to a potential lower than AGND as a reference voltage. When AGND is 0 V, Vrefp and Vrefm have the same absolute values and opposite signs with respect to AGND, and are set so as to satisfy Vrefp=−Vrefm.

The D/A converter 30 has a D/A converter capacitor Cd. One end of the D/A converter capacitor Cd is connected with a voltage source for generating the reference voltage through switches SDT, SDM, and SDB. Specifically, Vrefp is connected to one end of the D/A converter capacitor Cd through the switch SDT, Vm is connected to the D/A converter capacitor Cd through the switch SDM, and Vrefm is connected to the D/A converter capacitor Cd through the switch SDB. One end of the D/A converter capacitor Cd at the reference voltage side can be connected to any one of Vrefp, Vrefm, and Vm by exclusively turning on the switches SDT, SDM, and SDB. Hereinafter, a potential of one end on the reference voltage side of the D/A converter capacitor Cd determined by turning on any of the switches SDT, SDM, and SDB is sometimes referred to as a D/A converter voltage.

In addition, one end of the D/A converter capacitor Cd on the reference voltage side is connected to the output terminal of the operational amplifier 11 through the switch SD1. The other end of the D/A converter capacitor Cd adjacent to the inverting input terminal of the operational amplifier 11 is connected to AGND through the switch SD2. The other end of the D/A converter capacitor Cd is also connected to the inverting input terminal of the operational amplifier 11 through the switch SD3. The other end of the D/A converter capacitor Cd connected to the inverting input terminal of the operational amplifier 11 corresponds to a first terminal of the D/A converter capacitor Cd. The end of the D/A converter Cd on the reference voltage side corresponds to a second terminal of the D/A converter capacitor.

Next, a specific operation of the A/D converter 100 according to the present embodiment will be described with reference to the timing chart shown in FIG. 2 and the connection diagrams shown in FIGS. 3 to 8.

Figure 2:
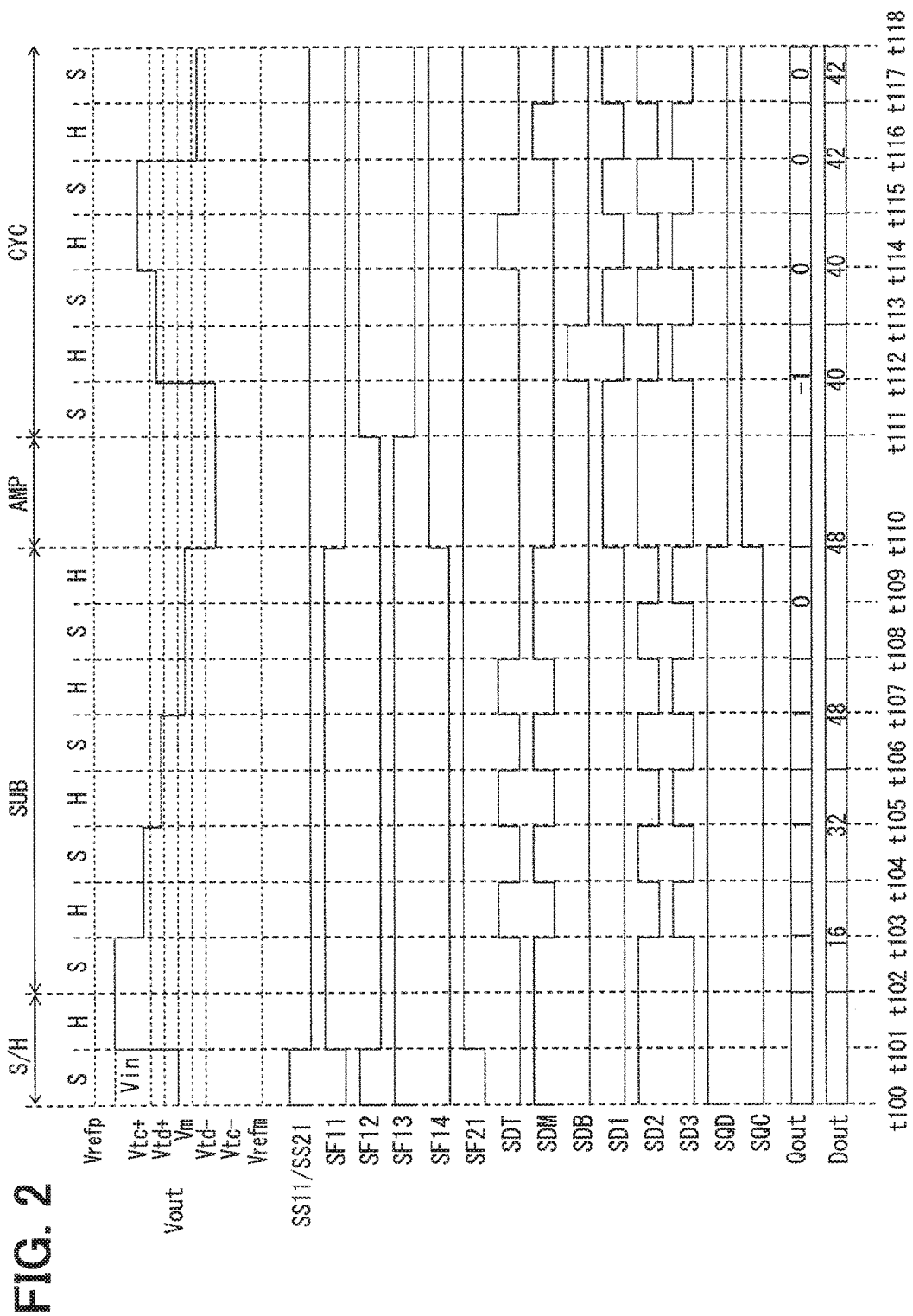
FIG. 2 is a timing chart showing an operation of the A/D converter.

As shown in FIG. 2, the A/D converter 100 relates to the A/D conversion of the input signal Vin, and performs a sample and hold operation (S/H in FIG. 2), a subtraction operation (SUB in FIG. 2), an amplification operation (AMP in FIG. 2), and a cyclic operation (CYC in FIG. 2). In the present embodiment, AGND=0 V and Vrefp=−Vrefm=Vref are assumed. In addition, it is assumed that Vtd+=Vref/8, Vtd−=−Vref/8, Vtc+=Vref/4, and Vtc−=−Vref/4.

Hereinafter, each operation will be described.

<Sample and Hold Operation (S/H): Sampling Period (S)>

Figure 3:
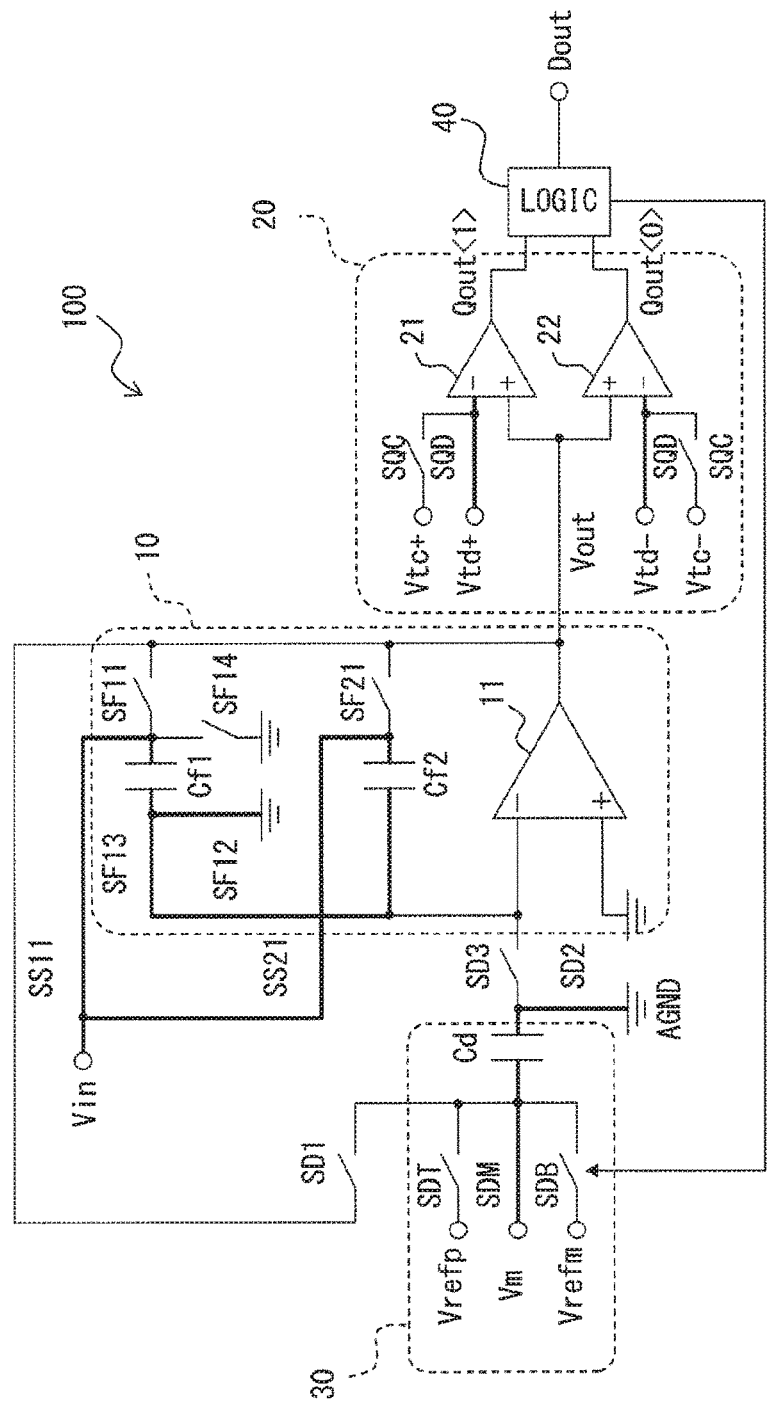
FIG. 3 is a connection diagram showing an operation of a sampling period related to sample and hold operation.

A period from time t100 to time t101 shown in FIG. 2 is a sampling period related to the sample and hold operation for sampling the input signal Vin using the first feedback capacitor Cf1 and the second feedback capacitor Cf2. As shown in FIG. 3, in the sampling period related to the sample and hold operation, the switches SS11 and SS21 are turned on and the switches SF12 and SF13 are turned on. As a result, one ends of the first feedback capacitor Cf1 and the second feedback capacitor Cf2 on the inverting input terminal sides of the operational amplifier 11 are connected to AGND, and the other ends are connected to the input signal Vin. In other words, the charges corresponding to the input signal Vin are accumulated in the first feedback capacitor Cf1 and the second feedback capacitor Cf2. At that time, the first feedback switch SF11 and the second feedback switch SF21 are turned off, and the first feedback capacitor Cf1 and the second feedback capacitor Cf2 are disconnected from the output terminal of the operational amplifier 11. It should be noted that, at time t100 to time t101, the operational amplifier 11 is not fed back by the first feedback capacitor Cf1 and the second feedback capacitor Cf2, but in the case shown in FIG. 2, the output voltage of the operational amplifier 11 is described as Vout=0 on the assumption that the operational amplifier 11 is ideal and does not have offsets for the sake of simplification of the description.

When the switches SDM and SD2 are turned on, both ends of the D/A converter capacitor Cd are connected to AGND. As a result, the D/A converter capacitor Cd is in a state in which no electric charges are accumulated, that is, in a reset state. The switches SD1 and SD3 are turned off, and the D/A converter 30 and the integrator 10 are electrically disconnected from each other.

In the sample and hold operation and the subtraction operation at time t100 to time t110, the switch SQD is turned on and the switch SQC is turned off in the quantizer 20. As a result, Vtd+ and Vtd− are selected as the thresholds of the comparators 21 and 22, respectively.

<Sample and Hold Operation (S/H): Holding Period (H)>

Figure 4:
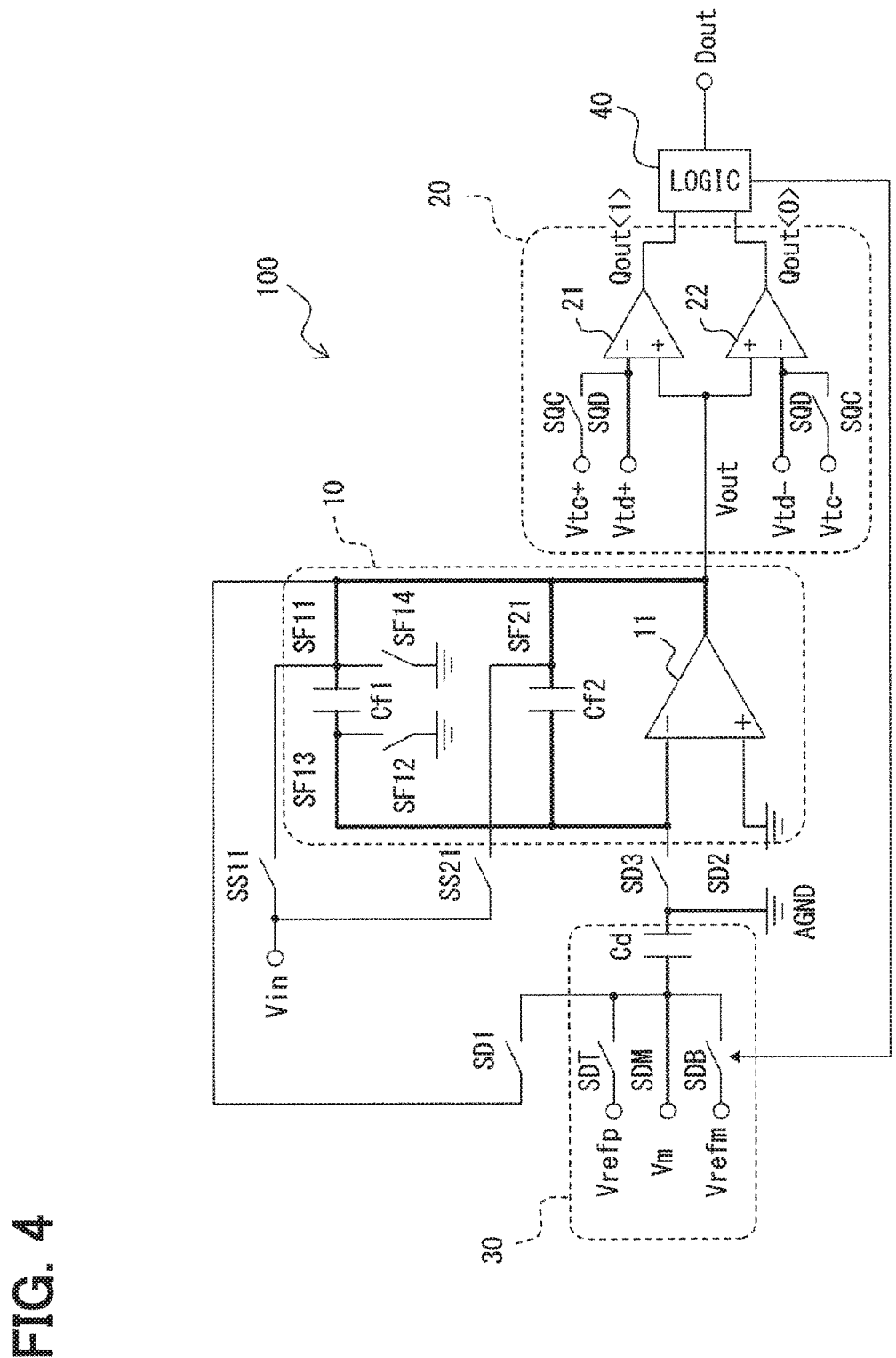
FIG. 4 is a connection diagram showing an operation of a holding period related to the sample and hold operation and a sampling period related to a subtraction operation.

A period from time t101 to time t102 shown in FIG. 2 is a holding period related to the sample and hold operation for holding the input signal Vin sampled by the first feedback capacitor Cf1 and the second feedback capacitor Cf2 in the integrator 10 in the sampling period. As shown in FIG. 4, when the switches SS11, SS21, and SF12 are turned off, the first feedback capacitor Cf1 and the second feedback capacitor Cf2 are disconnected from the input signals Vin and AGND. When the first feedback switch SF11 and the second feedback switch SF21 are turned on, the first feedback capacitor Cf1 and the second feedback capacitor Cf2, which accumulate charges corresponding to the input signal Vin in the sampling period, are connected to the output terminal of the operational amplifier 11. As a result, the output voltage Vout corresponding to the input signal Vin is output from the output terminal of the operational amplifier 11, and this state is held.

<Subtraction Operation (SUB): Sampling Period (S)>

A period from time t102 to time t103 shown in FIG. 2 is a first sampling period related to the subtraction operation. As shown in FIG. 4, since the switch SD3 is turned off during the sampling period related to the subtraction operation, the D/A converter 30 and the inverting input terminal of the operational amplifier 11 are electrically disconnected from each other. The switches SDM and SD2 are on, the switches SD1, SDT, and SDB are off, and both ends of the D/A converter capacitor Cd are connected to AGND. As a result, the potentials at both ends of the D/A converter capacitor Cd become equal to each other, and the charges accumulated in the D/A converter capacitor Cd are reset. Since the operational amplifier 11 continues to be fed back by the first feedback capacitor Cf1 and the second feedback capacitor Cf2 from a period immediately before the sampling period, the value of the output voltage Vout is maintained as the value in the last period. In the first sampling period related to the subtraction operation at time t102 to time t103, the connection state of each switch does not change at time t102 because the connection state of each switch is the same as that in the holding period related to the sample and hold operation at time t101 to time t102.

In the subtraction operation, the output voltages Vout of the operational amplifier 11 and the output voltages Vtd+ and Vtd− selected as the thresholds are compared with each other in the comparators 21 and 22 of the quantizer 20. The comparators 21 and 22 output Qout<1> and Qout<0> respectively as a result of the above comparisons.

In FIG. 2, for convenience of description, Qout<1> and Qout<0> are collectively referred to as Qout. In the present embodiment, Qout is 1 when Vout>Vtd+ (or Vout>Vtc+), Qout is 0 when Vtd−≤Vout≤Vtd+ (or Vtc−≤Vout≤Vtc+), and Qout is −1 when Vout<Vtd− (or Vout<Vtc−). Qout<1> and Qout<0> are 1-bit digital signals, but those signals may be encoded as Qout in the quantizer 20 as described above and then input to the logic circuit 40, or Qout<1> and Qout<0> may be input as 1-bit digital signals to the logic circuit 40.

Since Vout>Vtd+ is satisfied at time t102 to time t103 shown in FIG. 2, Qout=1 is met. Since the A/D conversion result obtained by the subtraction operation corresponds to the high-order bits of the A/D conversion result Dout of the overall A/D converter 100, in the example shown in FIG. 2, the result obtained by weighting Qout by 16 times corresponding to the bit shifting to the high order by 4 bits is sequentially integrated into the A/D conversion result Dout. For that reason, at time t102 to time t104, the A/D conversion result Dout=16 obtained by multiplying the first quantization result, i.e., Qout=1, by 16 is output. It should be noted that the magnitude of the weighting for the A/D conversion result obtained by the subtraction operation may be determined in the same manner as a general multistage A/D converter, and therefore a detailed description of the magnitude will be omitted.

<Subtraction Operation (SUB): Holding Period (H)>

Figure 5:
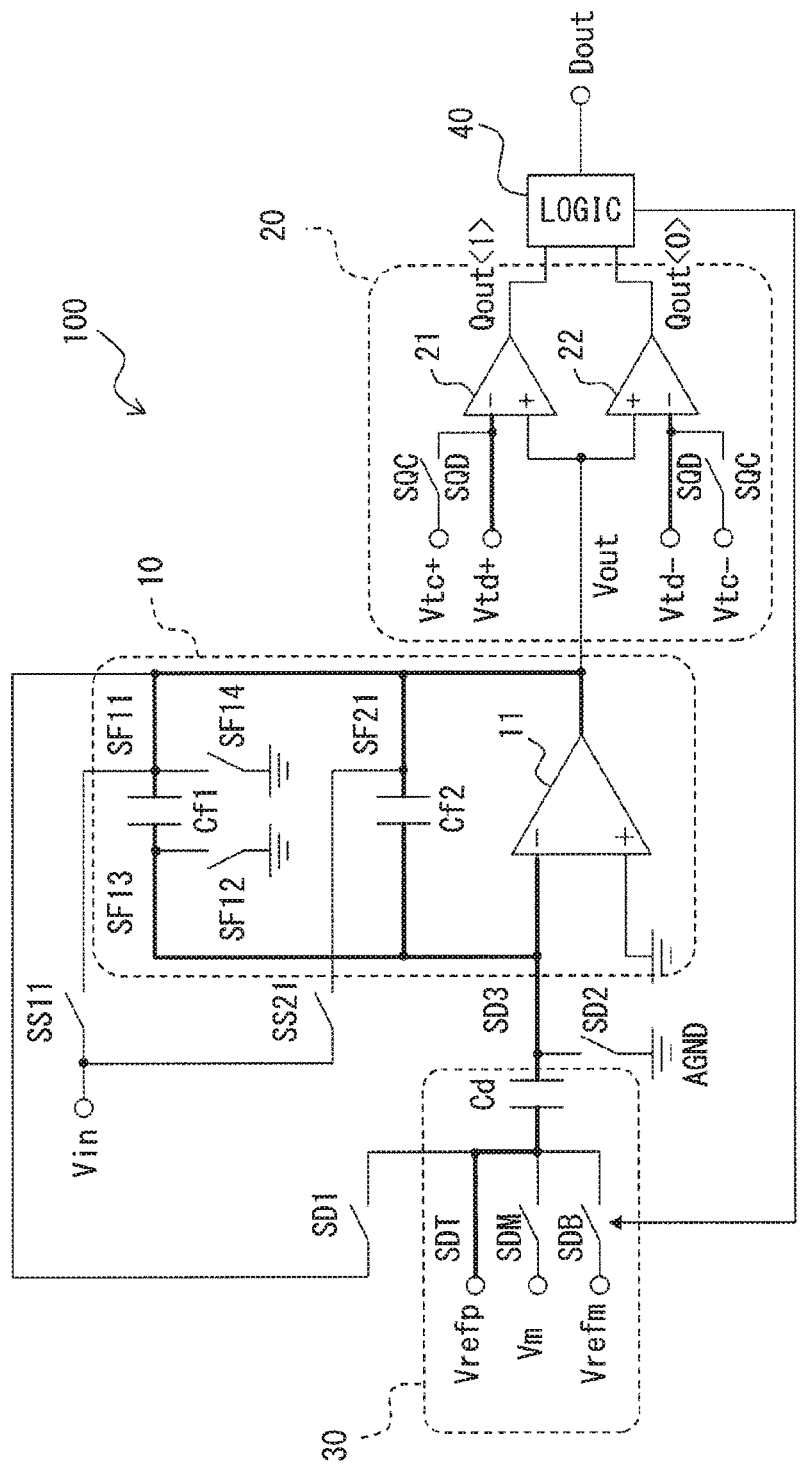
FIG. 5 is a connection diagram showing an operation of a holding period related to the subtraction operation.

A period from time t103 to time t104 shown in FIG. 2 is a first holding period related to the subtraction operation. In the holding period related to the subtraction operation, subtraction is performed based on the quantization result Qout using the D/A converter 30. At time t103 to time t104 shown in FIG. 2, since the quantization result Qout in the sampling period related to the immediately preceding subtraction operation is 1, the switch SDM is turned off and the switch SDT is turned on in the D/A converter 30 as shown in FIG. 5. Further, when the switch SD2 is turned off and the switch SD3 is turned on, the D/A converter 30 is electrically connected to the integrator 10. In the D/A converter 30, when the switch SDT is turned on, Vrefp is selected as the D/A converter voltage, and the charges corresponding to the D/A converter voltage are transferred from the D/A converter capacitor Cd to the first feedback capacitor Cf1 and the second feedback capacitor Cf2. In other words, the charges based on the quantization result Qout are subtracted from the charges accumulated in the first feedback capacitor Cf1 and the second feedback capacitor Cf2 using the D/A converter 30. As a result of the above subtraction, Vout decreases at time t103.

If the sampling period and the holding period relating to the above subtraction operation are collectively regarded as one cycle of the subtraction operation for each period, the A/D conversion by the subtraction operation is performed by repeating the above cycle for a predetermined number of cycles. In the present embodiment, the period from time t102 to time t104 is a first one cycle of the subtraction operation, and the cycle of the subtraction operation is repeated for four cycles between time t102 and time t110. In the quantization from time t104 to time t105, Qout is 1 to satisfy Vout>Vtd+, and Qout is weighted 16 times and added to the A/D conversion result Dout=16 immediately before time t104, so that A/D conversion result Dout=32 is met. Similarly, in the quantization from time t106 to time t107, since Vout>Vtd+ is satisfied, the quantization result is Qout=1 and Dout=48 is met. In the quantization from time t108 to time t109, since Vtd−≤Vout≤Vtd+ is satisfied, the quantization result becomes Qout=0. Since the quantization result at time t108 to time t109 is Qout=0, the A/D conversion result does not change at Dout=48. Since Qout is 0 in the holding period related to the subtraction operation at time t109 to time t110, the switch SDM is kept on. Since the D/A converter voltage Vm does not change before and after time t109, the D/A converter voltage Vm is not substantially subtracted, and Vout does not change at time t109.

<Amplification Operation (AMP)>

Figure 6:
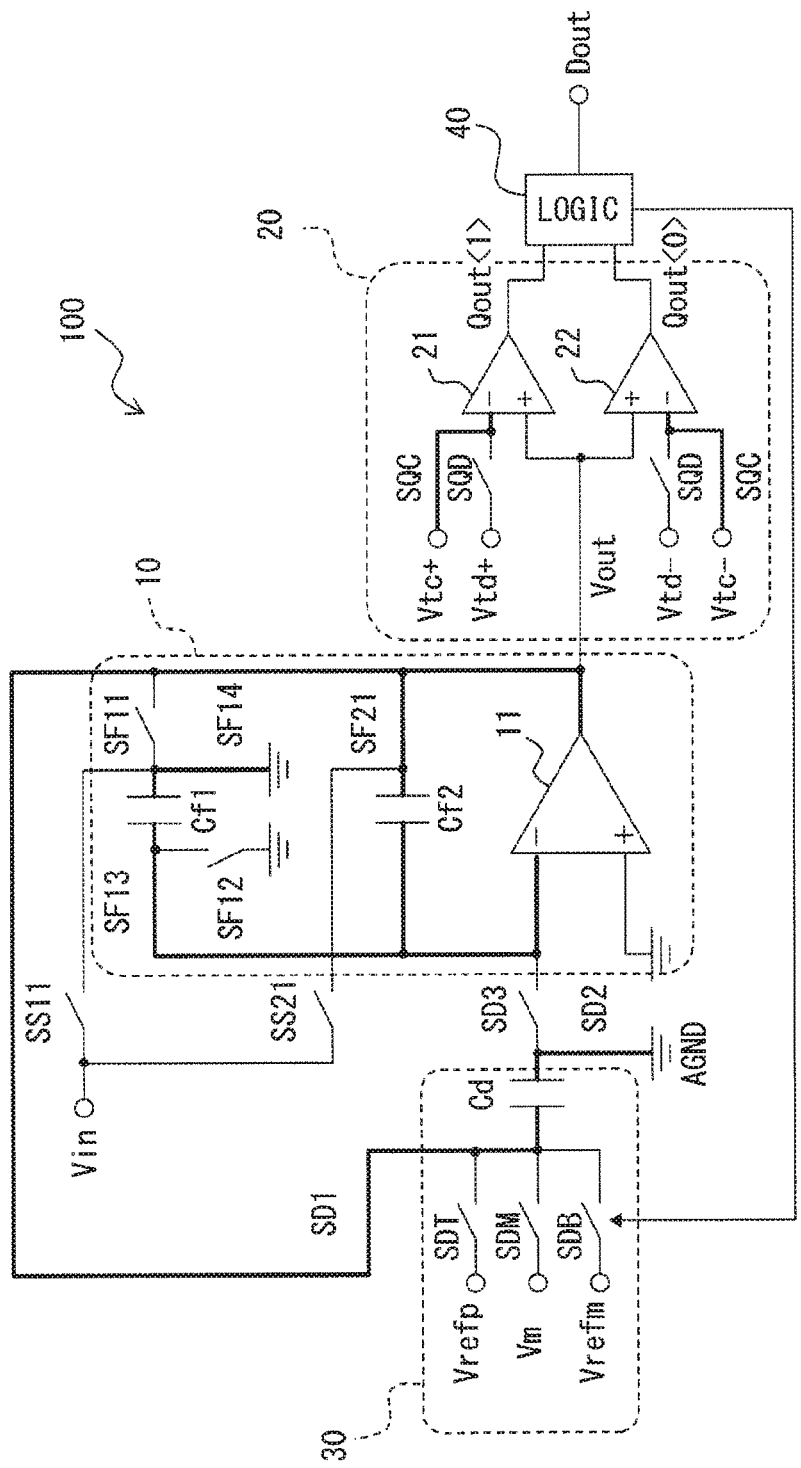
FIG. 6 is a connection diagram showing an amplification operation.

Upon the completion of the subtraction operation, the amplification operation is executed at time t110 to time t111 shown in FIG. 2. As shown in FIG. 6, when the switch SD3 is turned off, the D/A converter 30 and the inverting input terminal of the operational amplifier 11 are disconnected from each other. In the D/A converter 30, all of the switches SDT, SDM, and SDB are turned off, so that the reference voltage and the D/A converter capacitor Cd are disconnected from each other. On the other hand, when the first feedback switch SF11 is turned off and the switch SF14 is turned on, the charges accumulated in the first feedback capacitor Cf1 are transferred to the second feedback capacitor Cf2. Accordingly, the output voltage Vout of the operational amplifier 11 is amplified, that is, the residual amplification of the A/D conversion by the subtraction operation is performed. For example, if the pre-amplification output voltage Vout is negative, the post-amplification output voltage Vout increases negatively by an amplification factor corresponding to a ratio of the first feedback capacitor Cf1 and the second feedback capacitor Cf2. Further, since the switches SD1 and SD2 are turned on, the charges corresponding to the residual of the A/D conversion by the subtraction operation are accumulated in the D/A converter capacitor Cd.

In the present embodiment, when the switch SQD is turned off and the switch SQC is turned on in the amplification operation, the thresholds of the comparators 21 and 22 in the quantizer 20 are changed from Vtd+ and Vtd− to Vtc+ and Vtc−, respectively. During the cyclic operation after time t111, which will be described later, the switch SQC is maintained in an ON state, so that Vtc+ and Vtc− are maintained in the selected state as the thresholds of the comparators 21 and 22, respectively.

<Cyclic Operation (CYC): Sampling Period (S)>

Figure 7:
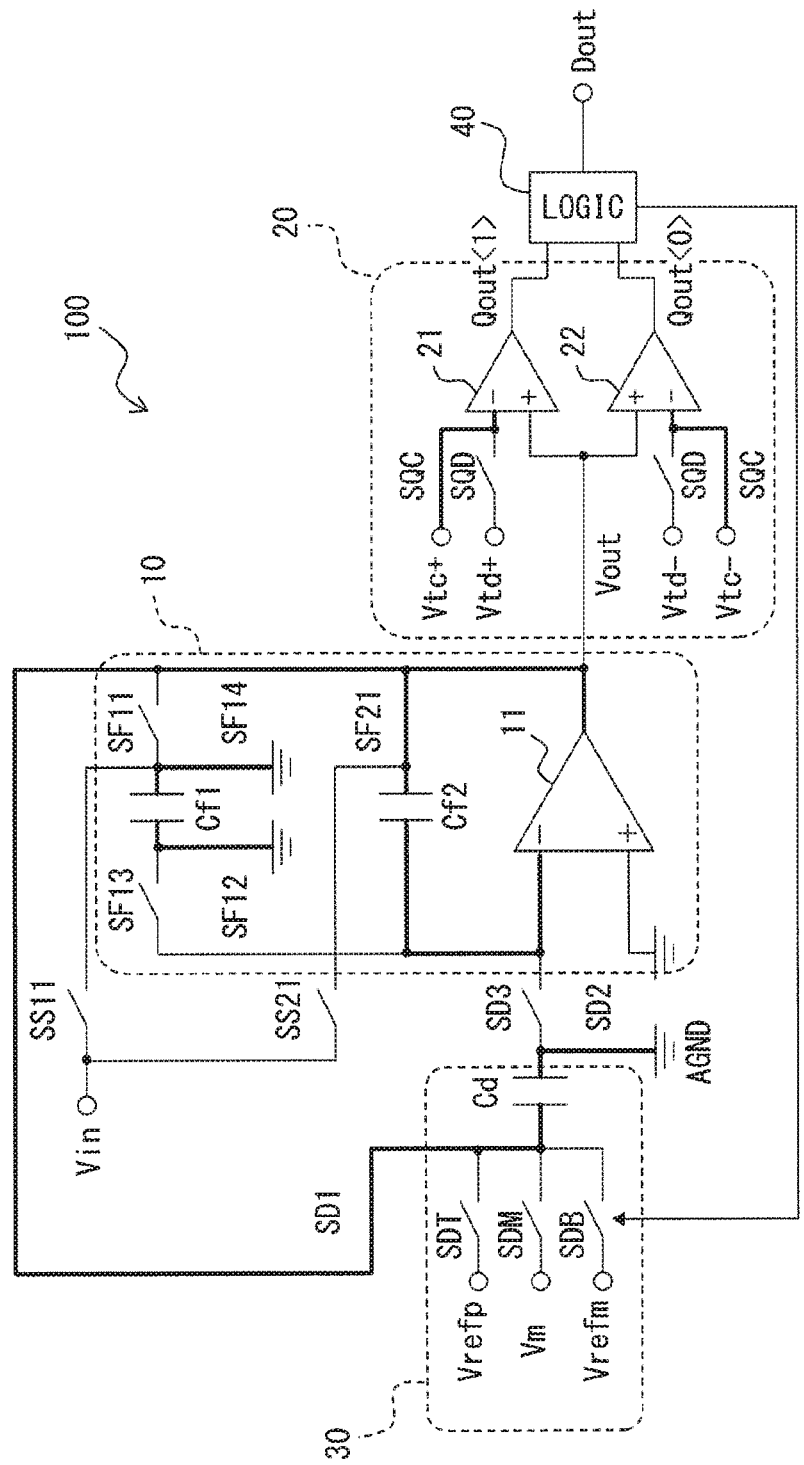
FIG. 7 is a connection diagram showing an operation of a sampling period related to a cyclic operation.

A period from time t111 to time t112 shown in FIG. 2 after the completion of the amplification operation is a first sampling period related to the cyclic operation. In the first sampling period related to the cyclic operation, as shown in FIG. 7, the first feedback capacitor Cf1 is disconnected from the operational amplifier 11 by turning on the switch SF12 and turning off the switch SF13, and both ends of the first feedback capacitor Cf1 are connected to AGND. As a result, the first feedback capacitor Cf1 is reset. The operational amplifier 11 is continuously fed back by the second feedback capacitor Cf2 from the amplification operation, and the charges corresponding to the residual of the A/D conversion by the subtraction operation are continuously held in the second feedback capacitor Cf2. The output terminal of the operational amplifier 11 is continuously connected to the D/A converter capacitor Cd through the switch SD1 from the amplification operation, and the charges corresponding to the residual of the A/D conversion by the subtraction operation are accumulated in the D/A converter capacitor Cd.

At time t111 to time t112, since a relation between the output voltages Vout of the operational amplifier 11 and the thresholds of the comparators 21 and 22 is Vout<Vtc−, Qout=−1 is output from the quantizer 20.

In the second and subsequent sampling periods related to the cyclic operation after time t113, the switch SF12 is kept on and the switch SF13 is kept off. Similarly to the first sampling period related to the cyclic operation, when the switch SD3 is turned off, the D/A converter 30 is disconnected from the inverting input terminal of the operational amplifier 11. When all of the switches SDT, SDM, and SDB are turned off and the switches SD1 and SD2 are turned on, the charges corresponding to the residual of the A/D conversion by the cyclic operation are accumulated in the D/A converter capacitor Cd.

<Cyclic Operation (CYC): Holding Period (H)>

Figure 8:
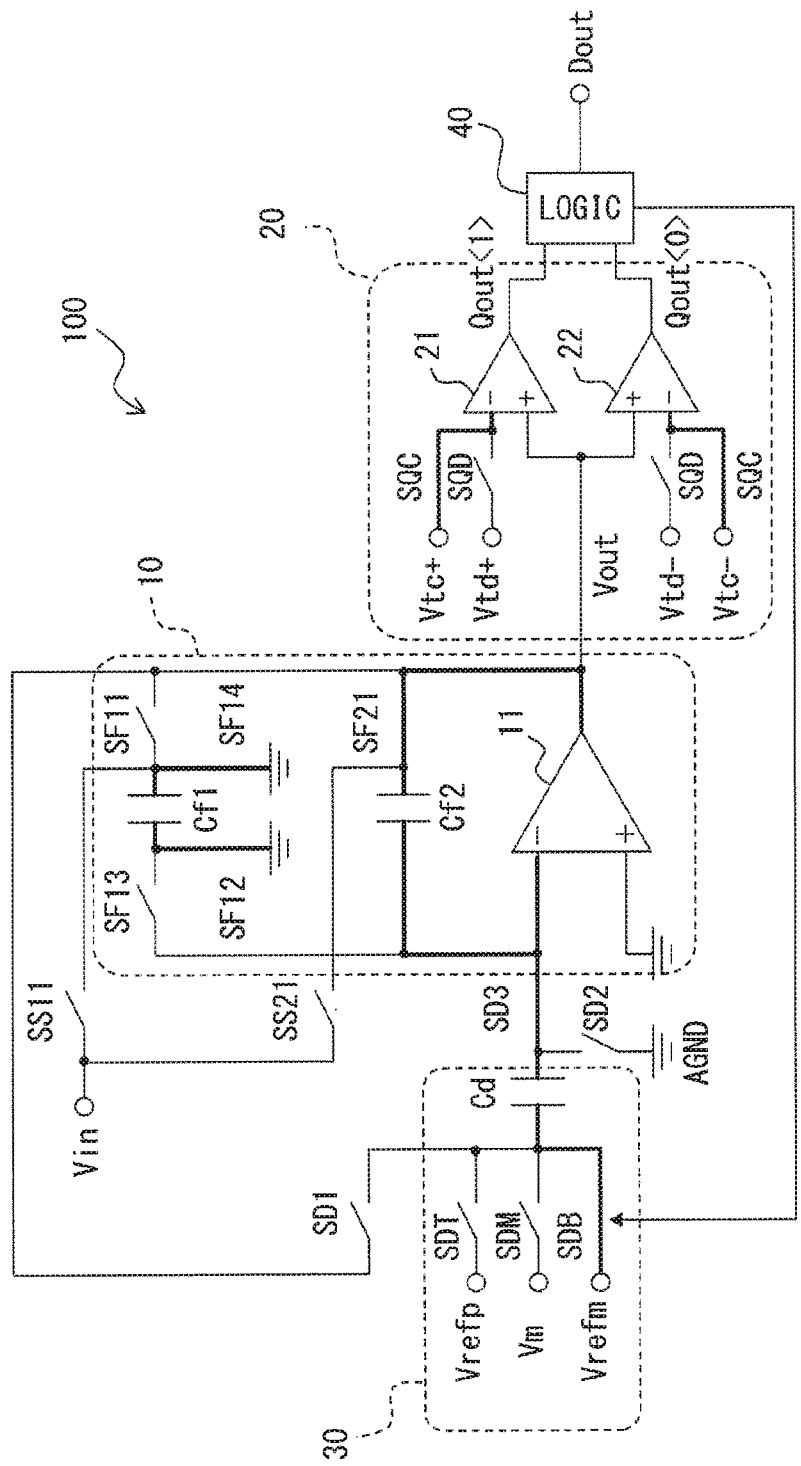
FIG. 8 is a connection diagram showing an operation of a holding period related to the cyclic operation.

A period from t112 to time t113 shown in FIG. 2 is a first holding period related to the cyclic operation. In a first holding period related to the cyclic operation, the residual of the A/D conversion by the subtraction operation is amplified and the subtraction using the D/A converter 30 is performed. Since the quantization result Qout at time t111 to time t112 is −1, the switch SDB is turned on in the D/A converter 30 as shown in FIG. 8. Further, when the switches SD1 and SD2 are turned off and the switch SD3 is turned on, the D/A converter 30 is connected to the inverting input terminal of the operational amplifier 11. In the first sampling period related to the cyclic operation at time t111 to time t112, the charges corresponding to the residual of the A/D conversion by the subtraction operation are accumulated in the D/A converter capacitor Cd, and in the first holding period related to the cyclic operation at time t112 to time t113, the charges corresponding to a difference between Vrefm selected as the D/A converter voltage by turning on the switch SDB and the residual of the A/D conversion are transferred from the D/A converter capacitor Cd to the second feedback capacitor Cf2.

That is, in the first holding period related to the cyclic operation, the amplification of the residual of the A/D conversion by the subtraction operation and the subtraction using the D/A converter 30 are performed simultaneously.

In the second and subsequent sampling periods related to the cyclic operation after time t113, charges corresponding to the residual of the A/D conversion by the cyclic operation are accumulated in the D/A converter capacitor Cd. For that reason, in the second and subsequent holding periods related to the cyclic operation after time t114, the charges corresponding to a difference between the D/A converter voltage and the residual of the A/D conversion by the cyclic operation are transferred from the D/A converter capacitor Cd to the second feedback capacitor Cf2, whereby the amplification of the residual of the A/D conversion by the cyclic operation and the subtraction using the D/A converter 30 are performed simultaneously.

If the sampling period and the holding period relating to the above-mentioned cyclic operation are collectively regarded as one cycle of the cyclic operation for each period, so-called cyclic A/D conversion is performed by repeating the above cycle by a predetermined number of cycles. In the present embodiment, the period from time t111 to time t113 is a first cycle of the cyclic operation, and the cycle of the cyclic operation is repeated for four cycles between time t111 and time t118. In the example of FIG. 2, since a next cycle does not exist in the last one cycle of the cyclic operation, amplification and subtraction are unnecessary, and thus the holding period is omitted.

In the A/D conversion by the cyclic operation, the A/D conversion for the residual of the A/D conversion by the subtraction operation is performed. That is, the A/D conversion result corresponding to lower bits of the A/D conversion result Dout of the overall A/D converter 100 is obtained. Further, in the A/D conversion by the cyclic operation, the A/D conversion is sequentially performed every cycle from an upper bit side of the A/D conversion result corresponding to the lower bit of the A/D conversion result Dout, and the A/D conversion result corresponding to a least significant bit is obtained in the last cycle. That is, the quantization result Qout in each cycle of the cyclic operation is weighted according to the bit position of the A/D conversion result Dout corresponding to the cycle, and then added to Dout, whereby the A/D conversion result Dout is obtained.

For example, at time t111 to time t112, Qout=−1 is met to satisfy Vout<Vtc−, and Dout becomes 40 by weighting eight times and adding the weighted value to Dout immediately before time t111. Similarly, at time t113 to time t114, Qout is 0 to satisfy Vtc−<Vout<Vtc+, and Dout is 40 by weighting four times. At time t115 to time t116, Qout is 1 to satisfy Vout>Vtc+, and the weight is doubled to meet Dout=42. At time t117 to time t118, Qout becomes 0 to satisfy Vtc−≤Vout≤Vtc+, and Dout becomes 42 by weighting by a factor of 1. Dout=42 obtained after repeating the cyclic operation for four cycles is the final A/D conversion result of the overall A/D converter 100.

The magnitude of the weighting in the A/D conversion by the cyclic operation is the same as that of a general cyclic A/D converter, and a detailed description of the magnitude will be omitted.

The above is the specific operation of the A/D converter 100 according to the present embodiment. According to the above configuration, since the A/D conversion of the input signal Vin is performed by a combination of the A/D conversion by the subtraction operation and the A/D conversion by the cyclic operation, the number of cycles required for one A/D conversion can be reduced as compared with a mode in which the A/D conversion by the subtraction operation or the A/D conversion of the incremental delta type is repeatedly performed to realize the A/D conversion. In addition, since the quantization by the quantizer 20 is performed while the residual of the A/D conversion is amplified, a requirement for the accuracy of the comparator configuring the quantizer can be relaxed.

Second Embodiment

In the first embodiment, the configuration in which the amplification operation is performed only once between the subtraction operation and the cyclic operation is illustrated, but the amplification operation may be performed in multiple times between the subtraction operation and the cyclic operation. In the present embodiment, an example of executing the amplification operation in two steps will be described.

First, a difference in configuration between an A/D converter 110 according to the present embodiment and the A/D converter 100 according to the first embodiment will be described with reference to FIG. 9.

Figure 9:
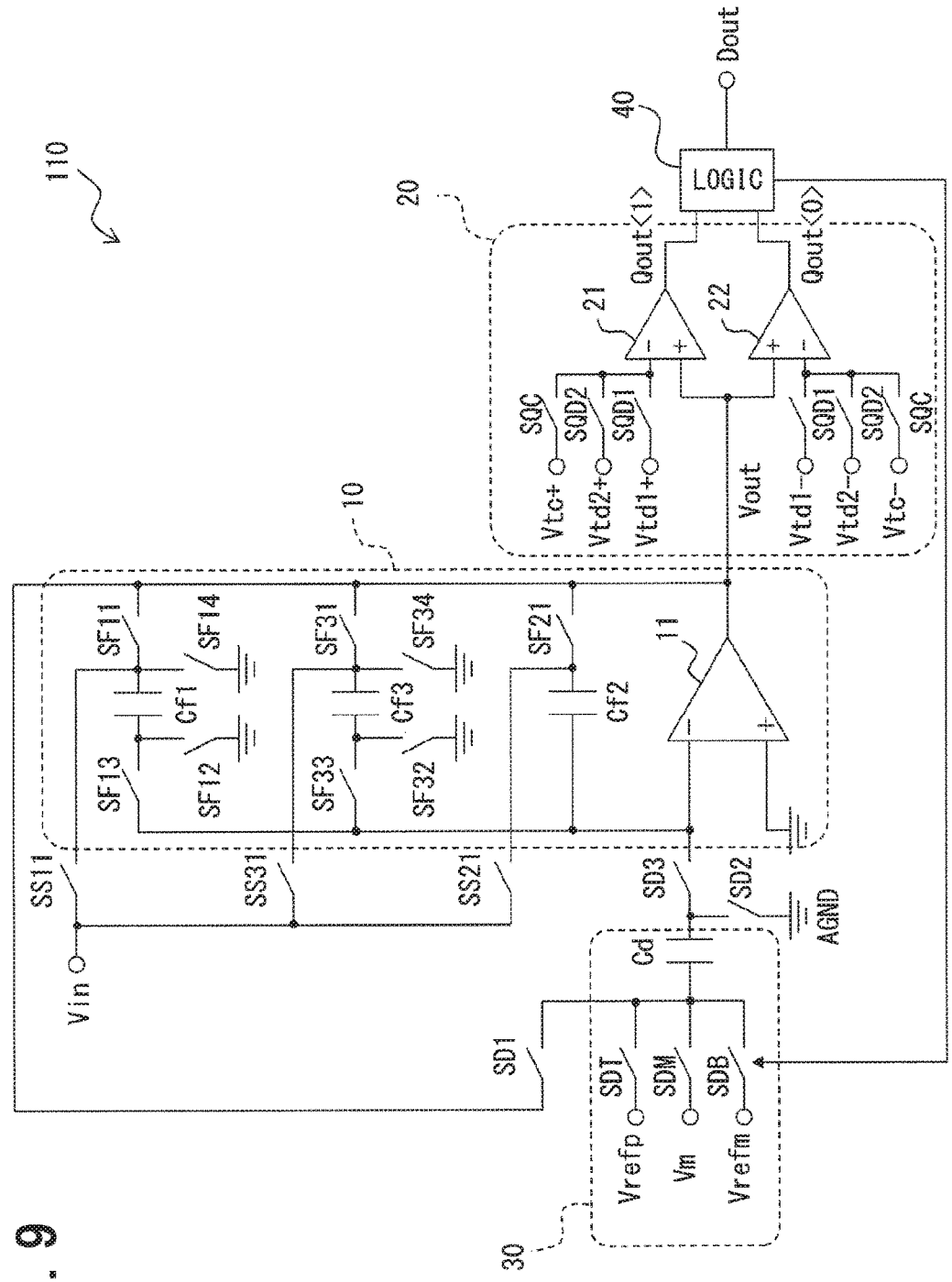
FIG. 9 is a circuit diagram showing a schematic configuration of an A/D converter according to a second embodiment.

As shown in FIG. 9, the A/D converter 110 according to the present embodiment differs from the A/D converter 100 described in the first embodiment in the configuration of the integrator 10, and thresholds of comparators 21 and 22 of a quantizer 20 can be selected in three stages.

An integrator 10 in the A/D converter 110 has a third feedback capacitor Cf3 in addition to a first feedback capacitor Cf1 and a second feedback capacitor Cf2. The third feedback capacitor Cf3 is connected between an output terminal and an inverting input terminal of an operational amplifier 11 in parallel with the first feedback capacitor Cf1 and the second feedback capacitor Cf2.

A third feedback switch SF31 is inserted between the third feedback capacitor Cf3 and the output terminal of the operational amplifier 11. A switching SF33 is inserted between the third feedback capacitor Cf3 and the inverting input terminal of the operational amplifier 11. In other words, the switch SF33, the third feedback capacitor Cf3, and the switch SF31 are connected in series with each other and are disposed between the inverting input terminal and the output terminal of the operational amplifier 11. An intermediate point between the third feedback capacitor Cf3 and the switch SF31 is connected to AGND through a switch SF34, and an intermediate point between the third feedback capacitor Cf3 and the switch SF33 is connected to AGND through a switch SF32.

The input signal Vin is connected to an intermediate point between the third feedback capacitor Cf3 and the third feedback switch SF31 through a switch SS31. That is, when the input signal Vin is sampled, charges corresponding to the input signal Vin are also accumulated in the third feedback capacitor Cf3 by turning off the switch SF31 and turning on the switch SS31.

In the A/D converter 110, the first feedback capacitor Cf1 and the second feedback capacitor Cf2 are connected to the operational amplifier 11 similarly to the first feedback capacitor Cf1 and the second feedback capacitor Cf2 of the first embodiment, and a detailed description of the first feedback capacitor Cf1 and the second feedback capacitor Cf2 will be omitted.

The comparator 21 in the A/D converter 110 is connected to Vtd1+ through a switch SQD1, to Vtd2+ through a switch SQD2, and to Vtc+ through a switch SQC. Similarly, the comparator 22 is connected to Vtd1− through a switch SQD1, to Vtd2− through a switch SQD2, and to Vtc− through a switch SQC.

Next, a specific operation of the A/D converter 110 will be described with reference to a timing chart shown in FIG. 10 and the connection diagrams shown in FIGS. 11 to 14.

Figure 10:
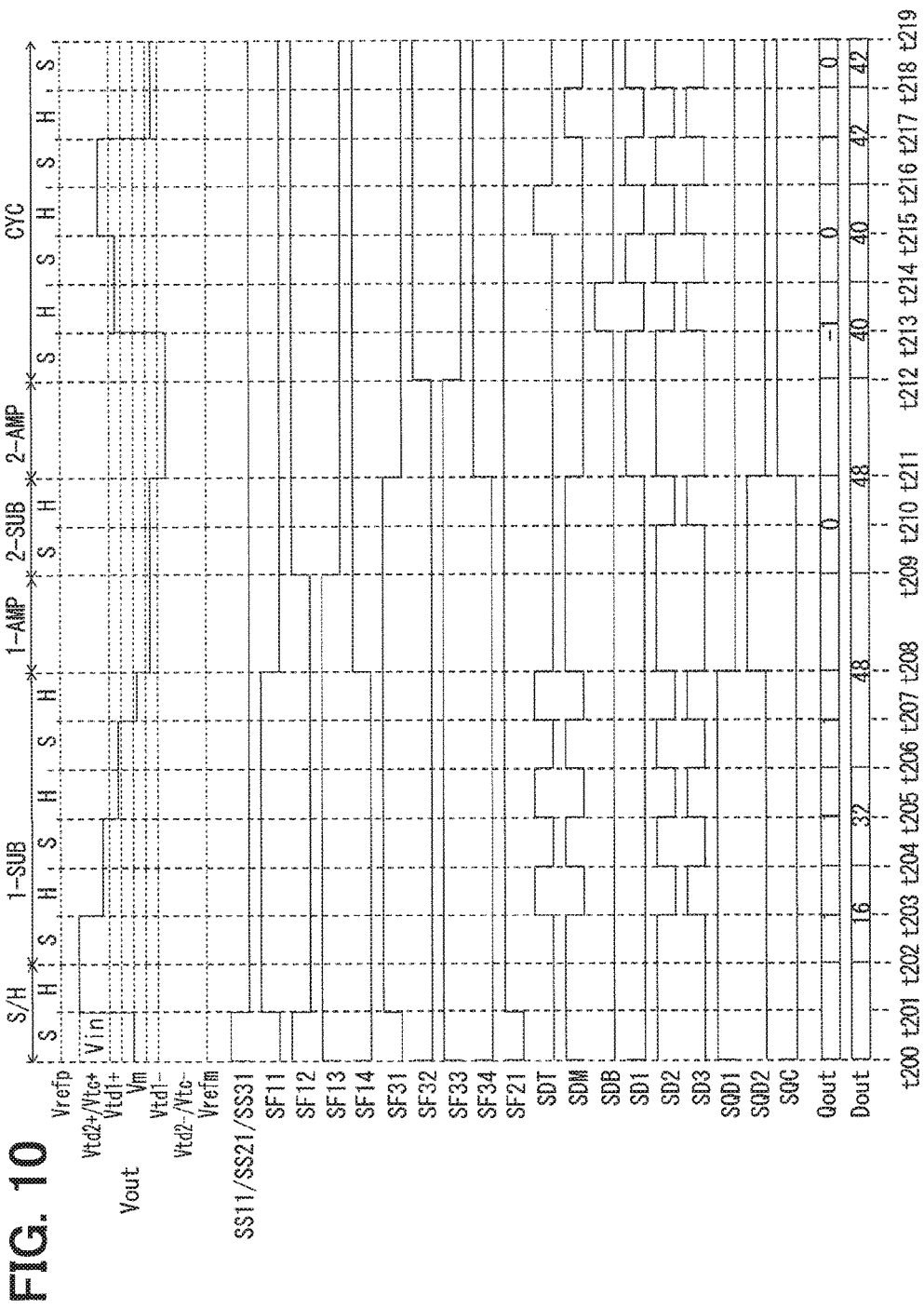
FIG. 10 is a timing chart showing an operation of the A/D converter.

As shown in FIG. 10, the A/D converter 110 performs a sample and hold operation (denoted as S/H in FIG. 10), a first subtraction operation (denoted as 1-SUB in FIG. 10), a first amplification operation (denoted as 1-AMP in FIG. 10), a second subtraction operation (denoted as 2-SUB in FIG. 10), a second amplification operation (denoted as 2-AMP in FIG. 10), and a cyclic operation (denoted as CYC in FIG. 10) in relation to A/D conversion of the input signal Vin. In the example of FIG. 10, Vtd1+=Vref/8, Vtd1−=−Vref/8, Vtd2+=Vtc+=Vref/4, and Vtd2−=Vtc−=−Vref/4.

Hereinafter, each operation will be described.

<Sample and Hold Operation (S/H): Sampling Period (S)>

A period from time t200 to time t201 shown in FIG. 10 is a sampling period related to the sample and hold operation. When the switches SS11, SS21, SS31, SF12, SF13 and SF23 are turned on while the feedback switches SF11, SF21, and SF31 are turned off, charges corresponding to the input signal Vin are sampled in the first feedback capacitor Cf1, the second feedback capacitor Cf2, and the third feedback capacitor Cf3. Similarly to the first embodiment, the D/A converter capacitor Cd in the D/A converter 30 is reset.

<Sample and Hold Operation (S/H): Holding Period (H)>

A period from time t201 to time t202 shown in FIG. 10 is a holding period related to the sample and hold operation. As in the holding period of the first embodiment, the first feedback capacitor Cf1, the second feedback capacitor Cf2, and the third feedback capacitor Cf3 are disconnected from the input signal Vin and AGND by turning off the switches SS11, SS21, SS31 and the switch SF12. Further, the feedback switches SF11, SF21, and SF31 are turned on, and the output voltage Vout corresponding to the input signal Vin is output from the output terminal of the operational amplifier 11, and this state is held.

<First Subtract Operation (1-SUB)>

A first subtraction operation at time t202 to time t208 shown in FIG. 10 is realized by the operation in the sampling period and the holding period similar to the subtraction operation in the first embodiment. In the first subtraction operation, Vtd1+ and Vtd1− are respectively selected as thresholds of the comparator 21 and the comparator 22 by turning on the switch SQD1. The result of quantization at time t202 to time t203 is Qout=1. In the D/A converter 30, the reference voltage is selected based on the quantization result Qout to perform subtraction. In the subtraction at time t203, the switches SDT and SD3 are turned on, thereby decreasing the output voltage Vout of the operational amplifier 11.

If the sampling period and the holding period in the first subtraction operation are collectively regarded as one cycle of the first subtraction operation for each period, this cycle is repeated by a predetermined number of cycles. In the present embodiment, three cycles including the first cycle from time t202 to time t204 are repeated. As a result, Dout=48 is output as a result of the A/D conversion by the first subtraction operation until the completion of the first subtraction operation at time t208.

<First Amplifier Operation (1-AMP)>

Figure 11:
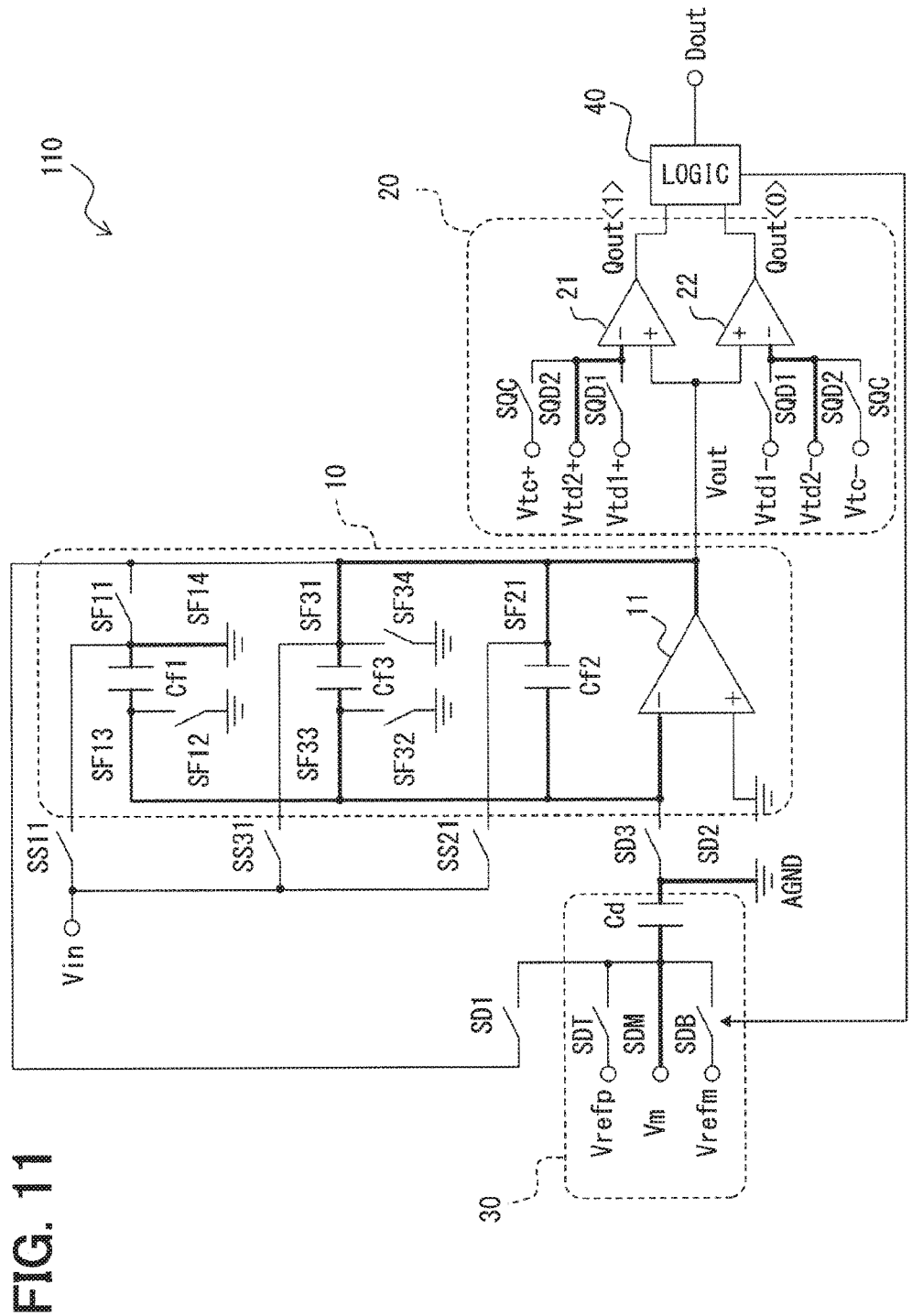
FIG. 11 is a connection diagram showing a first amplification operation.

After the first subtraction operation, the first amplification operation is executed at time t208 to time t209 shown in FIG. 10. In the first amplification operation, the integrator 10 and the D/A converter 30 are electrically disconnected from each other by turning off the switch SD3 as shown in FIG. 11. The D/A converter capacitor Cd is reset by turning on the switches SD2 and SDM. In the quantizer 20, Vtd2+ and Vtd2− are respectively selected as thresholds of the comparators 21 and 22 by turning on the switch SQD2.

In the integrator 10, the first feedback switch SF11 is turned off while the switch SF14 is turned on. As a result, the charges accumulated in the first feedback capacitor Cf1 are transferred to the second feedback capacitor Cf2 and the third feedback capacitor Cf3, and the output voltage Vout of the operational amplifier 11 is amplified.

<2nd Subtraction Operation (2-SUB)>

Figure 12:
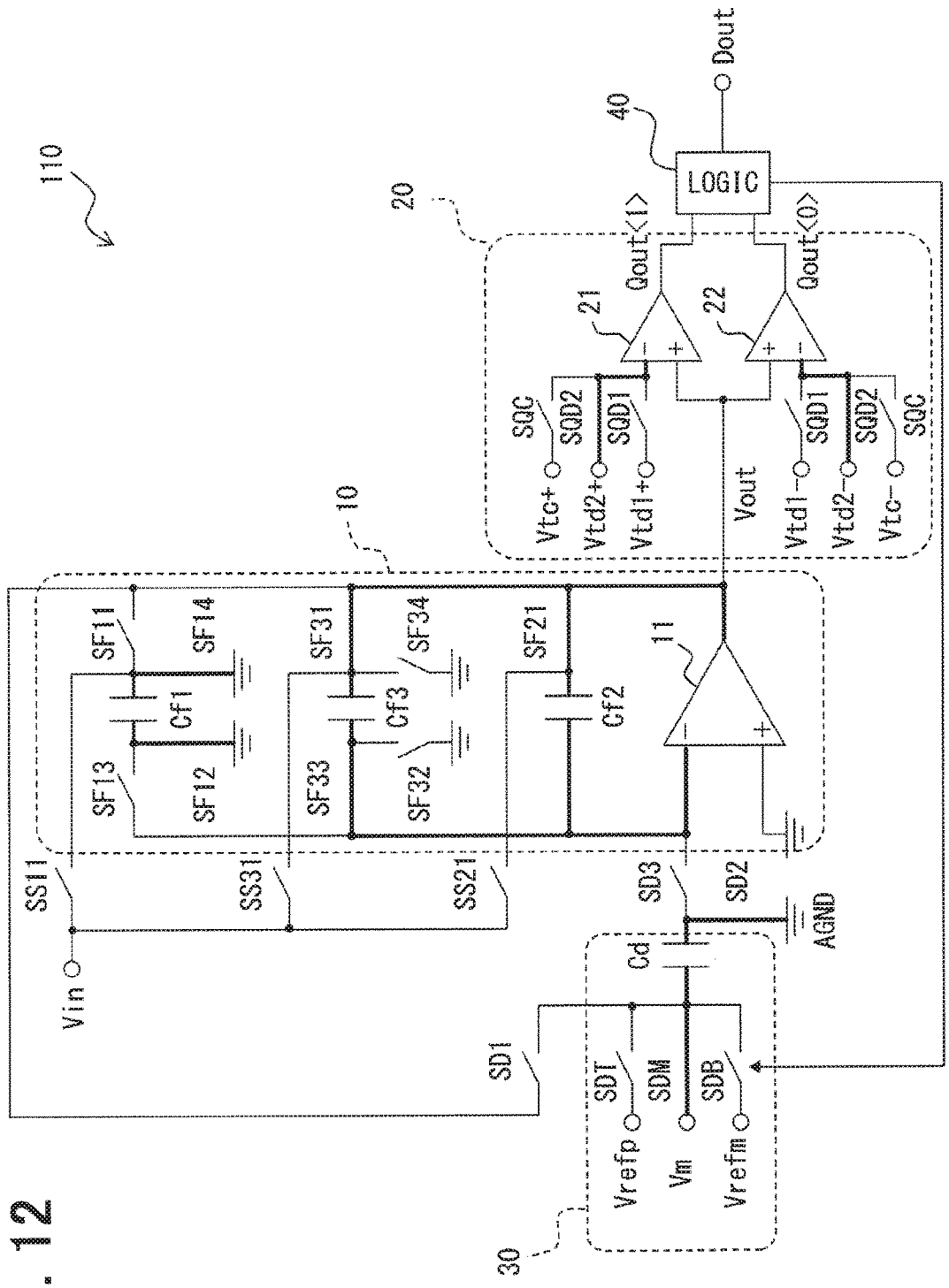
FIG. 12 is a connection diagram showing an operation of a sampling period according to a second subtraction operation.

After the first amplification operation, a second subtraction operation is performed between time t209 and time t211 shown in FIG. 10. In the sampling period related to the second subtraction operation from time t209 to time t210, the first feedback capacitor Cf1 is electrically disconnected from the integrator 10 by turning off the switch SF13 and turning on the switch SF12 in the integrator 10 as shown in FIG. 12, and both ends of the first feedback capacitor Cf1 are connected to AGND.

Figure 13:
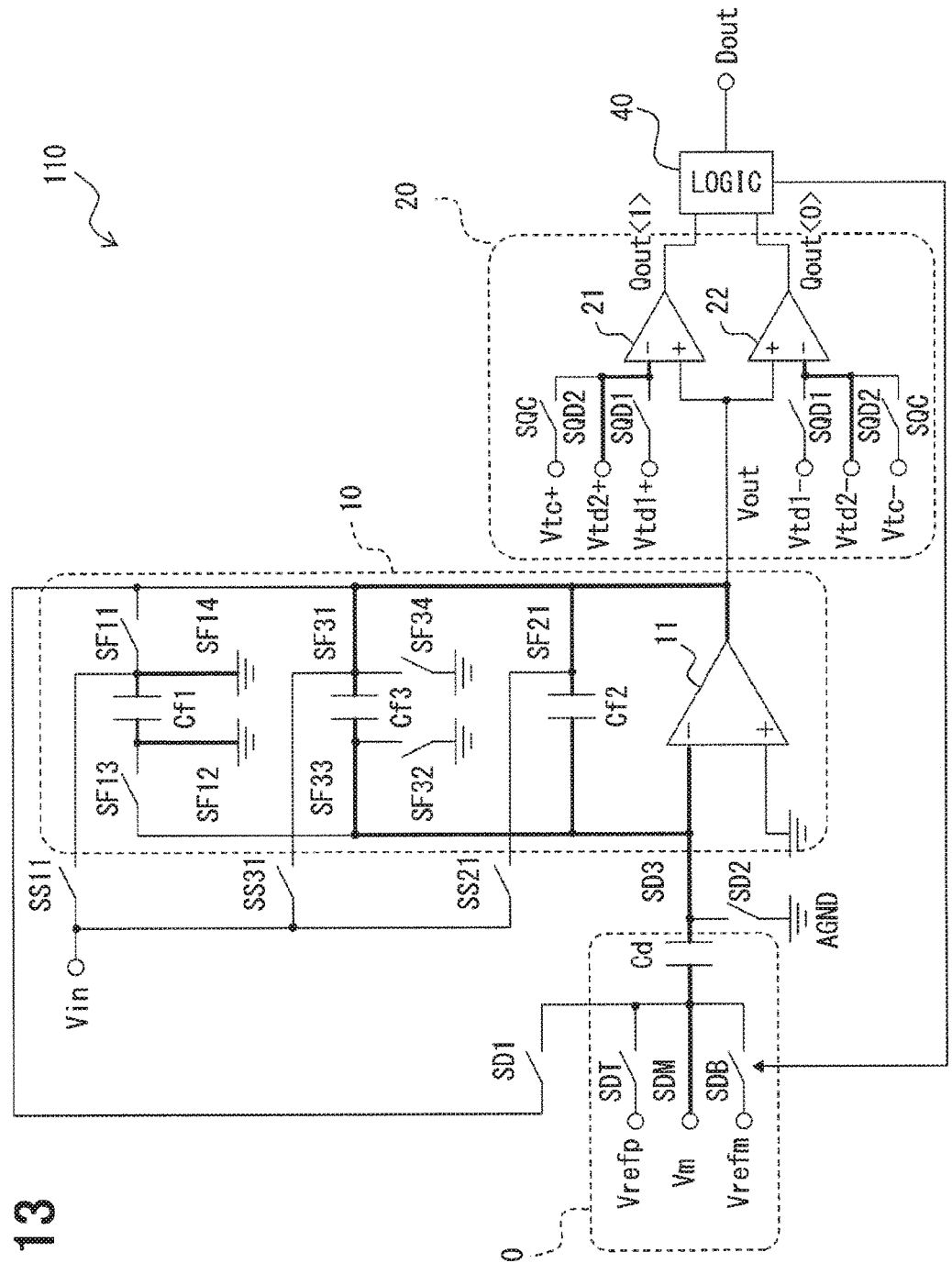
FIG. 13 is a connection diagram showing an operation of a holding period according to the second subtraction operation.

In the case of FIG. 10, the output voltage Vout from time t209 to time t210 is Vtd2−<Vout<Vtd2+, and the output voltage Qout is 0. Since Qout is 0, in the holding period related to the second subtraction operation from time t210 to time t211, as shown in FIG. 13, the switch SDM is kept on, the switch SD2 is turned off, and the switch SD3 is turned on, to thereby execute the subtraction based on the quantization result. Since the D/A converter voltage Vm does not change before and after time t210, the subtraction is not substantially performed, and Vout does not change at time t210. Since the quantization result is Qout=0, the A/D conversion result does not change at Dout=48. With three cycles of the first subtraction operation and the above second subtraction operation, four subtraction operations in total are executed.

<2nd Amplifier Operation (2-AMP)>

Figure 14:
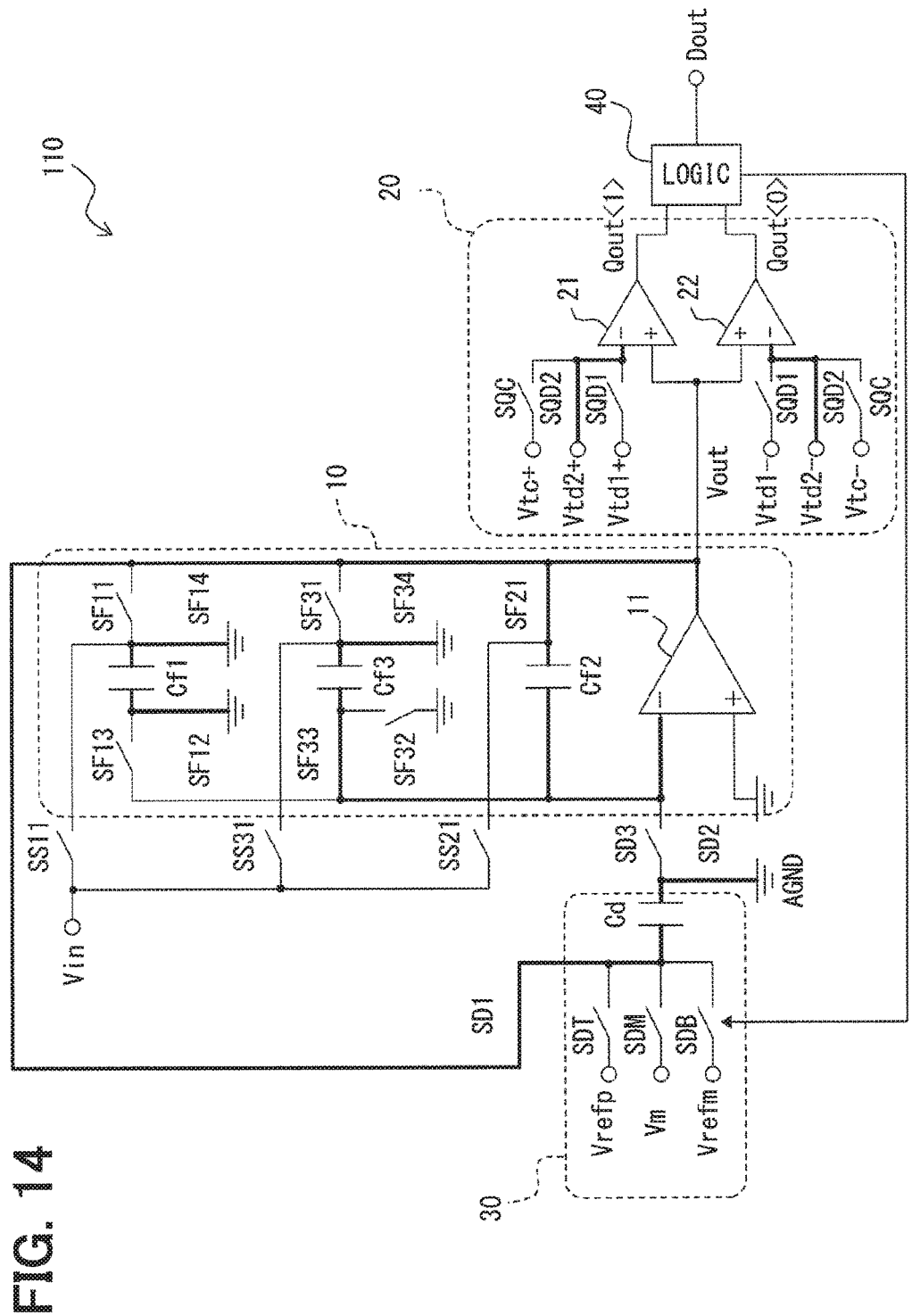
FIG. 14 is a connection diagram showing a second amplification operation.

At time t211 to time t212 shown in FIG. 10, the second amplification operation is performed. As shown in FIG. 14, the second amplification operation is realized by the same operation as the amplification operation of the first embodiment (refer to FIG. 6). The switches SD3, SDT, SDM, and SDB are turned off, to thereby disconnect the inverting input terminal of the operational amplifier 11, the reference voltage, and the D/A converter capacitor Cd from each other. In the integrator 10, when the switch SF31 is turned off and the switch SF34 is turned on, charges accumulated in the third feedback capacitor Cf3 are transferred to the second feedback capacitor Cf2, and the output voltage Vout of the operational amplifier 11 is amplified. When the switches SD1 and SD2 are turned on, charges corresponding to a residual of the A/D conversion by the first subtraction operation and the second subtraction operation are accumulated in the D/A converter capacitor Cd.

In the present embodiment, in the second amplification operation, when the switch SQD2 is turned off and the switch SQC is turned on, the thresholds of the comparators 21 and 22 are changed from Vtd2+ and Vtd2− to Vtc+ and Vtc−, respectively. Since the switch SQC is kept on even in the cyclic operation after the second amplification operation, Vtc+ and Vtc− are maintained in the selected state as the threshold values of the comparators 21 and 22.

<Cyclic Operation (CYC)>

The cyclic operation after time t212 is the same as the cyclic operation after time t111 in the first embodiment, and a description of that cyclic operation will be omitted.

The specific operation of the A/D converter 110 according to the present embodiment has been described above. According to the above configuration, since the second subtraction operation, that is, the last subtraction operation is performed after the first amplification operation, the quantization is performed by the quantizer 20 in a state where as the thresholds of the comparators 21 and 22, Vtd1+ and Vtd1− absolute values of which are larger than those of Vtd2+ and Vtd2− are selected, so that the effects of the offsets of the comparators 21 and 22 can be reduced. Further, in a mode in which the amplification operation is performed in multiple times, the performance related to the amplification of the operational amplifier 11 can be relaxed as compared with the mode in which the amplification operation is performed in one operation.

In the present embodiment, an example has been described in which the first amplification operation is performed between the first subtraction operation and the second subtraction operation in three cycles, but the first amplification operation may be performed after the first subtraction operation in four cycles, and then the second subtraction operation may be further performed.

In addition, in the present embodiment, an example has been described in which the amplification is performed in two separate amplification operations, i.e., the first amplification operation and the second amplification operation, but the amplification operation may be performed in three or more separate amplification operations.

Third Embodiment

In the present embodiment, a configuration in which the cyclic operation is performed at twice the speed as compared with the A/D converter 100 in the first embodiment will be described.

First, a difference in configuration between an A/D converter 120 in the present embodiment and the A/D converter 100 in the first embodiment will be described with reference to FIG. 15.

Figure 15:
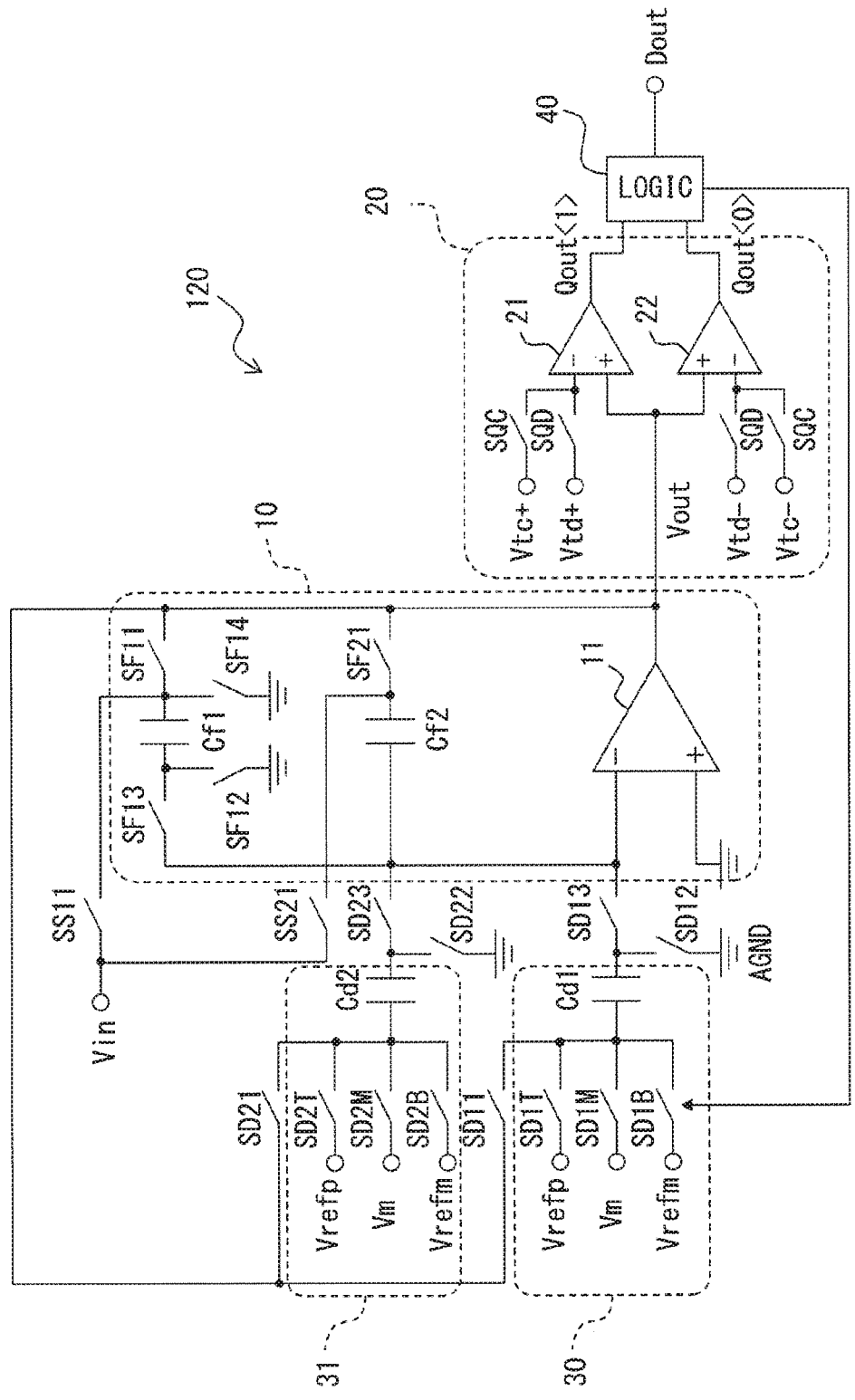
FIG. 15 is a circuit diagram showing a schematic configuration of an A/D converter according to a third embodiment.

As shown in FIG. 15, the A/D converter 120 according to the present embodiment includes one more D/A converter as compared with the A/D converter 100 according to the first embodiment. Specifically, the A/D converter 120 includes a D/A converter 31 in addition to a D/A converter 30.

Although the D/A converter 30 has the same configuration as the D/A converter 30 in the first embodiment, in FIG. 15, a D/A converter capacitor is denoted as Cd1, switches for selecting a reference voltage are denoted as SD1T, SD1M, and SD1B, a switch for connecting an inverting input terminal of an operational amplifier 11 and a D/A converter capacitor Cd1 is denoted as SD13, a switch for connecting the D/A converter capacitor Cd1 to AGND is denoted as SD12, and a switch for connecting a D/A converter 30 and the output terminal of the operational amplifier 11 is denoted as SD11.

The D/A converter 31 is connected in parallel with the D/A converter 30 to the inverting input terminal of the operational amplifier 11 through the switch SD23. The configuration of the D/A converter 31 is the same as that of the D/A converter 30, and the reference voltages Vrefp, Vm, and Vrefm are connected to the D/A converter capacitor Cd2 through the switches SD2T, SD2M, and SD2B, respectively. The D/A converter capacitor Cd2 is connected to the output terminal of the operational amplifier 11 through a switch SD21. Further, the D/A converter capacitor Cd2 is connected to AGND through a switch SD22.

When the D/A converter 31 and the switches SD21, SD23, and SD22 are removed from the A/D converter 120, the circuit configuration is the same as that of the A/D converter 100 in the first embodiment.

Next, a specific operation of the A/D converter 120 will be described with reference to a timing chart shown in FIG. 16 and connection diagrams shown in FIGS. 17 to 19.

Figure 16:
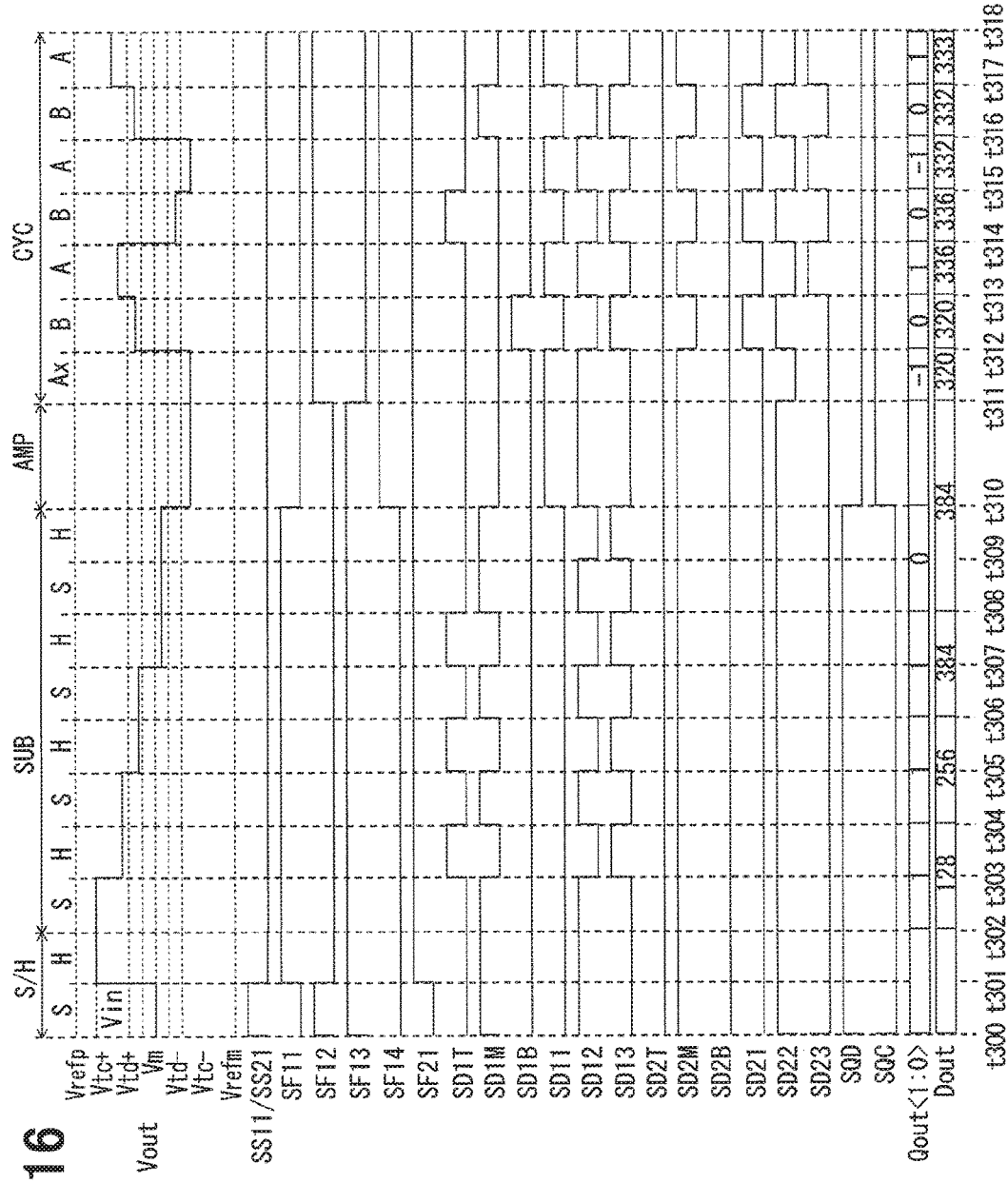
FIG. 16 is a timing chart showing an operation of the A/D converter.
Figure 17:
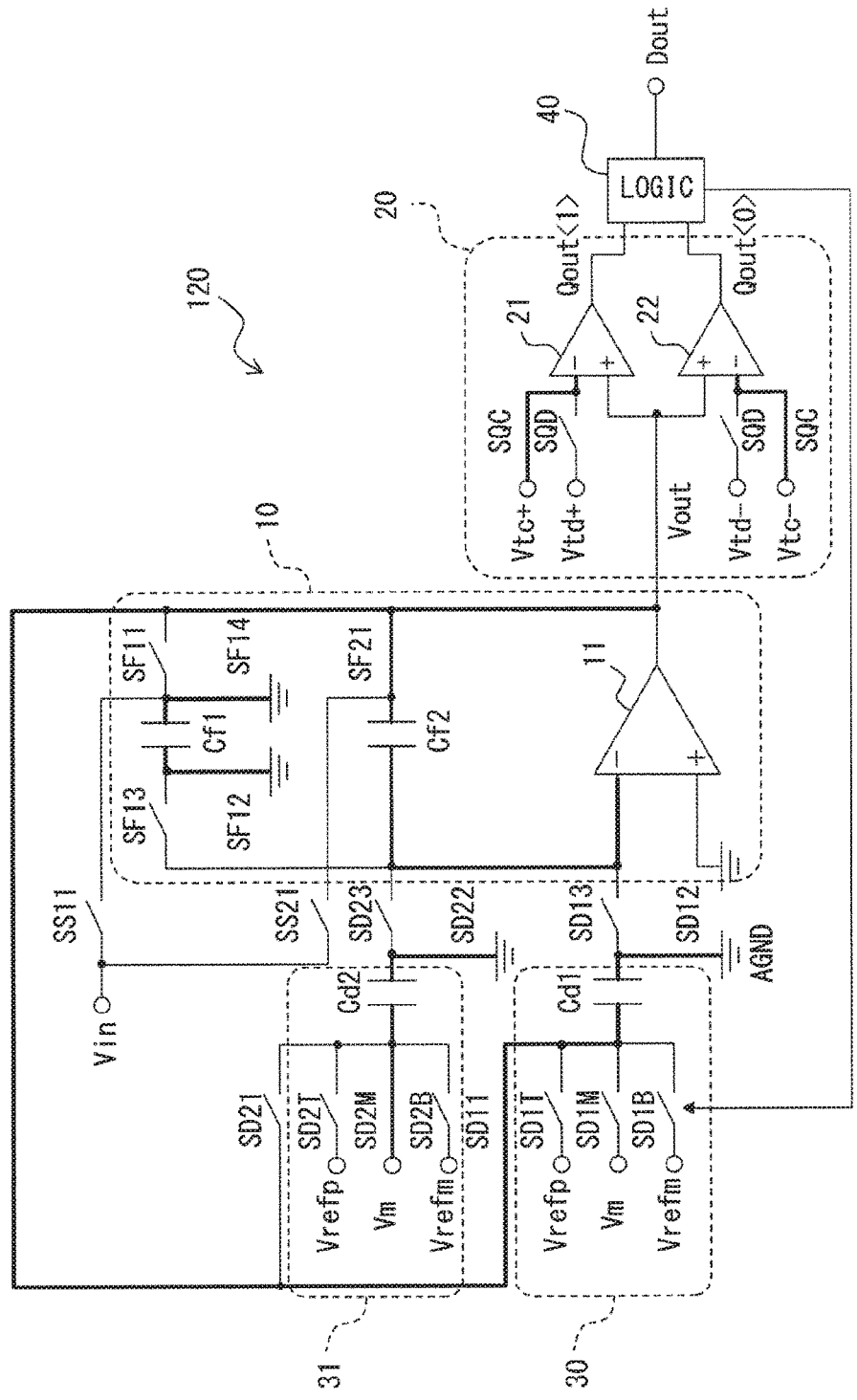
FIG. 17 is a connection diagram showing an operation in a sampling period related to a cyclic operation.

As shown in FIG. 16, the A/D converter 120 relates to the A/D conversion of the input signal Vin, and performs a sample and hold operation (S/H in FIG. 16), a subtraction operation (SUB in FIG. 16), an amplification operation (AMP in FIG. 16), and a cyclic operation (CYC in FIG. 16).

Hereinafter, each operation will be described.

<Sample and Hold Operation (S/H): Sampling Period (S)>

At time t300 to time t301 shown in FIG. 16, sampling of the input signal Vin is performed. In the sample and hold operation and the subtraction operation of the present embodiment, since only the D/A converter 30 is used for subtraction and no D/A converter 31 is used, the operation of the A/D converter 120 is the same as the operation of the A/D converter 100 in the first embodiment. In the sample and hold operation and the subtraction operation, the switch SD21 and the switch SD23 are in an off state, and the D/A converter 31 does not substantially operate. Further, the switch SD22 and the switch SD2M are turned on, and the D/A converter capacitor Cd2 is reset.

<Sample and Hold Operation (S/H): Holding Period (H)>

A period from time t301 to time t302 shown in FIG. 16 is a holding period related to the sample and hold operation, and the operation of the A/D converter 120 is the same as the operation of the A/D converter 100 in the first embodiment.

<Subtraction Operation (SUB)>

The subtraction operation is executed at time t302 to time t310 shown in FIG. 16. The operation of the A/D converter 120 in the sampling period and the holding period related to the subtraction operation is the same as the operation of the A/D converter 100 in the first embodiment.

If the sampling period and the holding period in the subtraction operation are collectively regarded as one cycle of the subtraction operation for each period, this cycle is repeated by a predetermined number of cycles. In the present embodiment, four cycles are repeated from time t302 to time t310, which is the first cycle. For example, in the quantization at time t302 to time t303, at time t304 to time t305, at time t306 to time t307, and at time t308 to time t309 shown in FIG. 16, Qout values are 1, 1, 1, and 0, respectively. In the example shown in FIG. 16, the resolution of the A/D conversion by the cyclic operation is higher by an amount corresponding to 3 bits as compared with the example shown in FIG. 1 of the first embodiment. For that reason, the weighting of the A/D conversion result obtained by the subtraction operation is increased from 16 times to 128 times in the example of FIG. 1 of the first embodiment and reflected in the A/D conversion result Dout. Accordingly, Dout is sequentially changed to 128, 256, 384, and 384 based on the quantization result Qout, and Dout becomes 384 at time t310, which is a time point at which the subtraction operation ends.

<Amplification Operation (AMP)>

At time t310 to time t311 shown in FIG. 16, the amplification operation is executed. Also in this amplification operation, since the switch SD21 and the switch SD23 are off and the D/A converter 31 is disconnected from the integrator 10, those components do not substantially contribute to the operation of the A/D converter 120. At time t310, similarly to the amplification operation of the first embodiment, the thresholds of the comparators 21 and 22 are changed to Vtc+ and Vtc−, respectively.

<Cyclic Operation (CYC): Sampling Period (Ax)>

A period from time t311 to time t312 shown in FIG. 16 is a first sampling period related to the cyclic operation of the present embodiment. As shown in FIG. 17, since the switch SD21 and the switch SD23 are turned off, the sampling period is substantially the same as the sampling period related to the cyclic operation in the first embodiment. That is, the charges corresponding to a residual of the A/D conversion by the subtraction operation output from the operational amplifier 11 are accumulated in the D/A converter capacitor Cd1. That is, the first sampling in the cyclic operation is performed. Since a relationship in threshold between the output voltage Vout and the comparators 21 and 22 is Vout<Vtc−, the quantization result is Qout=−1, and the A/D conversion result is Dout=320.

<Cyclic Operation (CYC): Holding Period (B)>

After the first sampling period related to the cyclic operation, a period from time t312 to time t313 shown in FIG. 16 is a first holding period related to the cyclic operation, and the residual of the A/D conversion is amplified by the subtraction operation and the subtraction is executed by the use of the D/A converter 30. In the present embodiment, a second sampling in the cyclic operation is simultaneously performed in the D/A converter 31.

Figure 18:
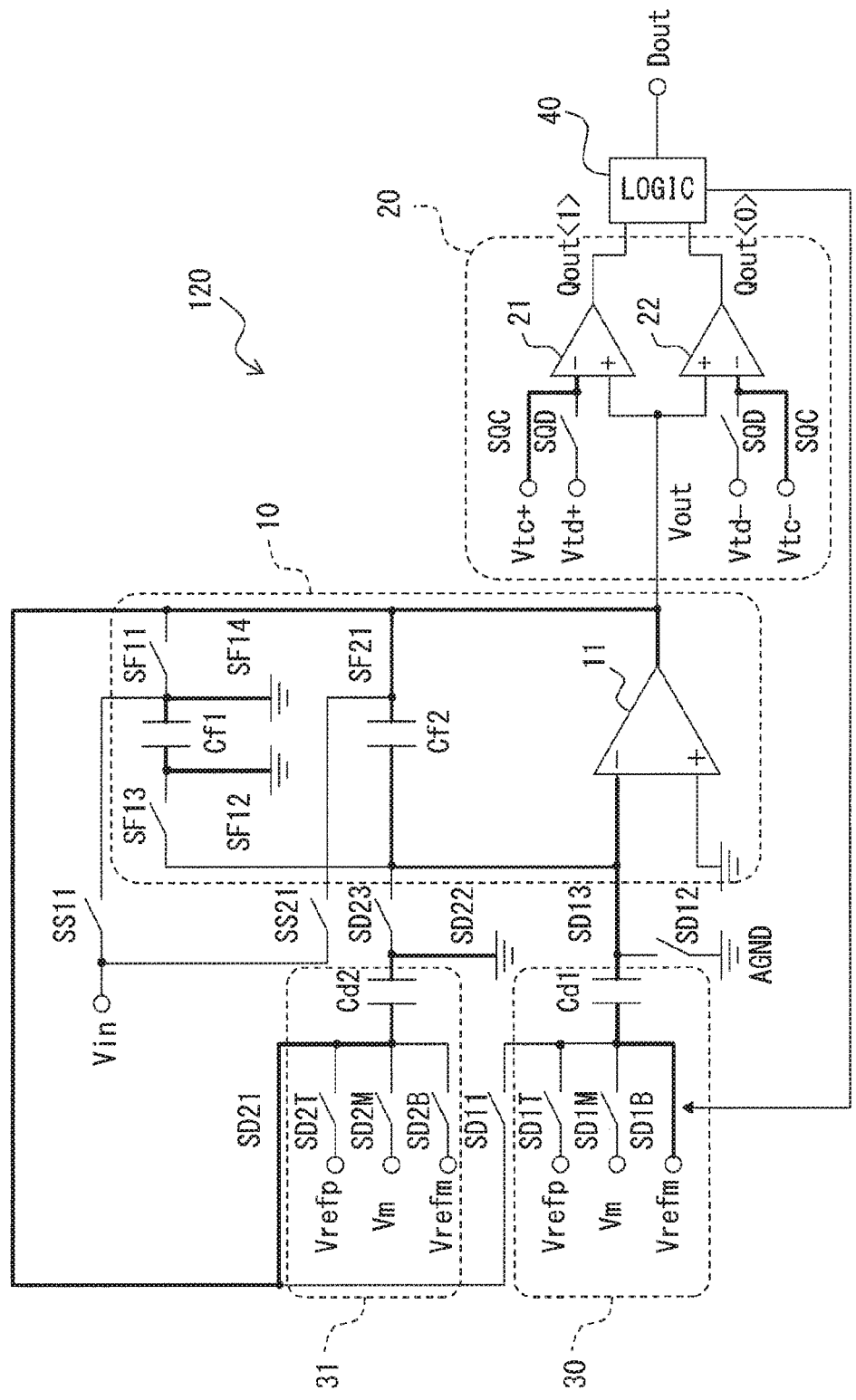
FIG. 18 is a connection diagram showing an operation of a holding period related to the cyclic operation.
Figure 19:
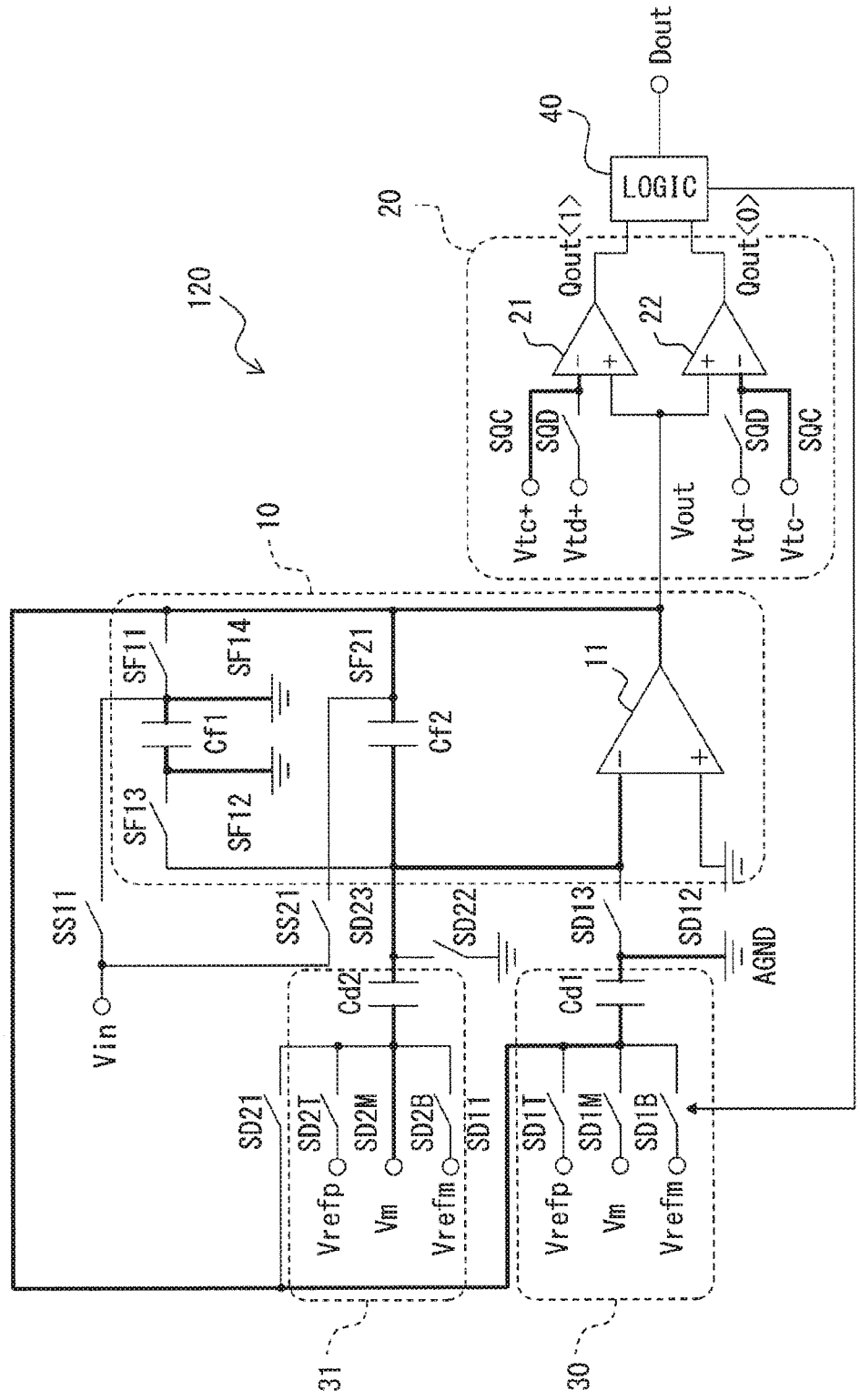
FIG. 19 is a connection diagram showing an operation of another sampling period related to the cyclic operation.

In response to the quantization result Qout at time t311 to time t312 being −1, the switch SD1B is turned on in the D/A converter 30 as shown in FIG. 18. When the switch SD12 is turned off and the switch SD13 is turned on, the D/A converter 30 is electrically connected to the integrator 10. As a result, charges corresponding to a difference between the reference voltage of the D/A converter 30 and the residual of the A/D conversion are transferred from the D/A converter capacitor Cd1 to the second feedback capacitor Cf2, and the residual of the A/D conversion is amplified by the subtraction operation and the subtraction using the D/A converter 30 is performed. Since Vtc−<Vout<Vtc+, Qout=0 and Dout=320 are output.

In addition, at time t311 to time t312, the switch SD21 and the switch SD22 are turned on. As a result, in the D/A converter 31, charges corresponding to the output voltage Vout of the operational amplifier 11 are accumulated in the D/A converter capacitor Cd2, and the residual of the A/D conversion by the cyclic operation, that is, the second sampling in the cyclic operation is performed.

In the second and subsequent holding periods related to the cyclic operation after time t314, the switches shown in FIG. 18 are connected in the same manner as in the first holding period, but since the residual of the A/D conversion by the cyclic operation is output as Vout in the immediately preceding operation, the residual of the A/D conversion by the cyclic operation is amplified instead of the residual of the A/D conversion by the subtraction operation.

As described above, in the holding period related to the cyclic operation of the present embodiment, sampling is performed by the D/A converter capacitor Cd2, but for convenience of description, the period is simply referred to as a holding period.

<Cyclic Operation (CYC): Sampling Period (A)>

At time t313 to time t314 shown in FIG. 16, the residual of the A/D conversion by the cyclic operation is amplified, the subtraction using the D/A converter 31 is performed, and the third sampling in the cyclic operation is performed. Since Qout is 0 at time t312 to time t313, Vm is selected as the reference voltage of the D/A converter 31 as shown in FIG. 19. That is, the switch SD2M is turned on and the switch SD23 is turned on, and the amplification of the residual of the A/D conversion by the cyclic operation and the subtraction using the D/A converter 31 are performed. At the same time, the switch SD11 and the switch SD12 are turned on, and charges corresponding to the output voltage Vout of the operational amplifier 11 are accumulated in the D/A converter capacitor Cd1 of the D/A converter 30. That is, the third sampling in the cyclic operation is performed.

As described above, in the cyclic operation between time t311 and time t318, the D/A converter capacitor Cd1 and the D/A converter capacitor Cd2 are alternately switched in use. As a result, the A/D conversion by the cyclic operation can be performed at twice the speed as compared with the case where sampling, amplification, and subtraction are performed for the cyclic operation using a single D/A converter capacitor as in the first embodiment.

In the present embodiment, seven quantizations are performed in the cyclic operation between time t310 and time t318. As a result, Dout 333, which is the final A/D conversion result of the A/D converter 120, is output.

The specific operation of the A/D converter 120 according to the present embodiment has been described above. Accordingly, the A/D conversion by the cyclic operation can be performed at substantially twice the speed as compared with the first embodiment.

In the present embodiment, the D/A converter used in the subtraction operation and one of the two D/A converters used in the cyclic operation are collectively realized by one D/A converter, that is, the D/A converter 30, but the D/A converter used in the subtraction operation and the D/A converter used in the cyclic operation may be realized by two separate D/A converters.

Fourth Embodiment

In the present embodiment, a configuration will be described in which the influence of an error in a capacitance value of a capacitive element on a linearity of an A/D conversion result can be reduced as compared with the first embodiment.

First, a difference in configuration between an A/D converter 130 in the present embodiment and the A/D converter 100 in the first embodiment will be described with reference to FIG. 20.

Figure 20:
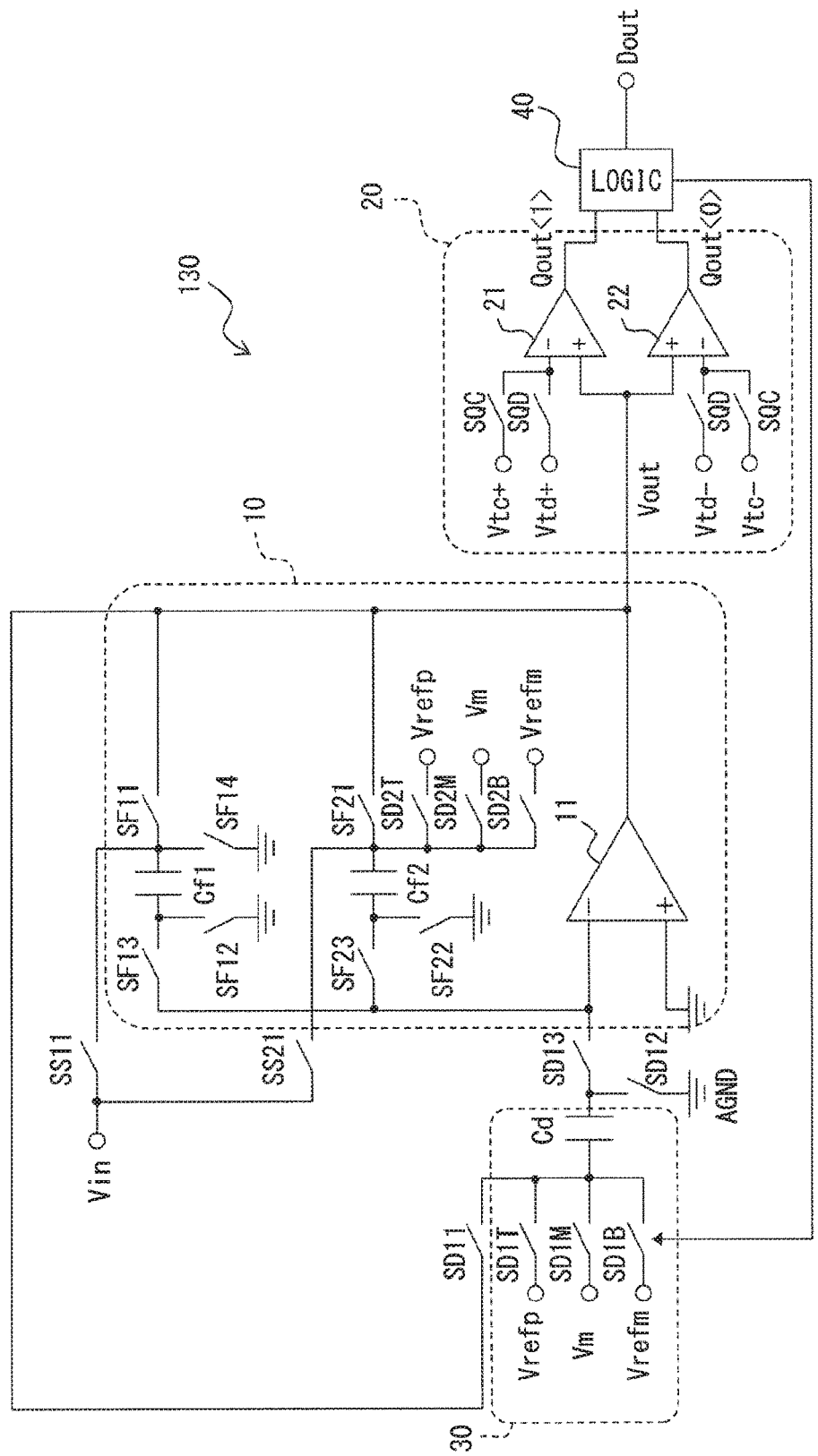
FIG. 20 is a circuit diagram showing a schematic configuration of an A/D converter according to a fourth embodiment.

As shown in FIG. 20, the A/D converter 130 according to the present embodiment can configure a D/A converter using a second feedback capacitor Cf2 in addition to a D/A converter 30.

More specifically, a reference voltage Vrefp is connected to an intermediate point between the second feedback capacitor Cf2 and a second feedback switch SF21 through a switch SD2T, a reference voltage Vm is connected to an intermediate point between the second feedback capacitor Cf2 and a second feedback switch Vrefm through a switch SD2M, and a reference voltage Vrefm is connected to an intermediate point between the second feedback capacitor Cf2 and a second feedback switch Vrefm through a switch SD2B.

The second feedback capacitor Cf2 is connected to an inverting input terminal of an operational amplifier 11 through a switch SF23. An intermediate point between the second feedback capacitor Cf2 and the switch SF23 is connected to AGND through a switch SF22.

The D/A converter 30 connected to the integrator 10 has the same configuration as the D/A converter 30 in the first embodiment, but in reference numerals in FIG. 20, switches for selecting the reference voltages are denoted by SD1T, SD1M, and SD1B, a switch for connecting the D/A converter 30 and the inverting input terminal of the operational amplifier 11 is denoted as SD13, a switch for connecting the D/A converter capacitor Cd to AGND is denoted as SD12, and a switch for connecting the D/A converter 30 and the output terminal of the operational amplifier 11 is denoted as SD11.

Next, the specific operation of the A/D converter 130 will be described with reference to a timing chart shown in FIG. 21 and connection diagrams shown in FIGS. 22 to 24.

Figure 21:
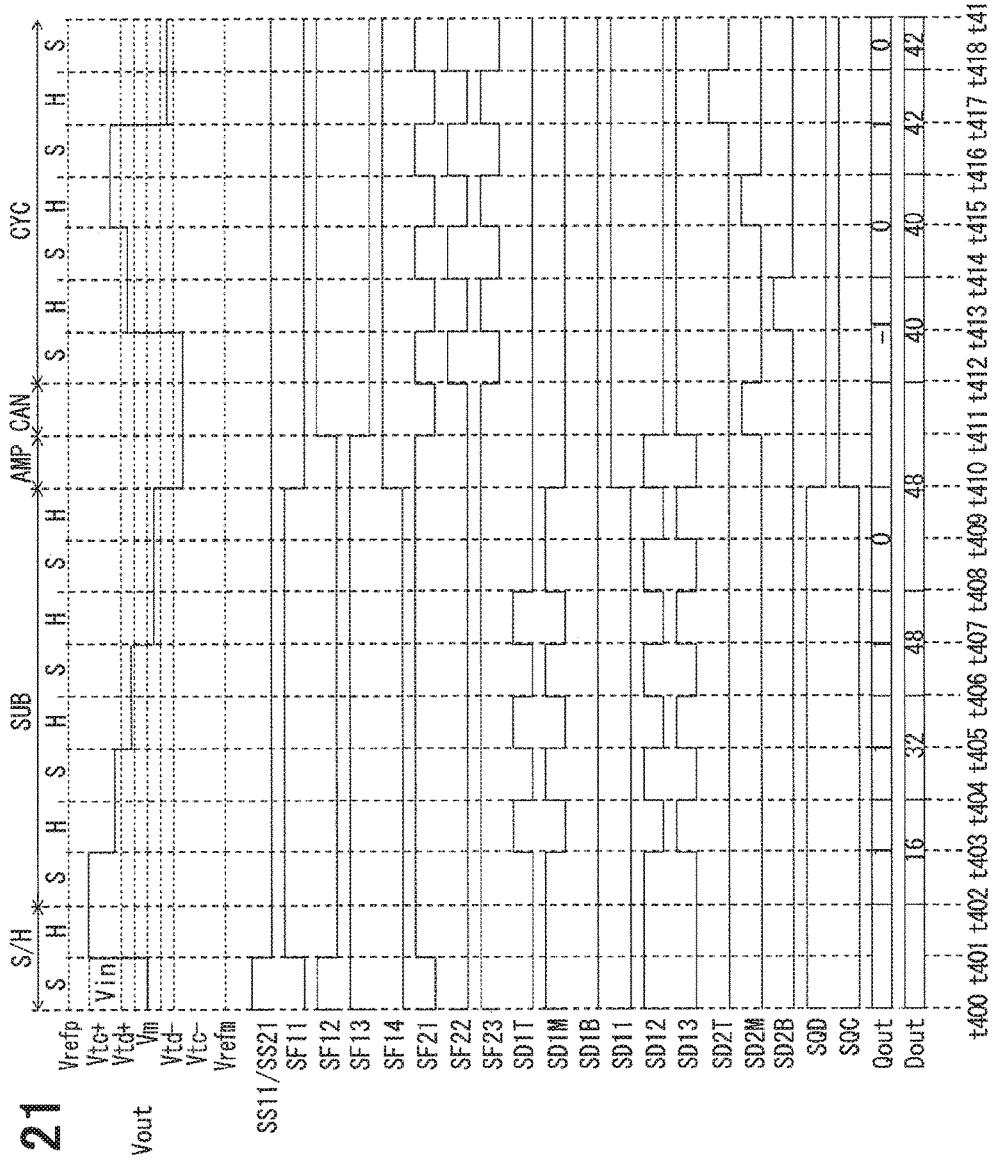
FIG. 21 is a timing chart showing an operation of the A/D converter.

As shown in FIG. 21, the A/D converter 130 performs a sample and hold operation (S/H in FIG. 21), a subtraction operation (SUB in FIG. 21), an amplification operation (AMP in FIG. 21), an error cancellation operation (CAN in FIG. 21), and a cyclic operation (CYC in FIG. 21) in relation to the A/D conversion of the input signal Vin.

Hereinafter, each operation will be described.

<Sample and Hold Operation (S/H): Sampling Period (S)>

A period from time t400 to time t401 shown in FIG. 21 is a sampling period related to the sample and hold operation. The switches SF14, SD2T, SD2M, SD2B, and SF22 are turned off, and the switches SF12, SF13, and SF23 are turned on, whereby charges corresponding to the input signal Vin are accumulated in the first feedback capacitor Cf1 and the second feedback capacitor Cf2.

<Sample and Hold Operation (S/H): Holding Period (H)>

A period from time t401 to time t402 is a holding period related to the sample and hold operation. In the sample and hold operation, since the second feedback capacitor Cf2 of the integrator 10 does not function as a D/A converter, the operation of the A/D converter 130 is substantially the same as the operation of the A/D converter 100 in the first embodiment.

<Subtraction Operation (SUB)>

At time t402 to time t410, a subtraction operation is performed. Also in the subtraction operation, the operation of the A/D converter 130 is the same as the operation of the A/D converter 100 in the first embodiment.

<Amplification Operation (AMP)>

At time t410 to time t411, the amplification operation is performed. The operation of the A/D converter 130 in the amplification operation is the same as the operation of the A/D converter 100 in the first embodiment.

<Error Cancellation Operation (CAN)>

The A/D converter 130 according to the present embodiment performs the error cancellation operation from time t411 to time t412 after the amplification operation. The error cancellation operation is an operation for reducing an error in Vout caused by an error in a ratio between a capacitance value of the D/A converter capacitor Cd and a capacitance value of the second feedback capacitor Cf2 caused by a manufacturing variation or the like.

Figure 22:
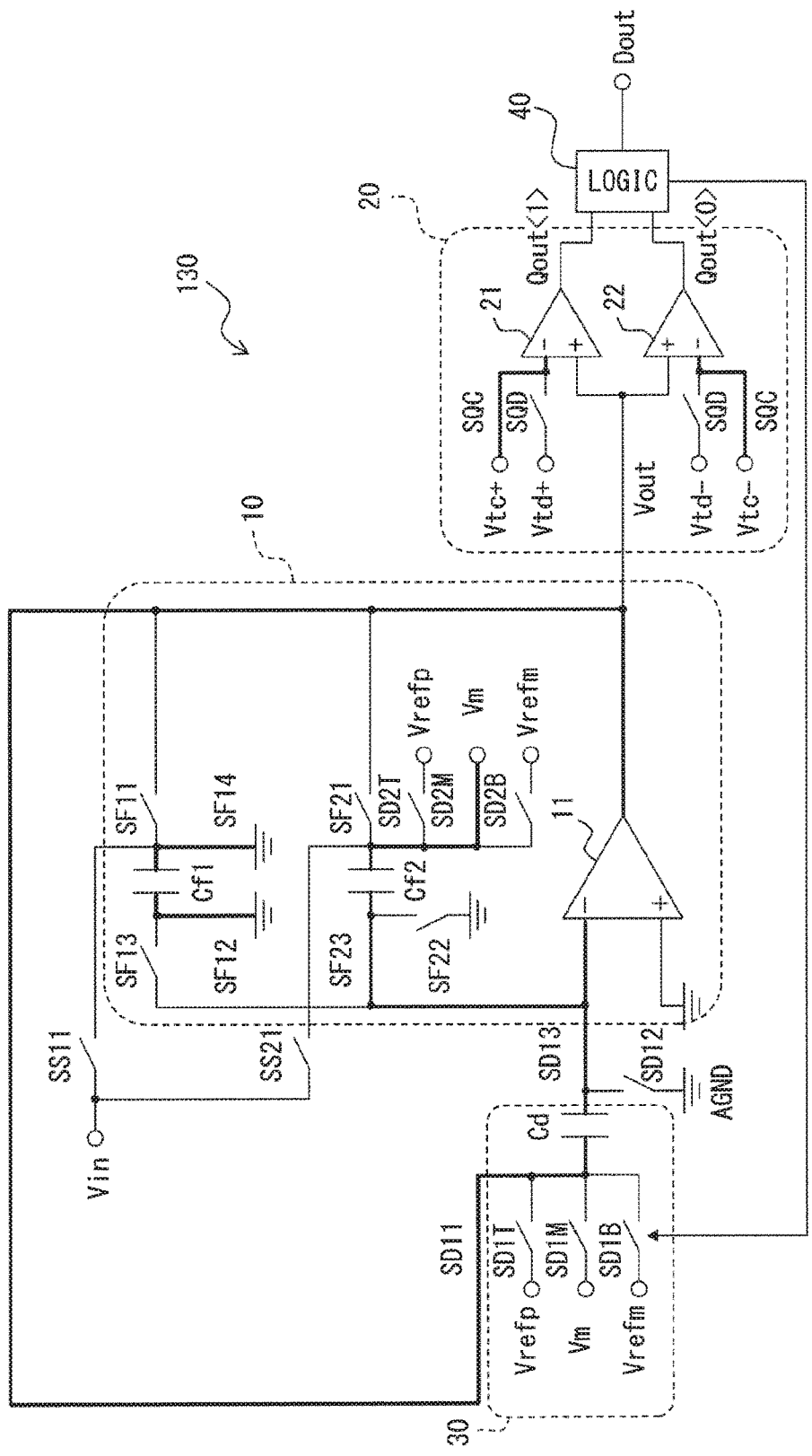
FIG. 22 is a connection diagram showing an operation of an error cancellation.

Specifically, as shown in FIGS. 21 and 22, the second feedback switch SF21 is turned off and the switch SD2M is turned on. The switch SD12 is turned off and the switch SD13 is turned on. When the switch SD2M is turned on, the reference voltage Vm, that is, the reference voltage Vm, that is, AGND is input to one end of the second feedback capacitor Cf2, so that the charges accumulated in the second feedback capacitor Cf2, that is, the residual of the A/D conversion by the subtraction operation is transferred to the D/A converter capacitor Cd. As a result, the D/A converter capacitor Cd acts as the feedback capacitor of the operational amplifier 11 in place of the second feedback capacitor Cf2, and the residual of the A/D conversion is output as Vout.

Since both the subtraction in the subtraction operation and the output as Vout of the residual of the A/D conversion by the subtraction operation can be executed using substantially only the D/A converter capacitor Cd, Vout after the error cancellation operation is executed is not affected by the error of the ratio between the capacitance value of the D/A converter capacitor Cd and the capacitance value of the second feedback capacitor Cf2. For that reason, in the present embodiment, as compared with the first embodiment, the influence of the error in the capacitance value of the capacitive element on the linearity of the A/D conversion result can be reduced.

In a mode in which the error cancellation operation is not performed as in the first embodiment, since Vout is affected by the error of the ratio of the capacitance value of the D/A converter capacitor Cd and the capacitance value of the second feedback capacitor Cf2, for example, when the capacitance value of the D/A converter capacitor Cd is smaller than an ideal value and the capacitance value of the second feedback capacitor Cf2 is equal to the ideal value, the amount of charges subtracted by the D/A converter capacitor Cd becomes smaller than an ideal amount of charge, and therefore, an error occurs in Vout. In other words, since an error occurs in the residual of the A/D conversion by the subtraction operation, since the result of the A/D conversion by the cyclic operation for A/D converting the residual including the error also includes an error, an error also occurs in the A/D conversion result Dout of the overall A/D converter.

<Cyclic Operation (CYC): Sampling Period (S)>

In the cyclic operation executed at time t412 to time t419 shown in FIG. 21, the switch SD11 and the switch SD13 are continuously turned on and the switch SD12 is turned off from the error cancellation operation. As a result, the D/A converter capacitor Cd of the D/A converter 30 is connected between the output terminal and the inverting input terminal of the operational amplifier 11, and acts as a feedback capacitor of the operational amplifier 11.

Figure 23:
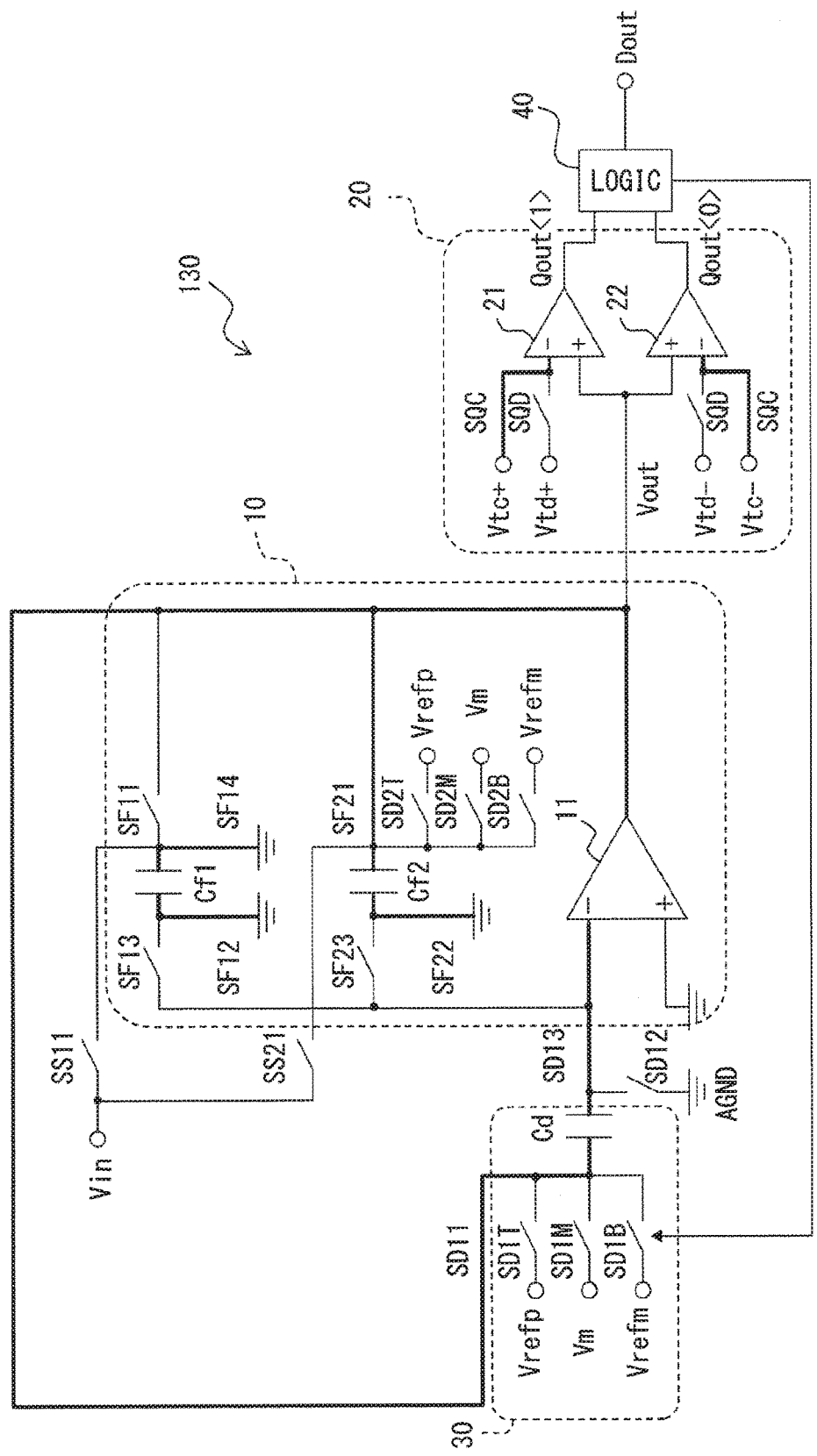
FIG. 23 is a connection diagram showing an operation of a sampling period related to a cyclic operation.

In the sampling period related to the cyclic operation at time t412 to time t413, as shown in FIG. 23, when the switch SD2M and the switch SF23 are turned off and the switches SF21 and SF22 are turned on, charges corresponding to the residual of the A/D conversion are accumulated in the second feedback capacitor Cf2. At that time, as shown in FIG. 21, since the relationship between the output voltages and the thresholds is Vout<Vtc−, Qout=−1 is output from the quantizer 20.

<Cyclic Operation (CYC): Holding Period (H)>

In the cyclic operation of the first embodiment, the subtraction is performed using the D/A converter 30, but in the cyclic operation of the present embodiment, the subtraction is performed using the second feedback capacitor Cf2 as a D/A converter.

Figure 24:
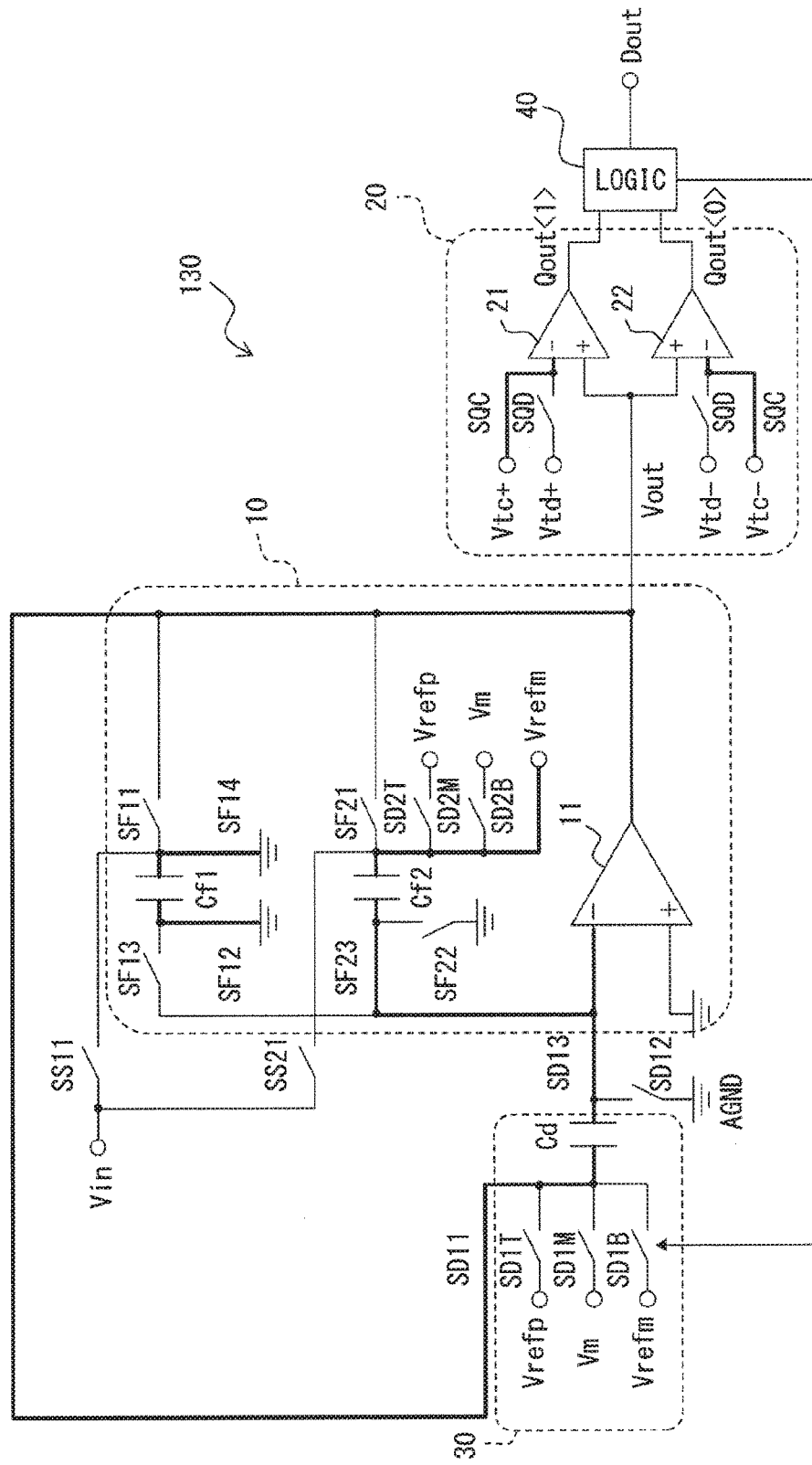
FIG. 24 is a connection diagram showing an operation of a holding period related to the cyclic operation.

In the holding period related to the cyclic operation at time t413 to time t414 shown in FIG. 21, Qout is −1, and the switch SD2B is turned on as shown in FIG. 24. When the switches SF21 and SF22 are turned off and the switch SF23 is turned on, the amplification of the residual of the A/D conversion by the cyclic operation and the subtraction using the second feedback capacitor Cf2 are performed.

If the sampling period and the holding period related to the cyclic operation described above are collectively regarded as one cycle of the cyclic operation, this cycle is repeated by a predetermined number of cycles. In the present embodiment, the cycle of the cyclic operation is repeated for four cycles between time t412 and time t419. In the example of FIG. 21, since a next cycle does not exist in the last cycle of the cyclic operation, the amplification and the subtraction are unnecessary, and thus the holding period is omitted.

The specific operation of the A/D converter 130 according to the present embodiment has been described above. According to the above configuration, the error cancellation operation is performed between the subtraction operation and the cyclic operation. For that reason, the influence of the error in the capacitance value of the capacitive element on the linearity of the A/D conversion result can be reduced.

Fifth Embodiment

In the fourth embodiment, the example in which the error cancellation operation and the cyclic operation are realized with the use of the D/A converter capacitor Cd as the feedback capacitor of the operational amplifier 11 and with the use of the second feedback capacitor Cf2 of the integrator 10 as the D/A converter capacitor in the cyclic operation has been described. In the present embodiment, a configuration will be described in which the error cancellation operation is realized while D/A converting is performed with the use of a D/A converter 30 in the same manner as in the first embodiment without using a second feedback capacitor Cf2 as the D/A converter capacitor in the cyclic operation.

Figure 25:
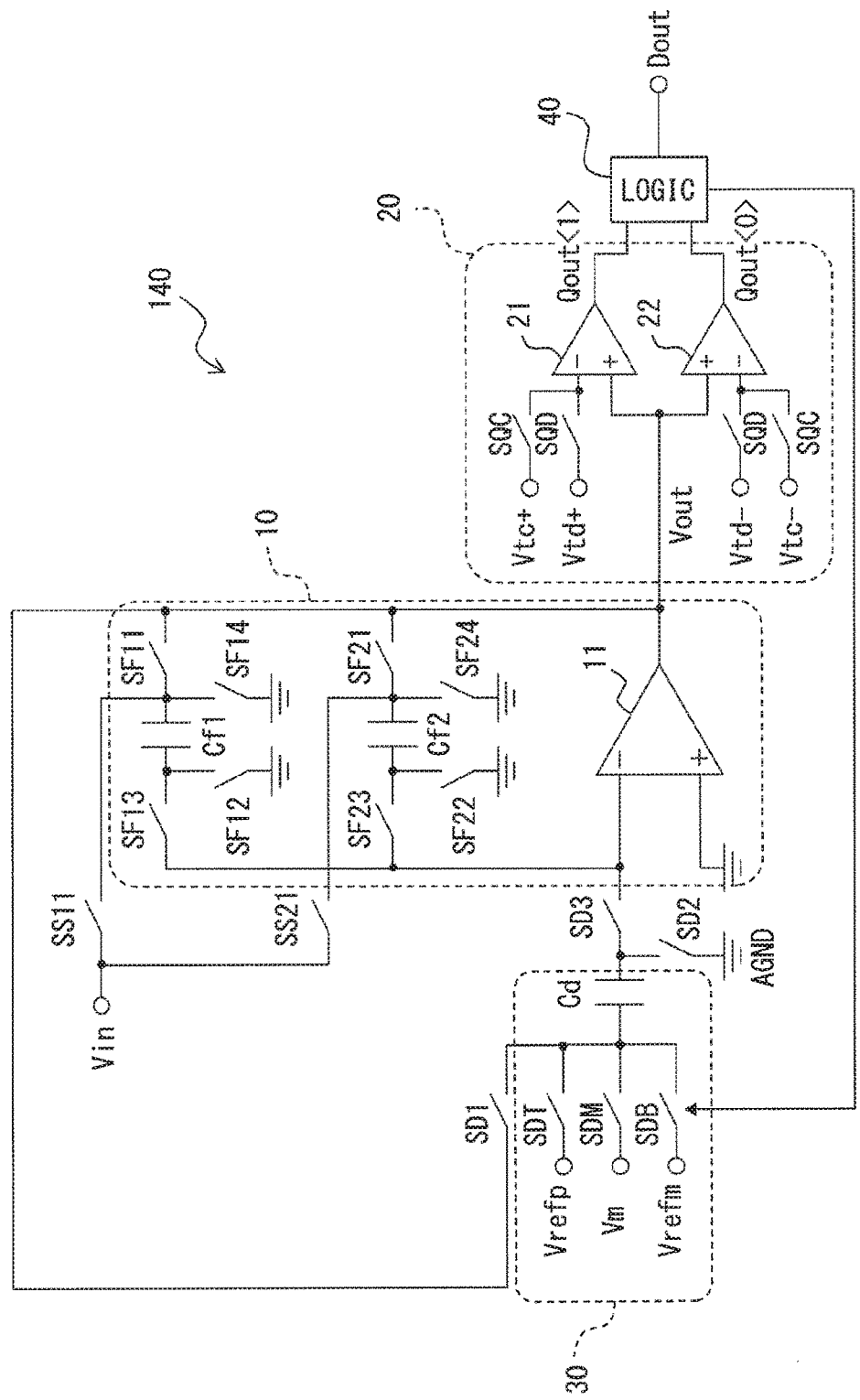
FIG. 25 is a circuit diagram showing a schematic configuration of an A/D converter according to a fifth embodiment.

First, a difference in configuration between an A/D converter 140 in the present embodiment and an A/D converter 100 in the first embodiment will be described with reference to FIG. 25.

An A/D converter 140 in the present embodiment differs from the A/D converter 100 in the first embodiment in the configuration of an integrator 10. More specifically, as shown in FIG. 25, an intermediate point between a second feedback capacitor Cf2 and a second feedback switch SF21 is connected to AGND through a switch SF24, a second feedback capacitor Cf2 is connected to an inverting input terminal of an operational amplifier 11 through a switch SF23, and an intermediate point between the second feedback capacitor Cf2 and the switch SF23 is connected to AGND through a switch SF22. An A/D converter 140 has substantially the same circuit configuration as that of the first embodiment when the switch SF23 is on and the switch SF22 is off.

Figure 27:
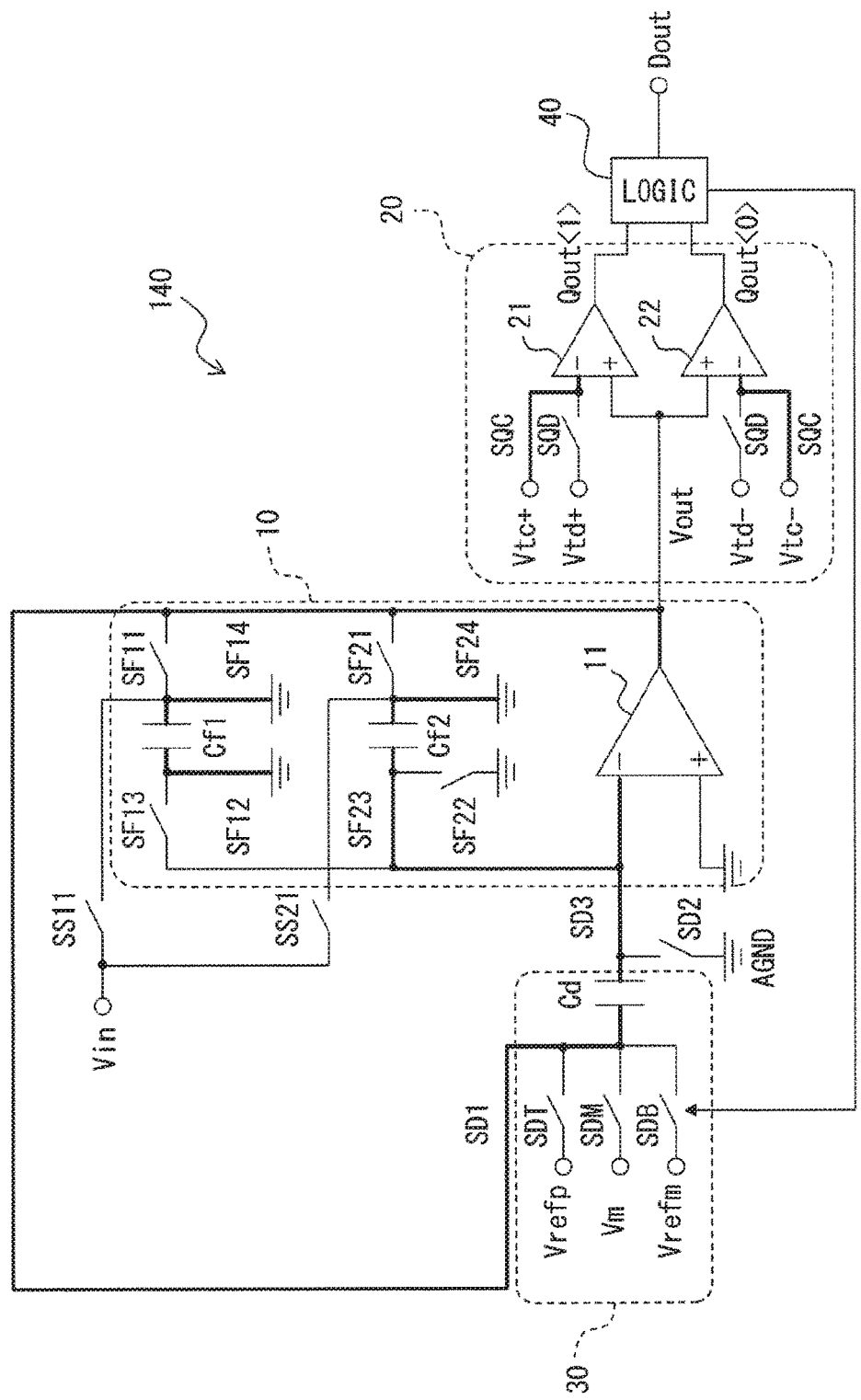
FIG. 27 is a connection diagram showing an error cancellation operation.
Figure 28:
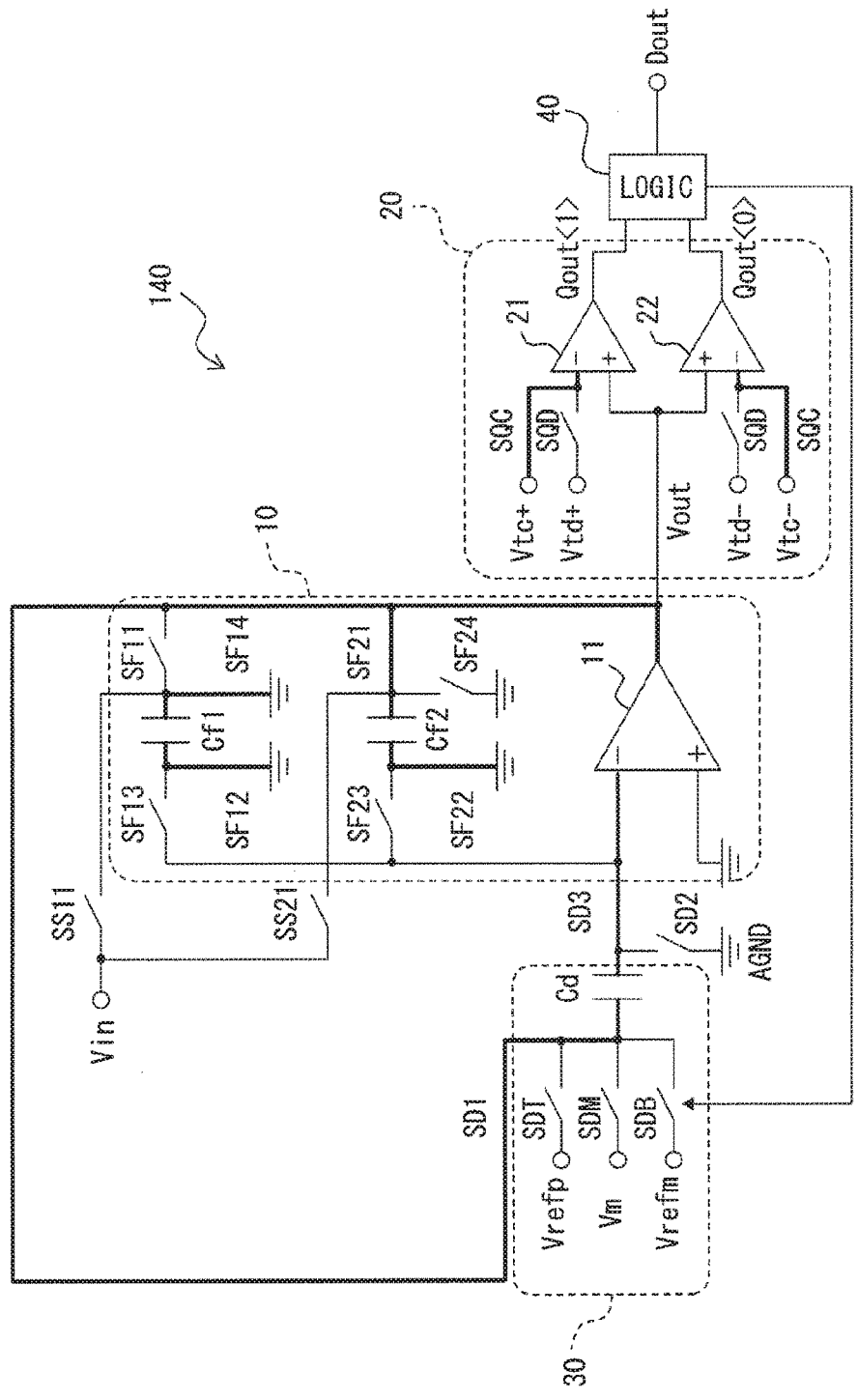
FIG. 28 is a connection diagram showing an operation of a sampling period related to a cyclic operation.
Figure 29:
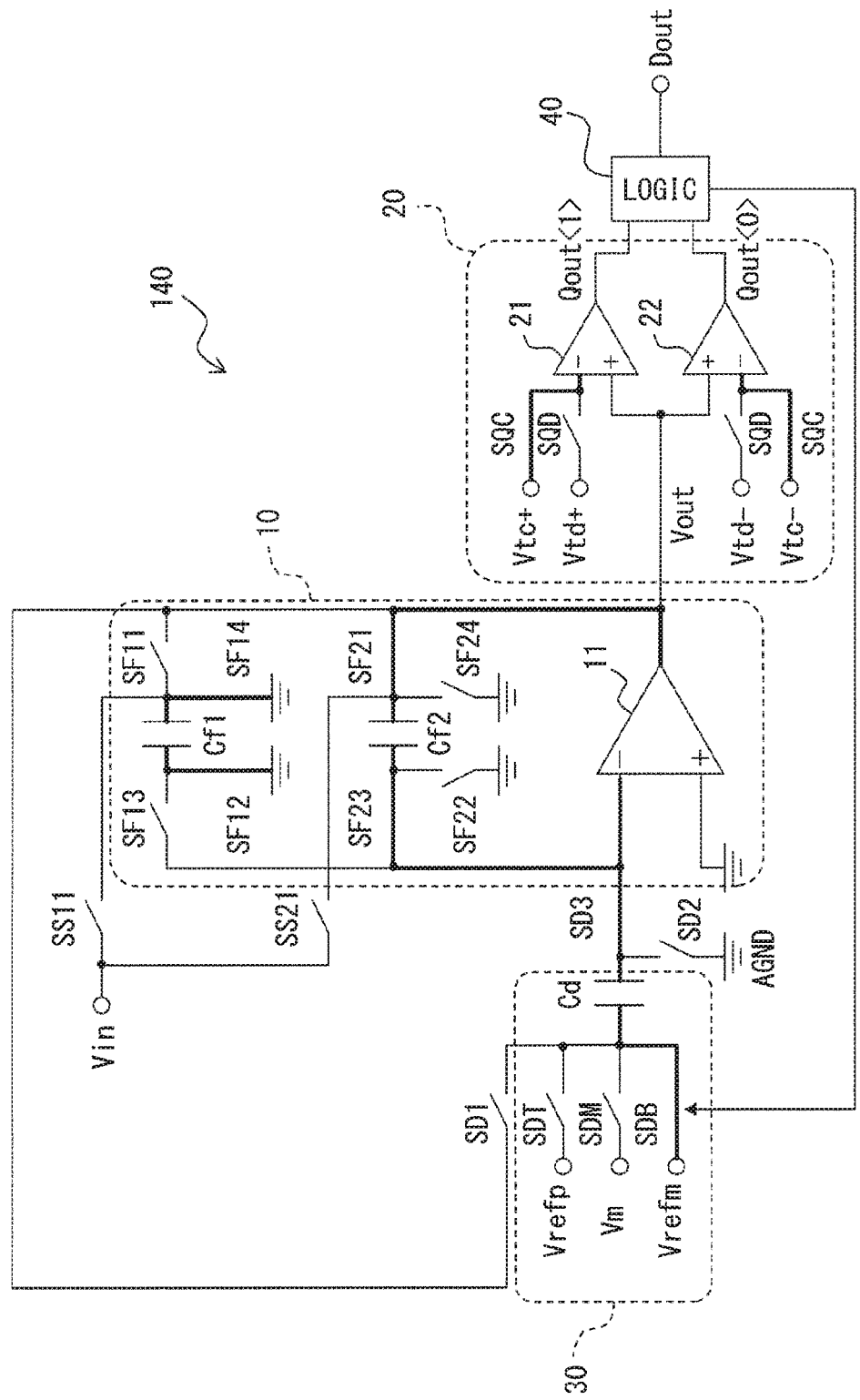
FIG. 29 is a connection diagram showing an operation of a holding period related to the cyclic operation.

Next, a specific operation of the A/D converter 140 will be described with reference to a timing chart shown in FIG. 26 and connection diagrams shown in FIGS. 27 to 29.

Figure 26:
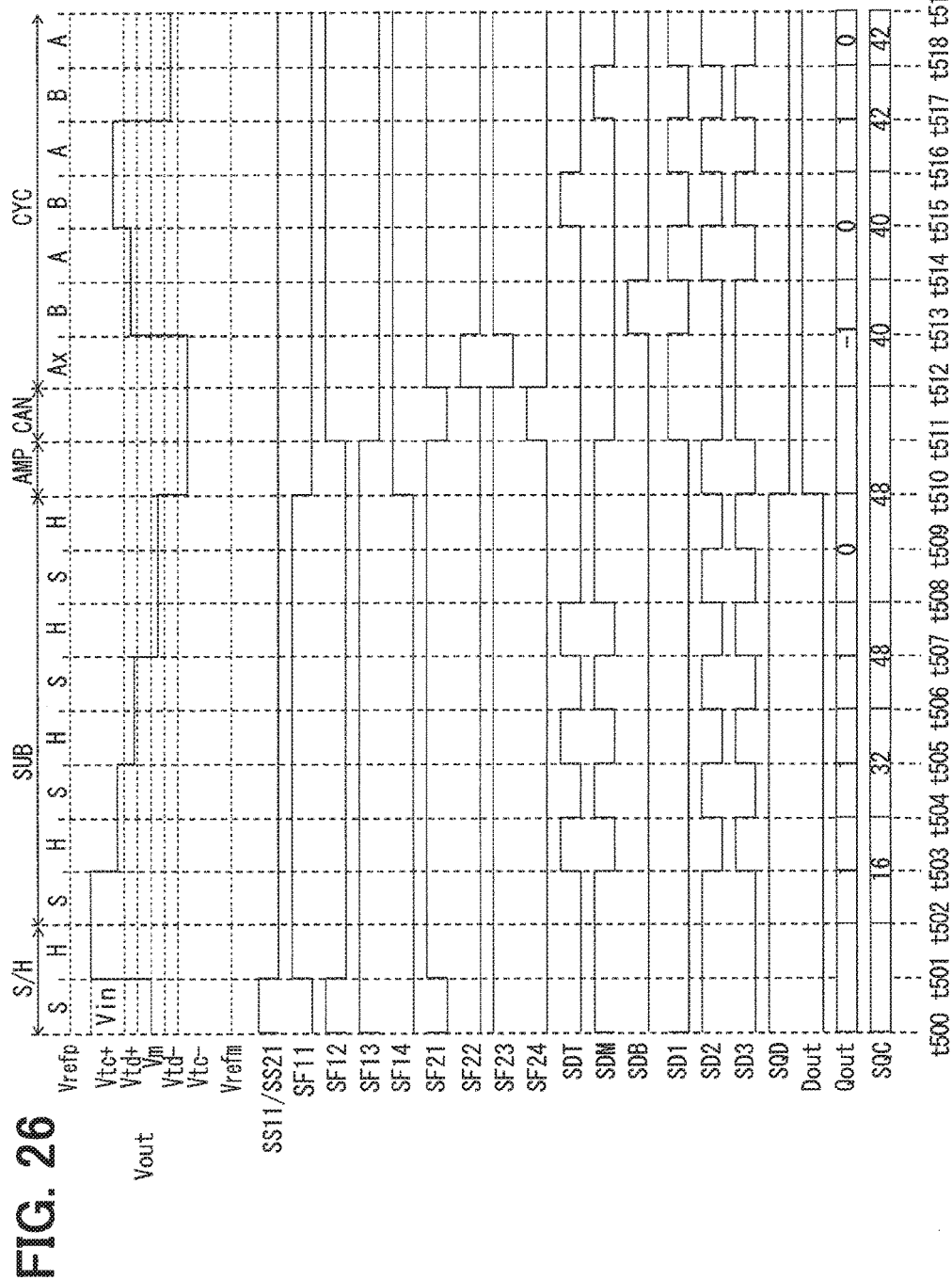
FIG. 26 is a timing chart showing an operation of the A/D converter.

As shown in FIG. 26, the A/D converter 140 performs a sample and hold operation (S/H in FIG. 26), a subtraction operation (SUB in FIG. 26), an amplification operation (Amp. in FIG. 26), an error cancellation operation (CAN in FIG. 26), and a cyclic operation (CYC in FIG. 26) in relation to the A/D conversion of the input signal Vin.

Hereinafter, each operation will be described.

<Sample and Hold Operation (S/H)>

At time t500 to time t502 shown in FIG. 26, a sample and hold operation for sampling and holding an input signal Vin is performed. In the sample and hold operation, since the switch SF23 is turned on and the switches SF22 and SF24 are turned off, the operation of the A/D converter 140 is substantially the same as that of the A/D converter 100 in the first embodiment.

<Subtraction Operation (SUB)>

The subtraction operation is performed at time t502 to time t510. The operation of the A/D converter 140 in the subtraction operation is substantially the same as the operation of the A/D converter 100 in the first embodiment.

<Amplification Operation (AMP)>

At time t510 to time t511, the amplification operation is performed. The operation of the A/D converter 140 in the amplification operation is substantially the same as the operation of the A/D converter 100 in the first embodiment.

<Error Cancellation Operation (CAN)>

The A/D converter 140 according to the present embodiment performs an error cancellation operation at time t511 to time t512 after the amplification operation. In the present embodiment, as shown in FIG. 27, the switches SF21, SF24 and SD2 are turned off, and the switches SD1 and SD3 are turned on. Since one end of the second feedback capacitor Cf2 is connected to AGND by turning on the switch SF24, the charges accumulated in the second feedback capacitor Cf2, that is, the residual of the A/D conversion by the subtraction operation, are transferred to the D/A converter capacitor Cd. As a result, the D/A converter capacitor Cd acts as the feedback capacitor of the operational amplifier 11 in place of the second feedback capacitor Cf2, and the residual of the A/D conversion is output as Vout.

In the present embodiment, similarly to the fourth embodiment, Vout after the error cancellation operation has been executed is not affected by an error in a ratio between the capacitance value of the D/A converter capacitor Cd and the capacitance value of the second feedback capacitor Cf2. For that reason, in the present embodiment, as compared with the first embodiment, the influence of the error in the capacitance value of the capacitive element on the linearity of the A/D conversion result can be reduced.

<Cyclic Operation (CYC): Sampling Period (Ax)>

A period from time t512 to time t513 shown in FIG. 26 is the first sampling period related to the cyclic operation of the present embodiment. As shown in FIG. 28, the switch SF23 and the switch SF22 are turned on, and the second feedback switch SF21 and the switch SF24 are turned off. As a result, charges corresponding to the residual of the A/D conversion by the subtraction operation are accumulated in the second feedback capacitor Cf2. The first sampling period related to the cyclic operation in the present embodiment is substantially similar to the first sampling period related to the cyclic operation in the fourth embodiment, although there is a difference in the configuration of the switch connected to the second feedback capacitor Cf2.

<Cyclic Operation (CYC): Holding Period (B)>

A period from time t513 to time t514 after the first sampling period related to the cyclic operation is a first holding period related to the cyclic operation, and the amplification of the residual of the A/D conversion by the subtraction operation and the subtraction using the D/A converter 30 are performed. As shown in FIGS. 26 and 29, the switch SF23 is turned on and the switches SF22 and SF24 are turned off in a process of transitioning from the first sampling period to the first holding period related to the cyclic operation, so that the second feedback capacitor acts as the feedback capacitor of the operational amplifier 11.

Further, since the switch SD1 is turned off, the D/A converter capacitor Cd acting as the feedback capacitor of the operational amplifier 11 between time t511 and time t513 ends the action as the feedback capacitor. Further, in response to the quantization result Qout being −1, the switch SDB is turned on in the D/A converter 30. As a result, charges are transferred from the D/A converter capacitor Cd to the second feedback capacitor Cf2, and the amplification of the residual of the A/D conversion by the subtraction operation and the subtraction using the D/A converter 30 are performed.

In the second and subsequent holding periods related to the cyclic operation after time t515, the amplification of the residual of the A/D conversion by the cyclic operation and the subtraction using the D/A converter 30 are performed simultaneously. In the cyclic operation after time t513, since the switch SF23 is on and the switches SF22 and SF24 are off, the operation of the A/D converter 140 is substantially the same as the operation of the A/D converter 100 in the first embodiment.

<Cyclic Operation (CYC): Sampling Period (A)>

The transition from the first holding period to the second sampling period related to the cyclic operation is realized by switching a switch similar to the transition from the holding period to the sampling period related to the cyclic operation in the first embodiment. That is, the switch SD3 is turned off and the switches SD1 and SD2 are turned on. An output terminal of the operational amplifier 11 is connected to the D/A converter 30 through the switch SD1, and charges corresponding to the residual of the A/D conversion by the cyclic operation are sampled by the D/A converter capacitor Cd. The second feedback capacitor Cf2 acts as a feedback capacitor in the integrator 10.

Thereafter, the operation in the holding period related to the cyclic operation and the operation similar to the operation of the second sampling period are alternately repeated to execute the cyclic operation similar to that of the first embodiment.

The above is the specific operation of the A/D converter 140 in the present embodiment. According to the above configuration, the error cancellation operation is performed between the subtraction operation and the cyclic operation. For that reason, the influence of the error in the capacitance value of the capacitive element on the linearity of the A/D conversion result can be reduced. Further, in the A/D converter 140 according to the present embodiment, unlike the A/D converter 130 according to the fourth embodiment, the error cancellation operation can be realized without adding a switch for using the second feedback capacitor Cf2 as a D/A converter capacitor, so that the circuit scale can be reduced.

Sixth Embodiment

In the present embodiment, a configuration will be described in which a configuration in which the amplification operation described as the second embodiment is performed in multiple divided times and a configuration in which a speed of A/D conversion by the cyclic operation described as the third embodiment is doubled are combined together. In the present embodiment, a configuration in which subtraction is performed using a 5-level D/A converter in the subtraction operation will also be described.

An A/D converter 150 according to the present embodiment will be described with reference to FIG. 30 based on the A/D converter 110 (refer to the second embodiment and FIG. 9) which performs the amplification operation in multiple times and the A/D converter 120 (refer to the third embodiment and FIG. 15) that doubles the speed of the A/D conversion by the cyclic operation.

Figure 30:
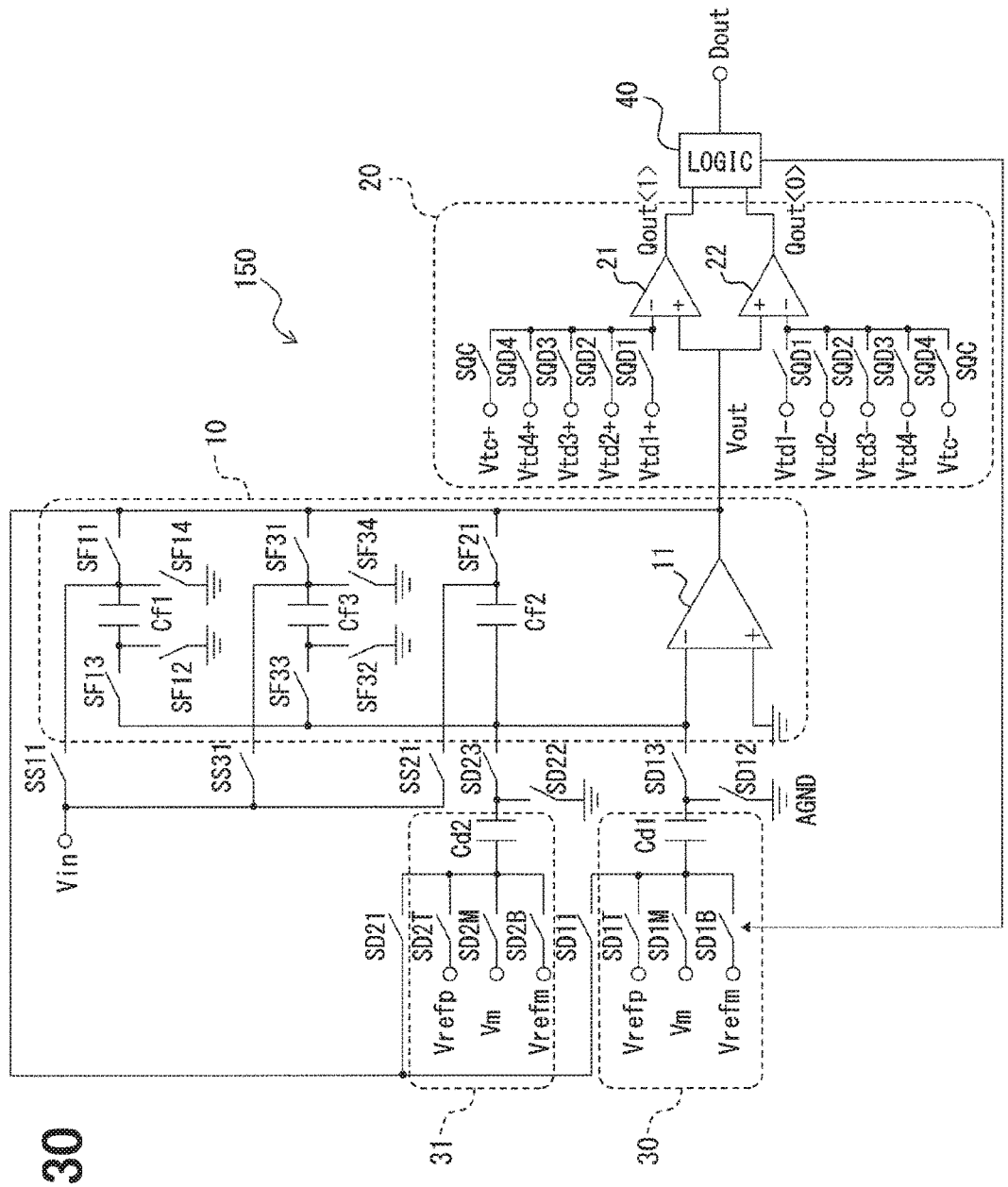
FIG. 30 is a circuit diagram showing a schematic configuration of an A/D converter according to a sixth embodiment.

As shown in FIG. 30, the A/D converter 150 according to the present embodiment includes a first feedback capacitor Cf1, a second feedback capacitor Cf2, and a third feedback capacitor Cf3 in the integrator 10 in order to execute the amplification operation twice. The circuit configuration of the integrator 10 is the same as that of the A/D converter 110 in the second embodiment. Specifically, the first feedback capacitor Cf1, the second feedback capacitor Cf2, and the third feedback capacitor Cf3 are connected in parallel with each other between an output terminal and an inverting input terminal of an operational amplifier 11. An input signal Vin is connected to the feedback capacitors Cf1 to Cf3 through respective sampling switches SS11, SS21, and SS31.

In addition, the A/D converter 150 has two D/A converters, that is, a D/A converter 30 and a D/A converter 31 in order to speed up the A/D conversion by the cyclic operation twice compared to the first embodiment. The configuration of each of the D/A converter 30 and the D/A converter 31 and a manner of connecting the D/A converter 30 and the D/A converter 31 to the integrator 10 are the same as those of the third embodiment. In other words, in the D/A converter 30, one end of the first D/A converter capacitor Cd1 is connected to the inverting input terminal of the operational amplifier 11 through a switch SD13, and the other end of the first D/A converter capacitor Cd1 is connected to the output terminal of the operational amplifier 11 through a switch SD11. Similarly, in the D/A converter 31, one end of the second D/A converter capacitor Cd2 is connected to the inverting input terminal of the operational amplifier 11 through a switch SD23, and the other end of the second D/A converter capacitor Cd2 is connected to the output terminal of the operational amplifier 11 through a switch SD21.

In the present embodiment, thresholds of the comparators 21 and 22 in the quantizer 20 can be selected in five stages, respectively, in which $Vtd1+=Vref/32$, $Vtd1-=-Vref/32$, $Vtd2+=3Vref/32$, $Vtd2-=-3Vref/32$, $Vtd3+=Vref/8$, $Vtd3-=-Vref/8$, $Vtd4+=3Vref/8$, $Vtd3-=-3Vref/8$, $Vtc+=Vref/4$, and $Vtc-=-Vref/4$. $Vtd1+$ and $Vtd1-$ are selected as the thresholds when the switch SQD1 is turned on, $Vtd2+$ and $Vtd2-$ are selected when the switch SQD2 is turned on, $Vtd3+$ and $Vtd3-$ are selected when the switch SQD3 is turned on, $Vtd4+$ and $Vtd4-$ are selected when the switch SQD4 is turned on, and $Vtc+$ and $Vtc-$ are selected when the switch SQC is turned on.

Except for the number of steps of the selectable thresholds, when the D/A converter 31 is electrically disconnected from the integrator 10 by, for example, turning off the switch SD21 and the switch SD23, the operation of the A/D converter 150 in the present embodiment is the same as the operation of the A/D converter 110 in the second embodiment. When the third feedback capacitor Cf3 is electrically disconnected from the integrator 10 by turning off the switch SF31 and the switch SF33, for example, the operation of the A/D converter 150 is the same as the operation of the A/D converter 120 according to the third embodiment.

In the A/D converter 150 according to the present embodiment, the cycle of switching between the sampling period and the holding period can be set to half in the subtraction operation as compared with the cyclic operation.

Next, the specific operation of the A/D converter 150 will be described with reference to timing charts shown in FIGS. 31 and 32 and connection diagrams shown in FIGS. 33 to 43.

Figure 31:
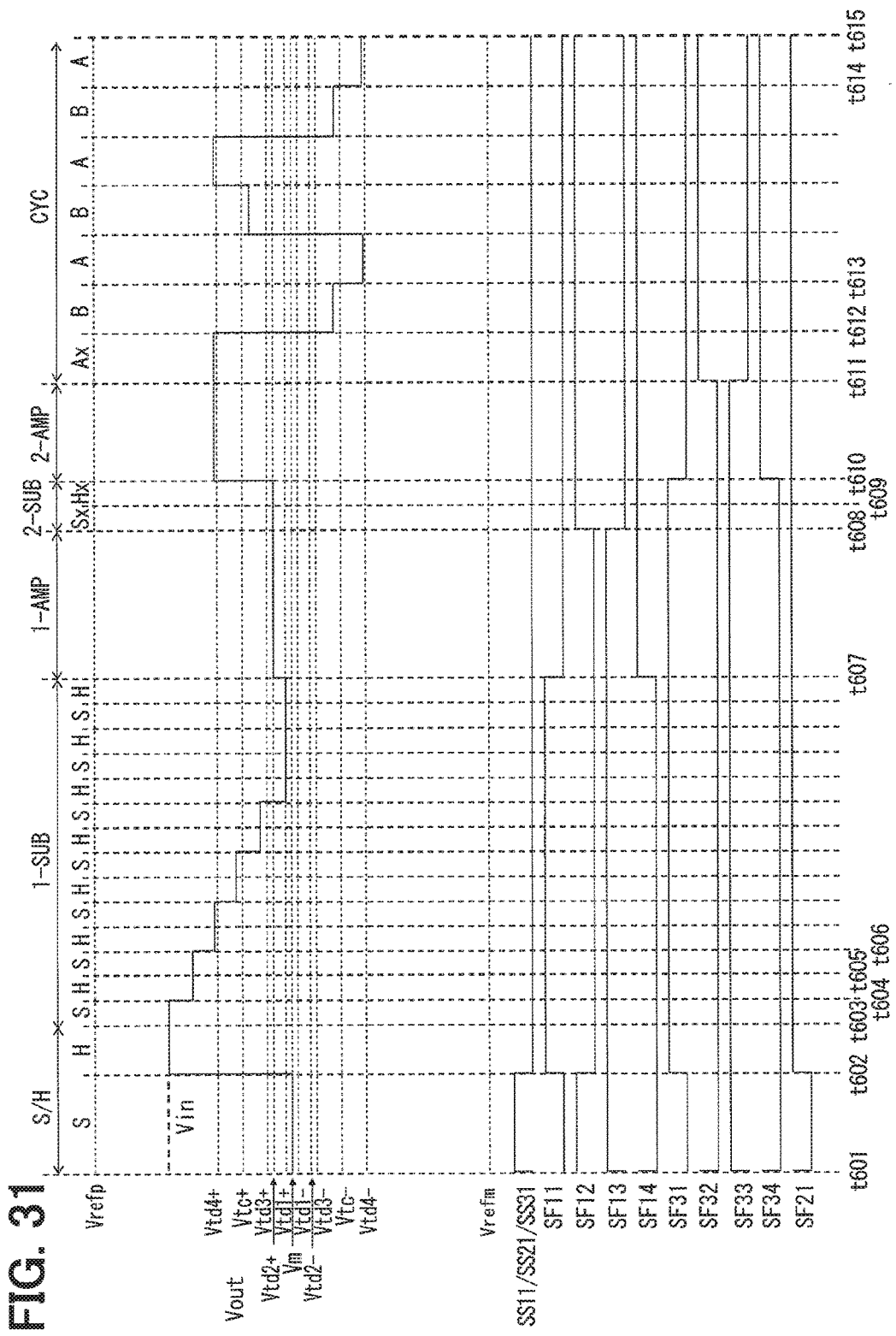
FIG. 31 is a timing chart showing an operation of the A/D converter.
Figure 32:
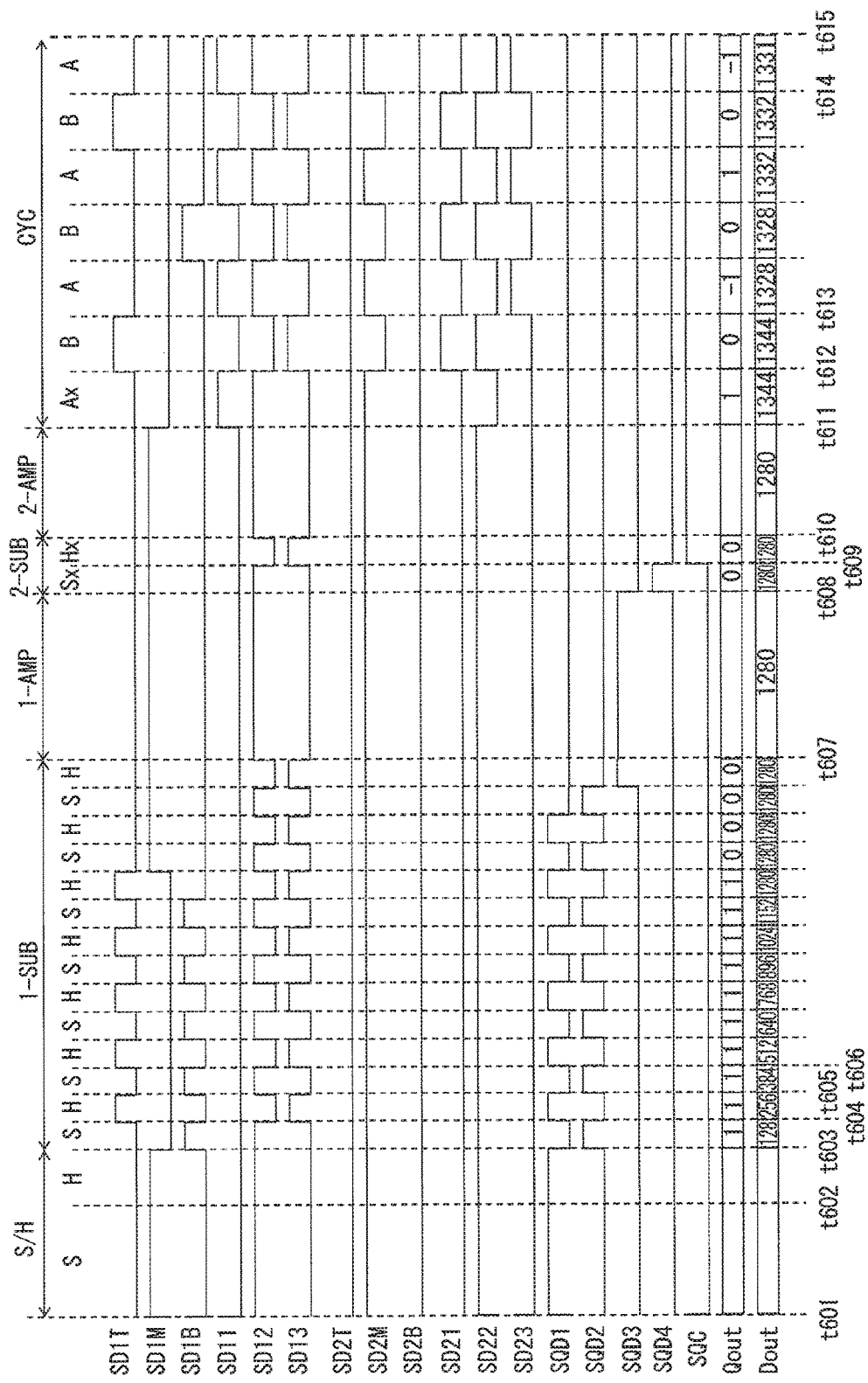
FIG. 32 is a timing chart showing an operation of the A/D converter.

As shown in FIGS. 31 and 32, the A/D converter 150 performs a sample and hold operation (described as S/H in FIGS. 31 and 32), a first subtraction operation (described as 1-SUB in FIGS. 31 and 32), a first amplification operation (described as 1-AMP in FIGS. 31 and 32), a second subtraction operation (described as 2-SUB in FIGS. 31 and 32), a second amplification operation (described as 2-AMP in FIGS. 31 and 32), and a cyclic operation (described as CYC in FIGS. 31 and 32) in relation to the A/D conversion of the input signal Vin. In the timing charts shown in FIGS. 31 and 32, the time axes are common, and the operation of each unit of the A/D converter 150 is described by division into two drawings. FIG. 31 particularly shows operating states of the switches related to the integrator 10, and FIG. 32 particularly shows operation states of the switches related to the D/A converter 30, 31, and the quantizer 20.

Hereinafter, each operation will be described.

<Sample and Hold Operation (S/H): Sampling Period (S)>

Figure 33:
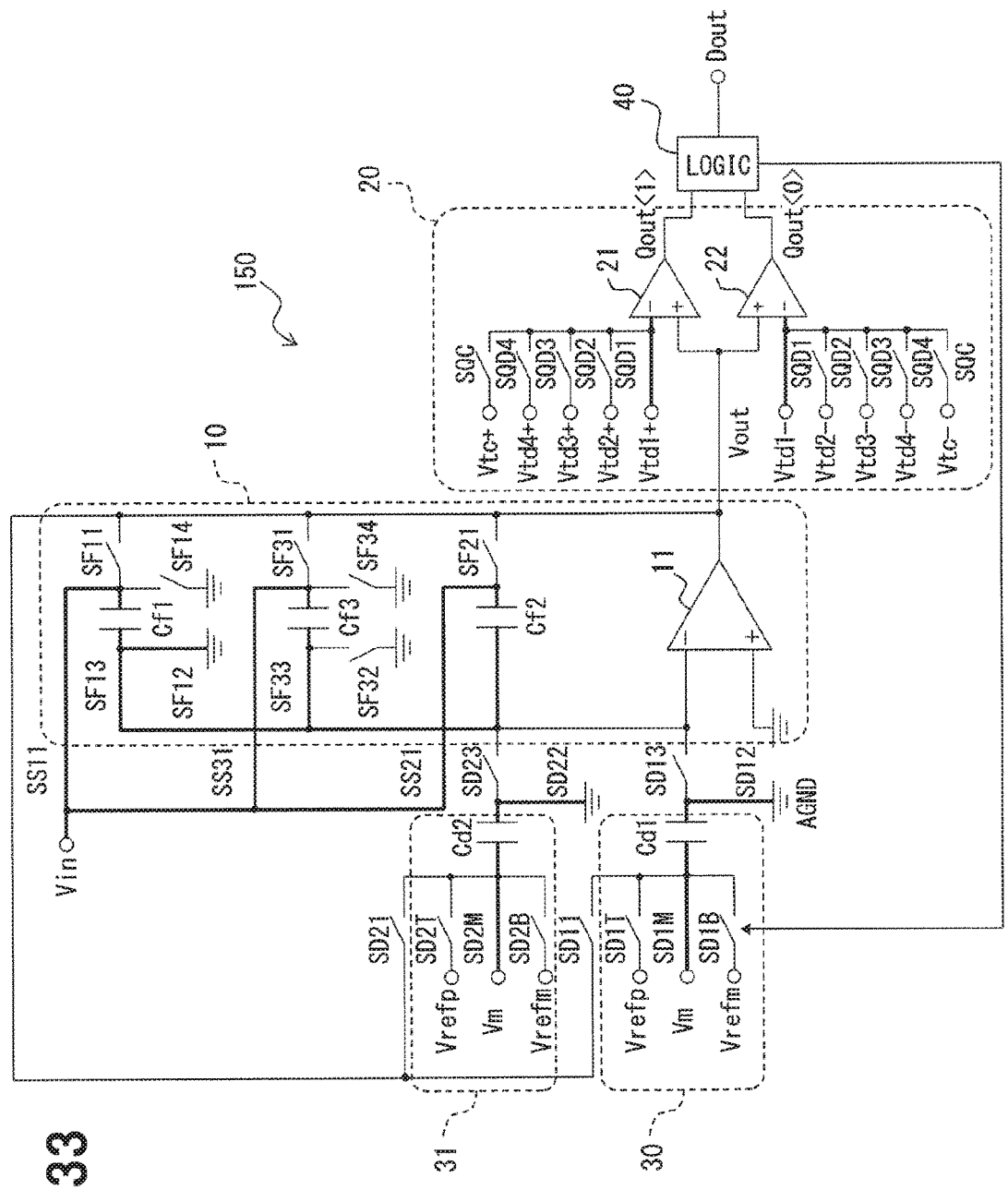
FIG. 33 is a connection diagram showing an operation of a sampling period related to a sample and hold operation.

A period from time t601 to time t602 shown in FIGS. 31 and 32 is a sampling period for sampling the input signal Vin. As shown in FIG. 33, when the feedback switches SF11, SF21, and SF31 are turned off and the switches SS11, SS21, and SS31 are turned on, charges corresponding to the input signal Vin are sampled in each of the first feedback capacitor Cf1, the second feedback capacitor Cf2, and the third feedback capacitor Cf3.

As shown in FIG. 33, since the D/A converter 31 is electrically disconnected from the integrator 10 by turning off the switch SD21 and the switch SD23, the operation in the sampling period of the present embodiment is substantially the same as the operation in the sampling period of the second embodiment.

<Sample and Hold Operation (S/H): Holding Period (H)>

Figure 34:
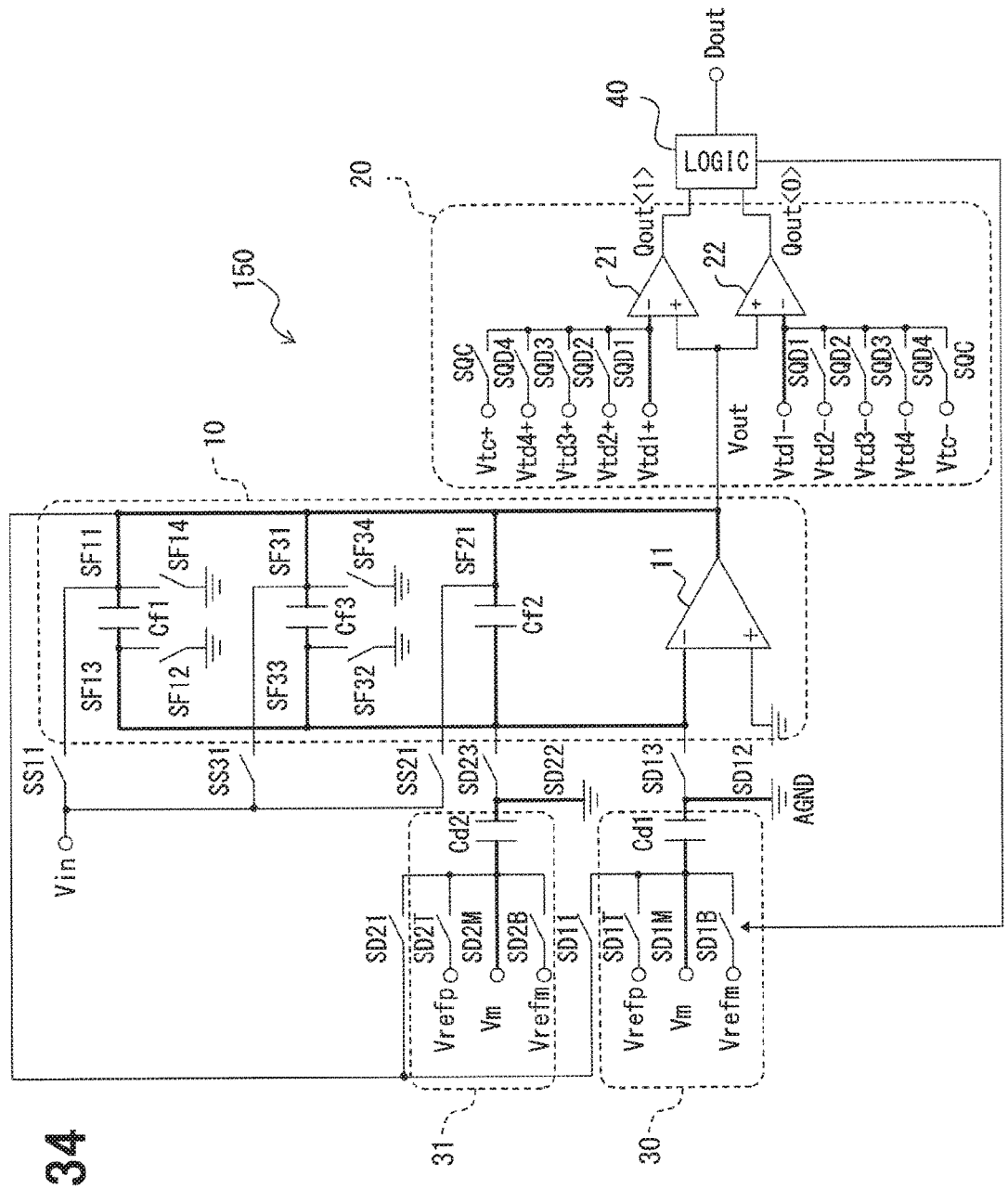
FIG. 34 is a connection diagram showing an operation of a holding period related to the sample and hold operation.

A period from time t602 to time t603 shown in FIGS. 31 and 32 is a holding period related to the sample and hold operation. As shown in FIG. 34, the switches SS11, SS21, SS31, and SF12 are turned off and the feedback switches SF11, SF21, and SF31 are turned on. As a result, charges corresponding to the input signal Vin are held in the first feedback capacitor Cf1, the second feedback capacitor Cf2, and the third feedback capacitor Cf3.

In the sample and hold operation, as shown in FIG. 32, the switch SQD1 is on, and the thresholds of the comparators 21 and 22 are Vtd1+ and Vtd1−, respectively.

<First Subtraction Operation (1-SUB): Sampling Period (S)>

The first subtraction operation is executed at time t603 to time t607 shown in FIGS. 31 and 32.

Figure 35:
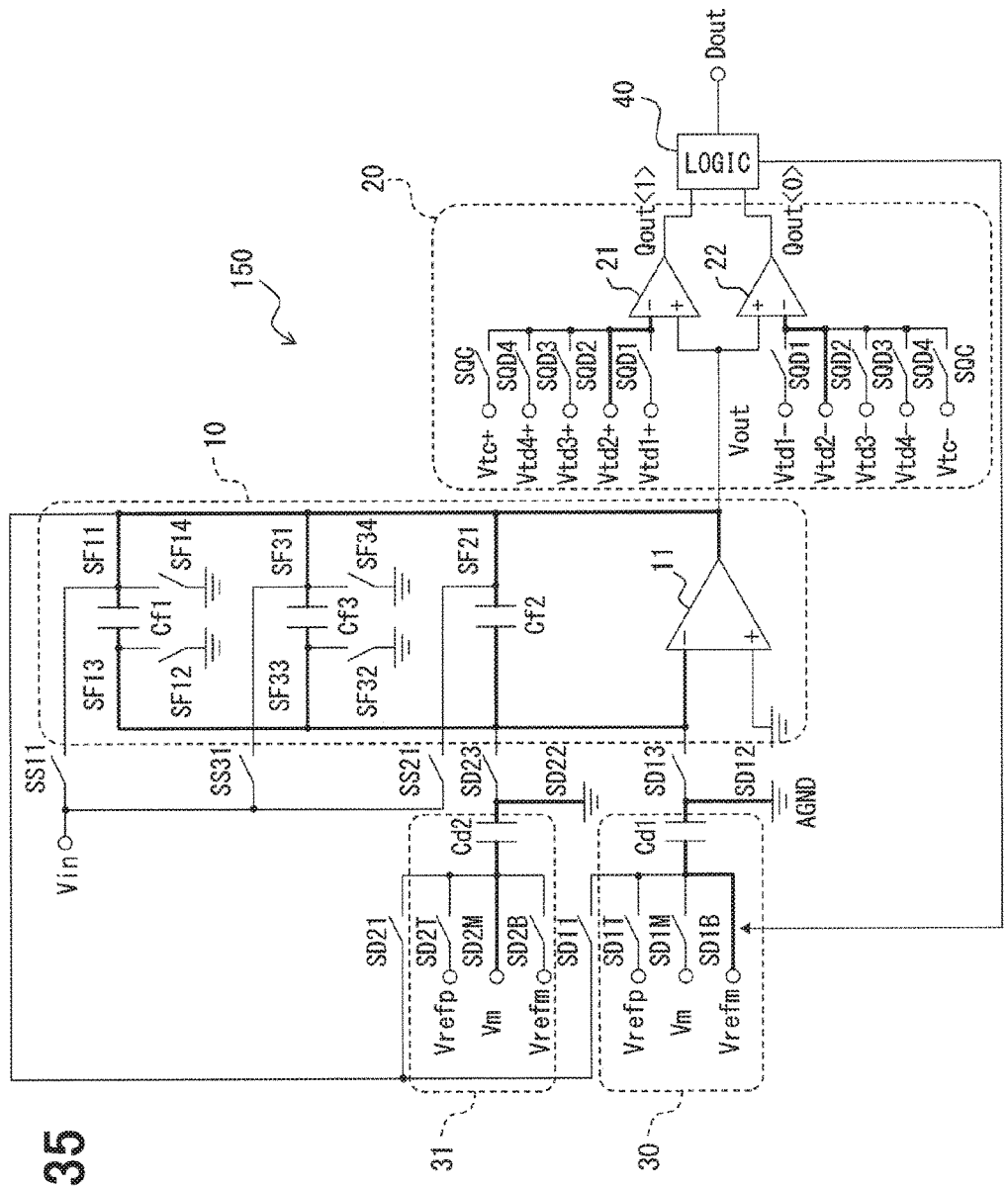
FIG. 35 is a connection diagram showing an operation of a sampling period according to a first subtraction operation.

In the first subtraction operation according to the present embodiment, the quantization result is determined based on a relationship between Vout in the immediately preceding period and the thresholds of the comparators 21 and 22. In other words, in the sampling period related to the first subtraction operation at time t603 to time t604, the quantization result is set to Qout=1 based on the relationship between Vout at time t602 to time t603 and the thresholds. Similarly, in the sampling period related to the second first subtraction operation at time t605 to time t606, the quantization result Qout=1 is obtained from the relationship between Vout at time t604 to time t605 and the thresholds. The same is applied to the sampling period and the holding period related to the subsequent first subtraction operation. Since Qout is 1 at time t603 to time t604, the switch SD1B is turned on as shown in FIG. 35. Since the switch SD13 is off and the switch SD12 is on, charges corresponding to the D/A converter voltage of the D/A converter 30 are accumulated in the first D/A converter capacitor Cd1.

In the sampling period related to the first subtraction operation, as shown in FIG. 32, the switch SQD2 is on, and the thresholds of the comparators 21 and 22 are Vtd2+ and Vtd2−, respectively.

<First Subtraction Operation (1-SUB): Holding Period (H)>

Also in the holding period related to the first subtraction operation according to the present embodiment, the quantization result is determined based on the relationship between Vout in the immediately preceding period, that is, the sampling period related to the first subtraction operation and the thresholds. For example, in the first sampling period related to the first subtraction operation at time t604 to time t605, the quantization result is determined as Qout=1 based on the relationship between Vout at time t603 to time t604 and the thresholds. The same is applied to the holding period related to the subsequent first subtraction operation.

Figure 36:
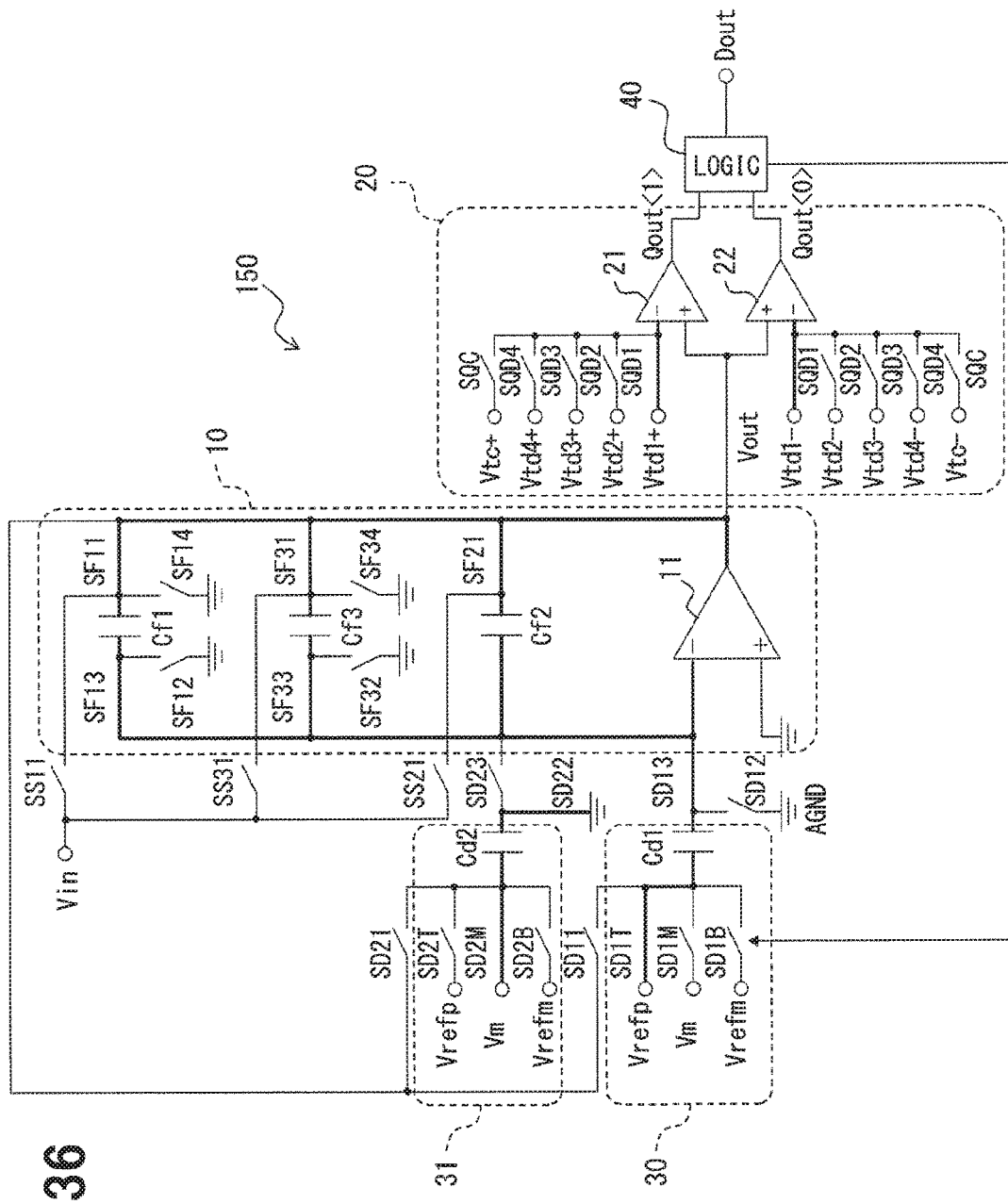
FIG. 36 is a connection diagram showing an operation of a holding period related to the first subtraction operation.

Since Qout is 1 at time t604 to time t605, the switch SD1B is turned off and the switch SD1T is turned on as shown in FIG. 36. Further, when the switch SD12 is turned off and the switch SD13 is turned on, charges corresponding to Vrefm−Vrefp is transferred to the feedback capacitors Cf1 to Cf3. Vrefm−Vrefp is a result of subtracting the D/A converter voltage of the D/A converter 30 in the holding period related to the first subtraction operation at time t604 to time t605 from the D/A converter voltage of the D/A converter 30 in the sampling period related to the first subtraction operation at time t603 to time t604. In the first subtraction operation of the present embodiment, since the D/A converter voltage is selected in each of the sampling period and the holding period from time t603 to time t605 in the D/A converter 30, the D/A converter 30 functions as a 5-level D/A converter, and the resolution can be increased as compared with a mode using a 3-level D/A converter that selects the D/A converter voltage only in the holding period or the sampling period.

In the holding period related to the first subtraction operation, the switch SQD1 is on, and the thresholds of the comparators 21 and 22 are Vtd1+ and Vtd1−, respectively.

In the subtraction operation according to the present embodiment, since quantization is performed in each of the sampling period and the holding period, the number of gradations of A/D conversion obtained per cycle of the subtraction operation can be substantially doubled as compared with the first to fifth embodiments. For that reason, the number of cycles of the subtraction operation required to obtain the same number of gradations can be reduced to ½, or the number of gradations of the A/D conversion obtained in the same number of cycles can be doubled. In addition, in the subtraction operation, since the influence of noise generated by the execution of the subtraction every time the subtraction is executed is accumulated in the integrator 10, the influence of the noise on the A/D conversion result can be reduced with a reduction in the number of cycles of the subtraction operation.

In addition, in the first to fifth embodiments, since the D/A converter voltage in the sampling period related to the subtraction operation is Vm at all times regardless of the quantization result, a difference between the D/A converter voltage in the sampling period related to the subtraction operation and the D/A converter voltage in the holding period is Vrefp−Vm (=Vm−Vrefm) at most. In the present embodiment, the difference between the D/A converter voltages in the sampling period and the holding period related to the first subtraction operation is Vrefp−Vrefm at most, and a maximum value of the difference between the D/A converter voltages in the sampling period and the holding period related to the subtraction operation can be doubled as compared with the first to fifth embodiments. That is, as compared with the first to fifth embodiments, the maximum value of the charges that can be subtracted can be made equal by using the D/A converter capacitor Cd1 having a half capacitance value. Since the influence of the noise generated in the subtraction operation can be reduced by reducing the capacitance value of the D/A converter capacitor Cd1, the influence of the noise on the A/D conversion result can be reduced.

<First Amplifier Operation (1-AMP)>

Figure 37:
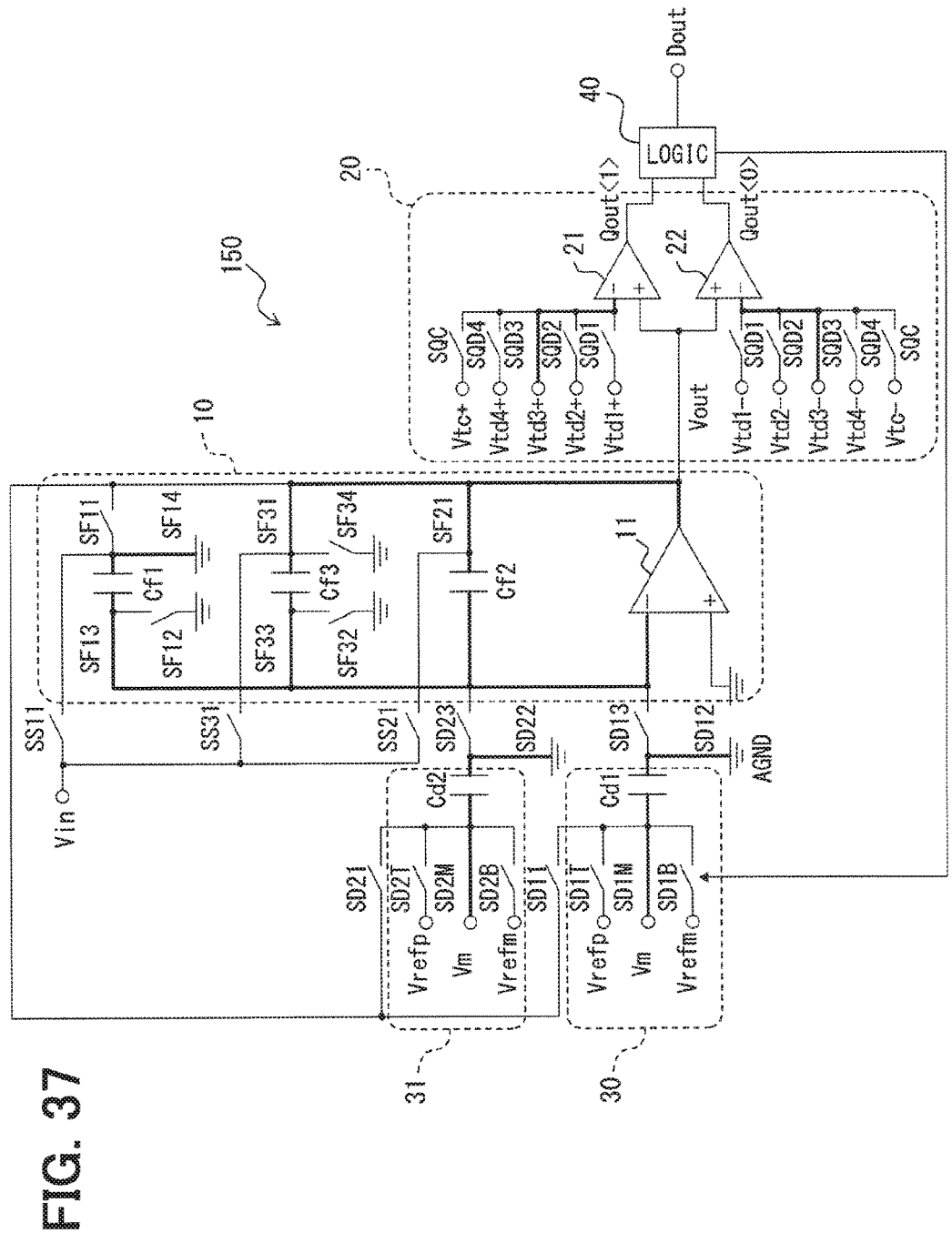
FIG. 37 is a connection diagram showing a first amplification operation.

After the first subtraction operation has been performed, a first amplification operation for amplifying a residual of the A/D conversion by the first subtraction operation is performed at time t607 to time t608 shown in FIGS. 31 and 32. In the first amplification operation, as shown in FIG. 37, when the switch SD13 is turned off, the integrator 10 and the D/A converter 30 are electrically disconnected from each other. The D/A converter capacitor Cd is reset by turning on the switches SD12 and SD1M.

In the integrator 10, the first feedback switch SF11 is turned off while the switch SF14 is turned on. As a result, the charges accumulated in the first feedback capacitor Cf1 are transferred to the second feedback capacitor Cf2 and the third feedback capacitor Cf3, and the output voltage Vout of the operational amplifier 11 is amplified.

In the quantizer 20, the thresholds of the comparators 21 and 22 become Vtd3+ and Vtd3−, respectively, when the switch SQD3 is turned on.

<2nd Subtraction Operation (2-SUB): Sampling Period (Sx)>

Figure 38:
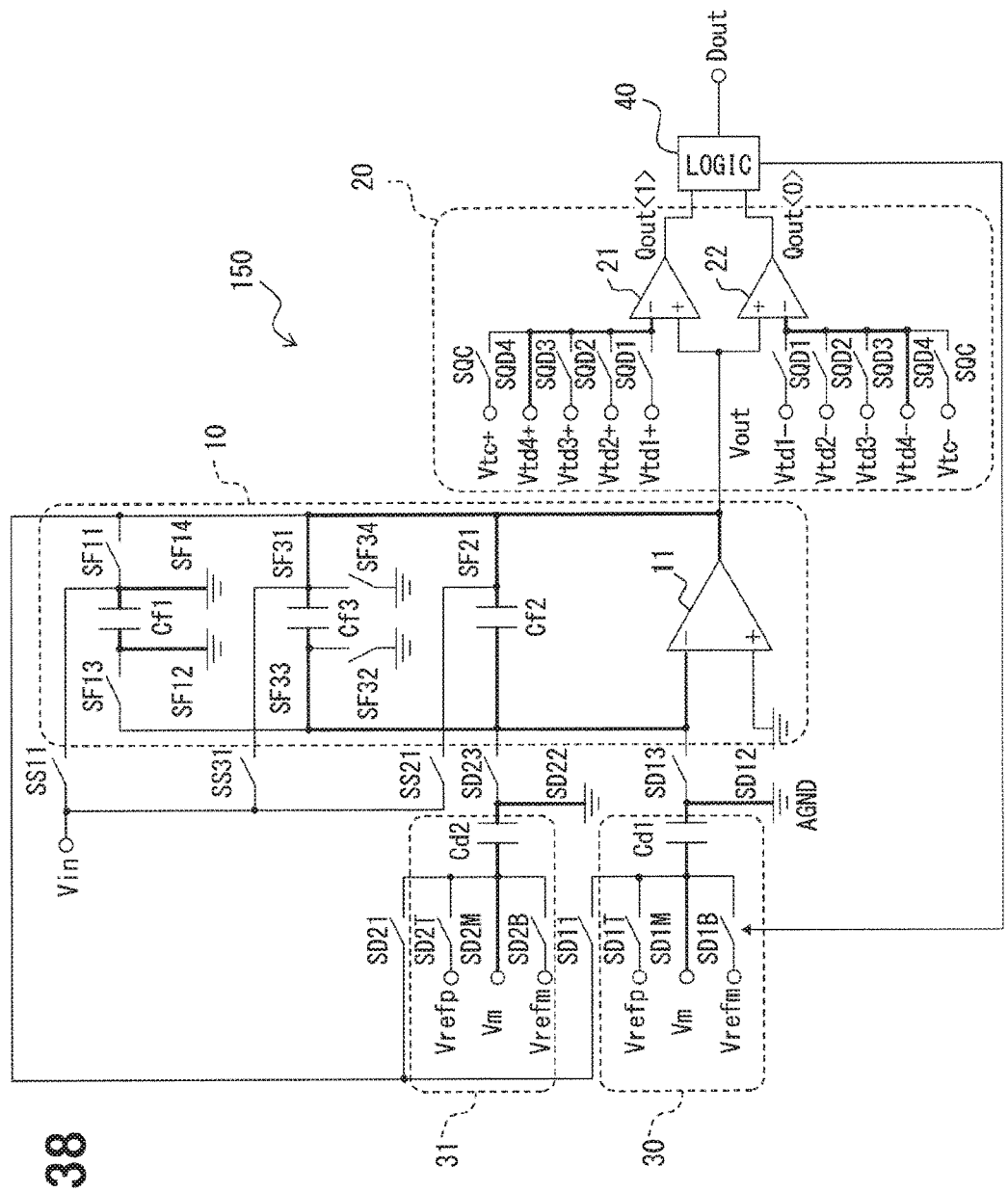
FIG. 38 is a connection diagram showing an operation of a sampling period according to a second subtraction operation.

A period from time t608 to time t609 after the first amplification operation is a sampling period related to the second subtraction operation. Since the transfer of the charges from the first feedback capacitor Cf1 is completed at the time when the first amplification operation is completed, the switching SF13 is turned off as shown in FIG. 38, and the inverting input terminal of the operational amplifier 11 and the first feedback capacitor Cf1 are electrically disconnected from each other. Further, by turning on the switch SF12 and connecting both ends of the first feedback capacitor Cf1 to AGND, the first feedback capacitor Cf1 is reset. The second subtraction operation is the same as the first subtraction operation except that the first feedback capacitor Cf1 is disconnected from the operational amplifier 11 and the thresholds of the comparators 21 and 22 are different from each other.

In the second subtraction operation, similarly to the first subtraction operation, the quantization result Qout is determined according to the relationship between the output voltages Vout of the operational amplifiers 11 and the thresholds of the comparators 21 and 22 in the immediately preceding period. In the first amplification operation at time t607 to time t608, since Vtd3−<Vout<Vtd3+, the quantization result becomes Qout=0, and the switch SD1M is turned on in the D/A converter 30 as shown in FIG. 38. When the switch SD12 is turned on and the switch SD13 is turned off, charges corresponding to the D/A converter voltage of the D/A converter 30 are accumulated in the first D/A converter capacitor Cd1. The state of the D/A converter 30 in the case of FIG. 38 does not substantially change from the state of the D/A converter 30 of the first amplification operation shown in FIG. 37 because the quantization result in the first amplification operation is Qout=0, and if Qout is 1, the switch SD1B is turned on, and if Qout is −1, the switch SD1T is turned on. The operation of the D/A converter 30 in the second subtraction operation is the same as the operation of the D/A converter 30 in the first subtraction operation.

<Second Subtraction Operation (2-SUB): Holding Period (Hx)>

Figure 39:
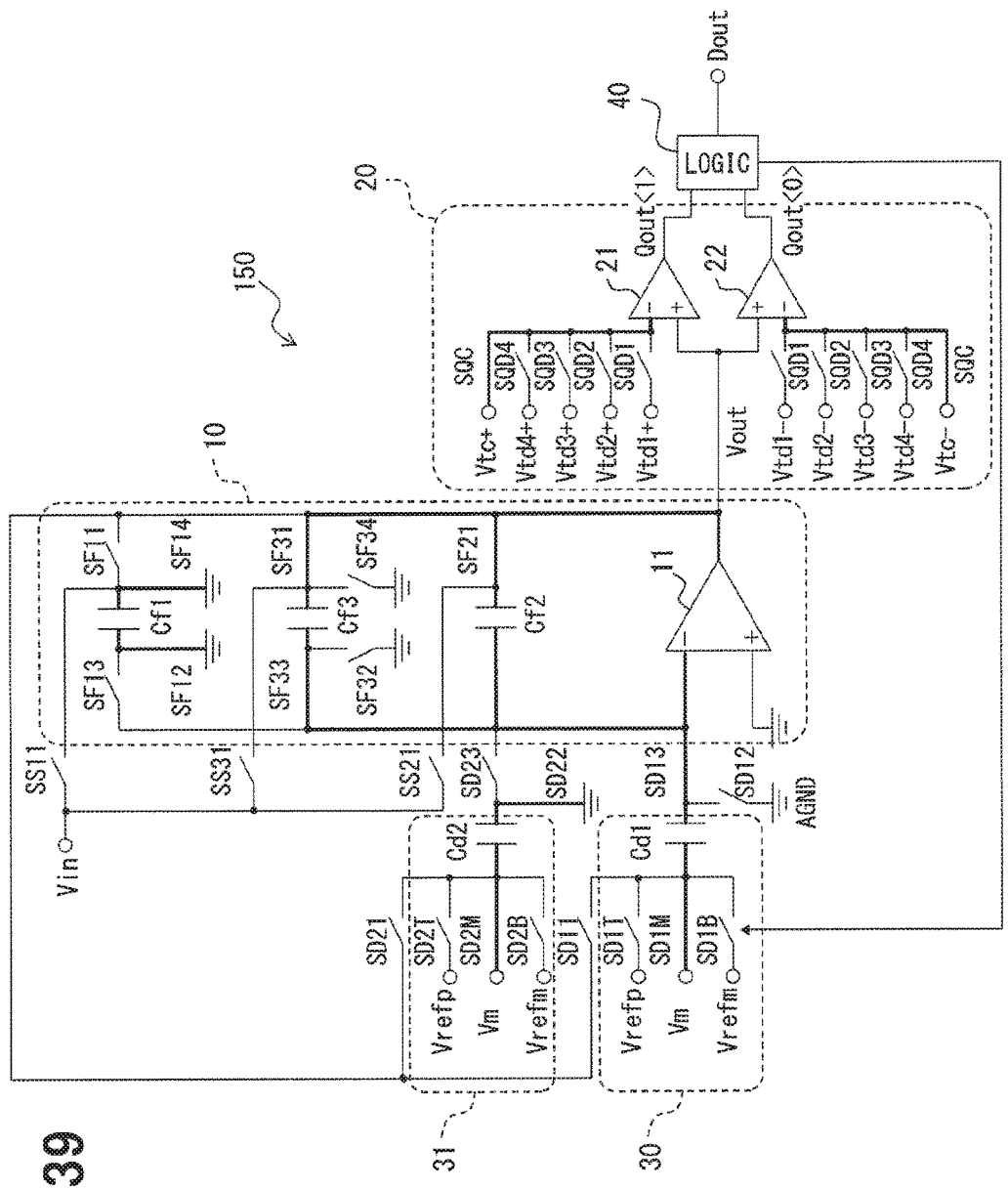
FIG. 39 is a connection diagram showing an operation of a holding period according to the second subtraction operation.

A period from time t609 to time t610 shown in FIG. 31 and FIG. 32 is a holding period related to the second subtraction operation. In the holding period related to the second subtraction operation, as shown in FIG. 39, when the switch SD12 is turned off and the switch SD13 is turned on, the subtraction using the D/A converter 30 is performed from the charges accumulated in the feedback capacitors Cf2 and Cf3.

In the second subtraction operation, when the switch SQD4 is turned off and the switch SQC is turned on, the thresholds of the comparators 21 and 22 are changed from Vtd4+ and Vtd4− to Vtc+ and Vtc−, respectively. Thereafter, during the second amplification operation and the cyclic operation, which will be described later, the switch SQC is maintained in the ON state, and Vtc+ and Vtc− are maintained in the selected state as the threshold values.

<2nd Amplifier Operation (2-AMP)>

Figure 40:
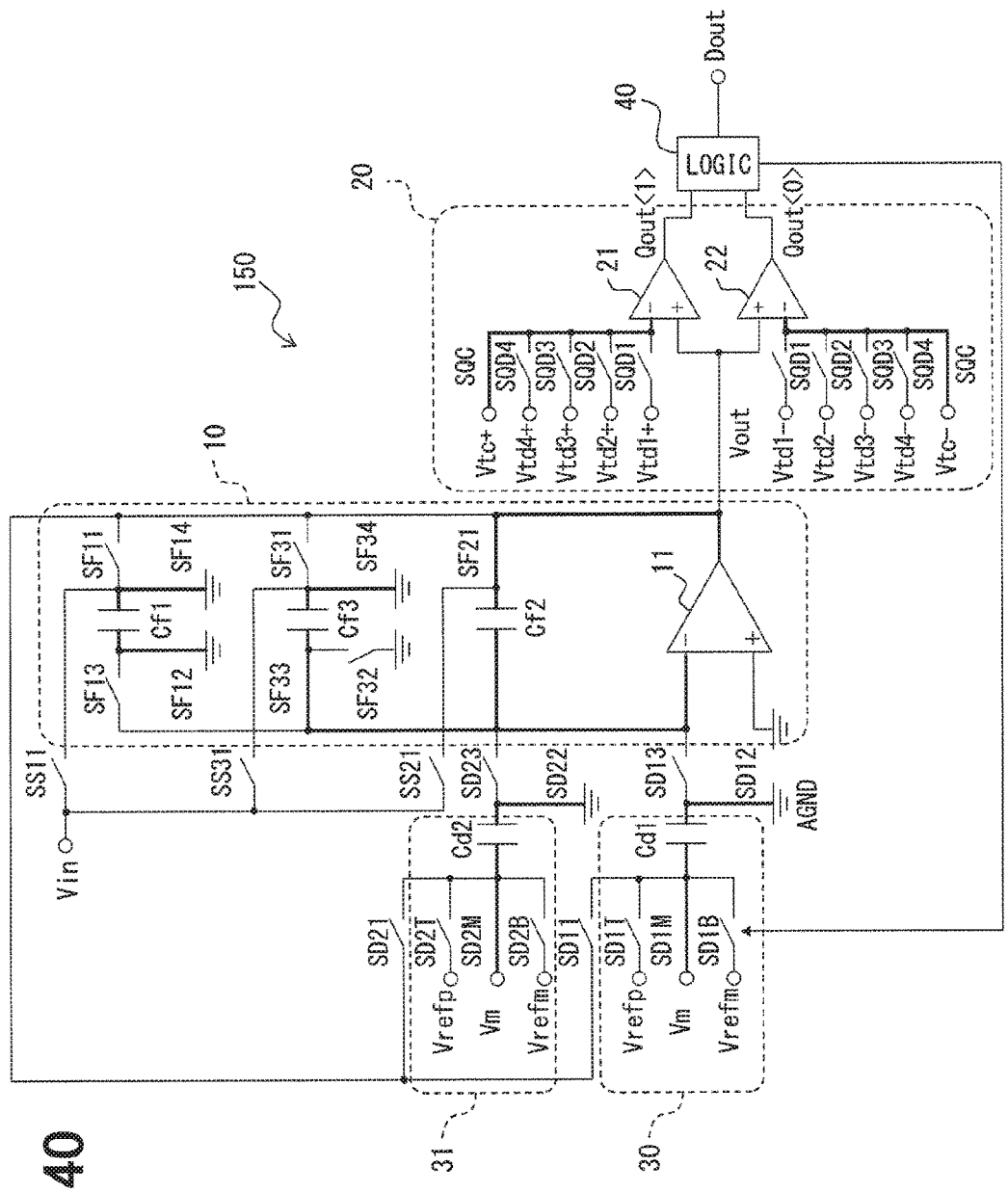
FIG. 40 is a connection diagram showing a second amplification operation.

At time t610 to time t611, the second amplification operation for amplifying the residual of the A/D conversion by the first subtraction operation and the second subtraction operation is performed. As shown in FIG. 40, in the integrator 10, the switch SF31 is turned off and the switch SF34 is turned on. As a result, the charges accumulated in the second feedback capacitor Cf2 are transferred to the third feedback capacitor Cf3, and the output voltage Vout is amplified. When the switch SD13 is turned off, the D/A converter 30 is electrically disconnected from the integrator 10.

<Cyclic Operation (CYC)>

Figure 41:
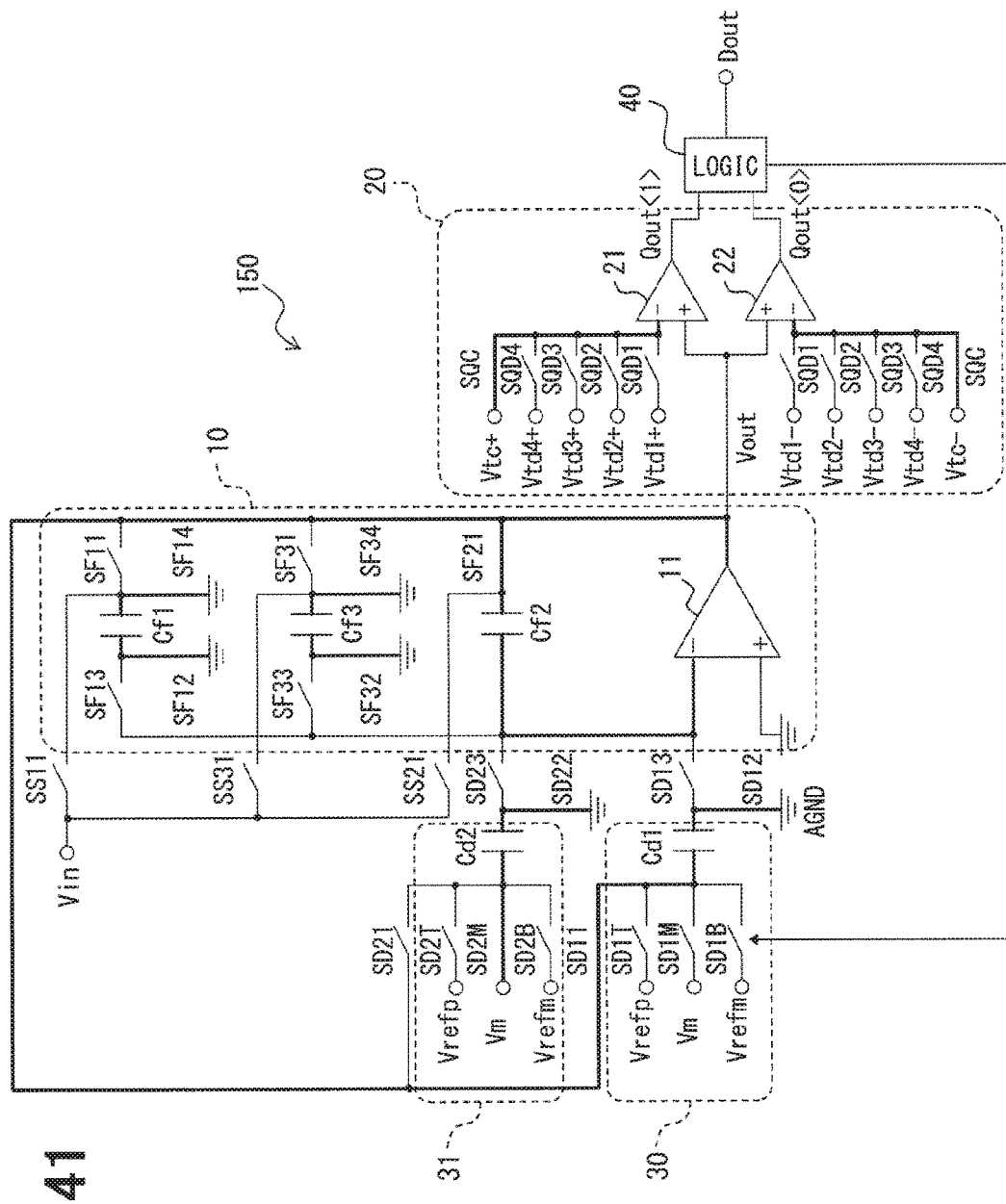
FIG. 41 is a connection diagram showing an operation of a sampling period related to a cyclic operation.
Figure 42:
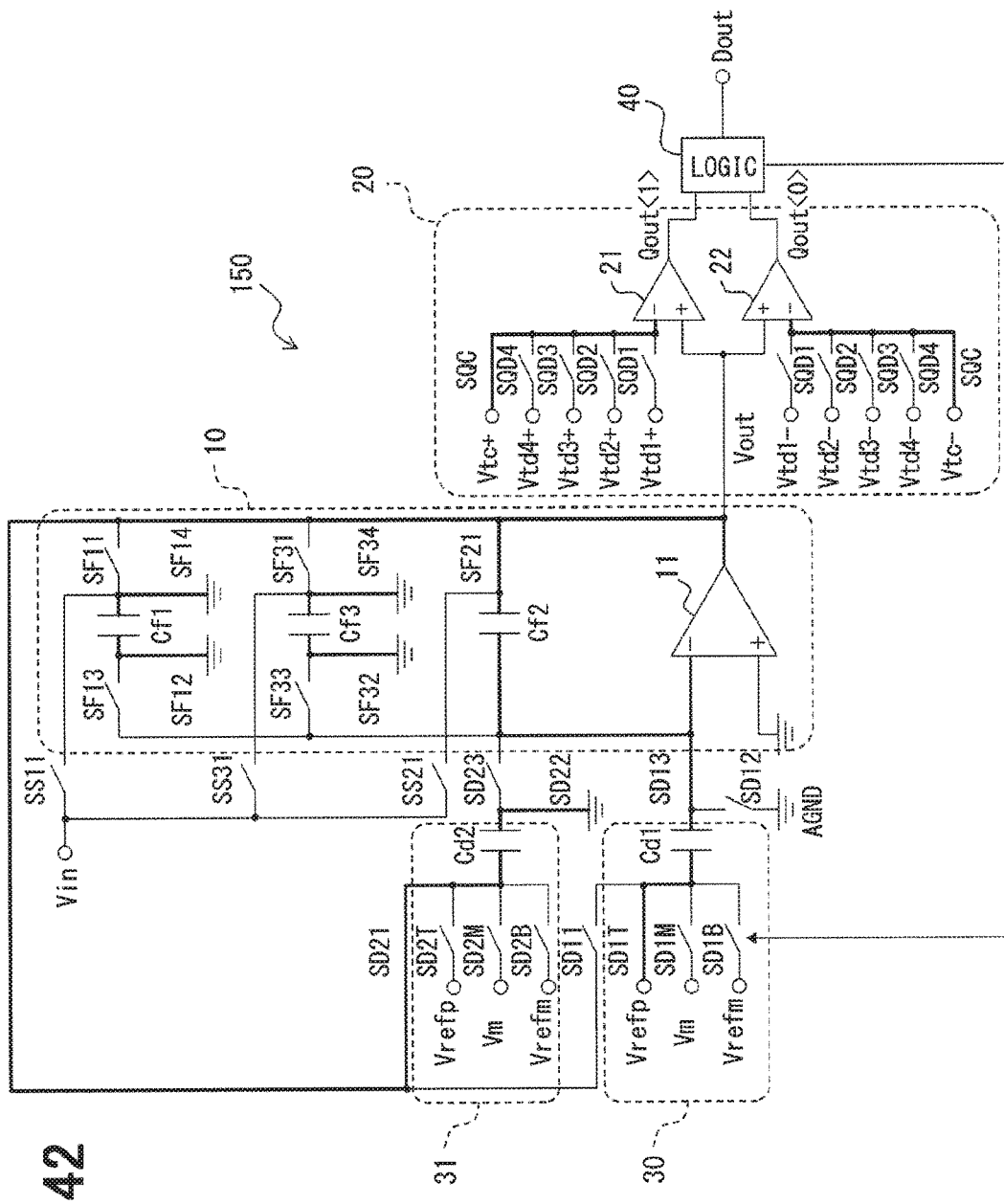
FIG. 42 is a connection diagram showing an operation of a holding period related to the cyclic operation.
Figure 43:
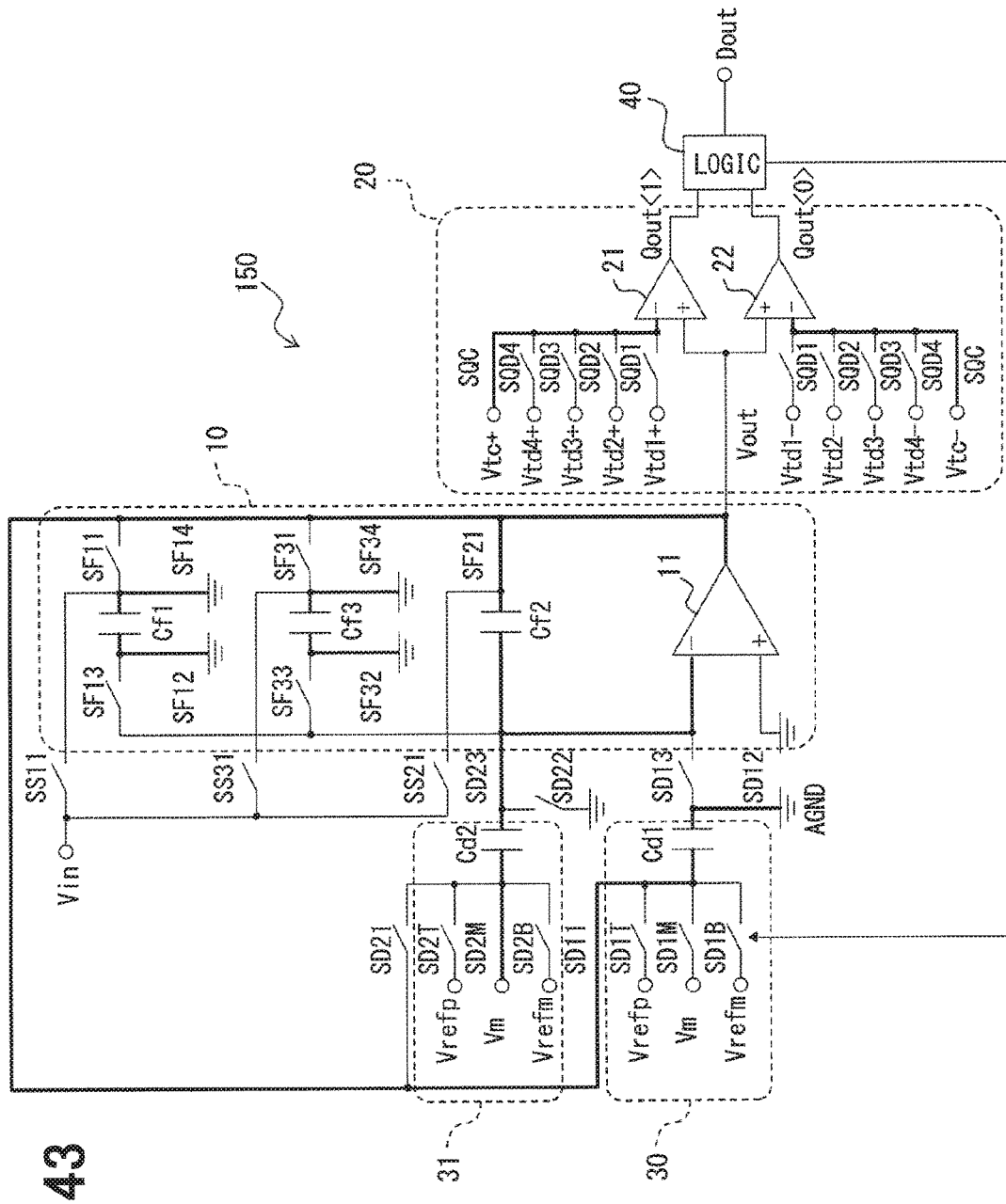
FIG. 43 is a connection diagram showing an operation in another sampling period related to the cyclic operation.

As shown in FIG. 41 to FIG. 43, the cyclic operation after time t611 is the same as the cyclic operation in the third embodiment, and a detailed description of the operation will be omitted.

The specific operation of the A/D converter 150 according to the present embodiment has been described above. According to the above configuration, since the D/A converter 30 operates as a 5-level D/A converter in the first subtraction operation and the second subtraction operation, the number of gradations obtained per cycle in the A/D conversion by the first subtraction operation and the second subtraction operation can be substantially doubled as compared with the subtraction operation in the first and third to fifth embodiments and the first subtraction operation and the second subtraction operation in the second embodiment. For that reason, the number of cycles required for the A/D conversion by the subtraction operation can be reduced to ½, or the resolution of the A/D conversion by the subtraction operation can be doubled if the number of cycles is the same.

Further, in the first subtraction operation and the second subtraction operation according to the present embodiment, since the feedback factor of the operational amplifier 11 is larger than that of the cyclic operation, the cycle of the sampling period and the holding period of the first subtraction operation and the second subtraction operation is shortened to ½ of the cycle of the sampling period and the holding period related to the cyclic operation. As a result, a time required for executing the first subtraction operation and the second subtraction operation can be shortened to ½, so that a time required for A/D conversion by the A/D converter 150 can be shortened. In the present embodiment, the cycle in which the first amplification operation operates is longer than the cycle in which the first and second subtraction operations operate and the cycle in which the cyclic operation operates. In addition, the cycle in which the first and second subtraction operations operate is shorter than the cycle in which the cyclic operation operates.

Further, since the A/D converter 150 according to the present embodiment executes the second subtraction operation, that is, the last subtraction operation after the first amplification operation as in the second embodiment, the influence of the offset of the comparators 21 and 22 can be reduced as compared with the embodiment in which the amplification operation is executed only once. Further, in the mode in which the amplification operation is performed in multiple times, a required performance for amplifying the operational amplifier 11 can be relaxed as compared with the mode in which the amplification operation is performed in one operation.

Further, since the A/D converter 150 according to the present embodiment uses two D/A converters alternately switched in the cyclic operation as in the third embodiment, it is possible to perform the A/D conversion by the cyclic operation at twice the speed as compared with other embodiments in which a single D/A converter is used in the cyclic operation.

In the present embodiment, the D/A converter 30 is controlled in the sampling period based on the result of the quantization performed by turning on the switch SQD1, and the D/A converter 30 is controlled in the holding period based on the result of the quantization performed by turning on the switch SQD2. Alternatively, the D/A converter 30 may be controlled by reversing the period in which the switch SQD1 is turned on and the period in which the switch SQD2 is turned on to realize the 5-level D/A conversion. Similarly, the periods in which the switch SQD3 and the switch SQD4 are turned on may be reversed. In addition, with the configuration of the quantizer 20 with four comparators, the D/A converter 30 may be controlled in the sampling period and the holding period based on the result of one quantization, thereby realizing the 5-level D/A conversion.

Other Embodiments

The disclosure in this specification, the drawings, and the like is not limited to the illustrated embodiments. The disclosure encompasses the illustrated embodiments and variations thereof by those skilled in the art. For example, the disclosure is not limited to the combinations of components and/or elements shown in the embodiments. The disclosure may be implemented in various combinations. The disclosure may have additional portions that may be added to the embodiments. The disclosure encompasses omission of components and/or elements of the embodiments. The disclosure encompasses the replacement or combination of components and/or elements between one embodiment and another. The disclosed technical scope is not limited to the description of the embodiments. The several technical ranges disclosed are indicated by the description of the claims, and should be construed to include all modifications within the meaning and range equivalent to the description of the claims.

In each of the embodiments described above, the configuration has been described in which the input signal Vin is sampled with the use of both the first feedback capacitor Cf1 and the second feedback capacitor Cf2, or all the feedback capacitors including the third feedback capacitor Cf3. Alternatively, the input signal Vin may be sampled with the use of only a part of the multiple feedback capacitors. For example, a configuration in which sampling is performed with the use of only one feedback capacitor in a configuration having two feedback capacitors will be described below.

Figure 44:
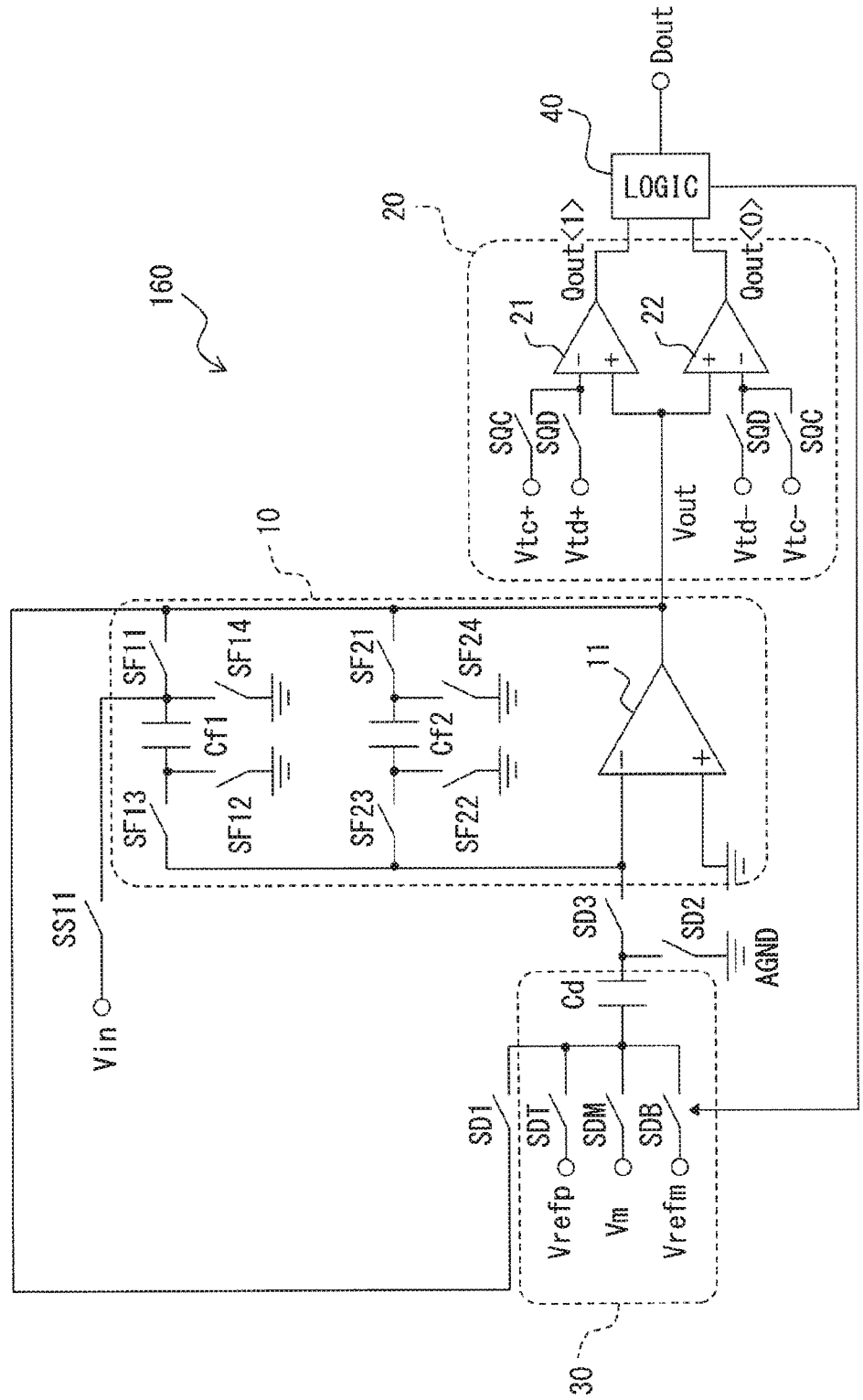
FIG. 44 is a circuit diagram showing a schematic configuration of an A/D converter according to another embodiment.

An A/D converter 160 shown in FIG. 44 does not include the switch SS21 for inputting the input signal Vin to an intermediate point between the second feedback switch SF21 and the second feedback capacitor Cf2 of the A/D converter 100, as compared with the A/D converter 100 in the first embodiment. In addition, the A/D converter 160 includes switches SF22, SF23, and SF24 which are not provided in the A/D converter 100 of the first embodiment. The switches SF22, SF23, and SF24 are connected to the feedback capacitor Cf2, and when the switch SF23 is on and the switches SF22 and SF24 are off, the A/D converter 160 has substantially the same circuit configuration as the circuit configuration of the A/D converter 100 of the first embodiment in which the sampling switch SS21 is off.

Hereinafter, the operation of the A/D converter 160 will be described with reference to a timing chart of FIG. 45 and connection diagrams of FIGS. 46 to 49.

Figure 45:
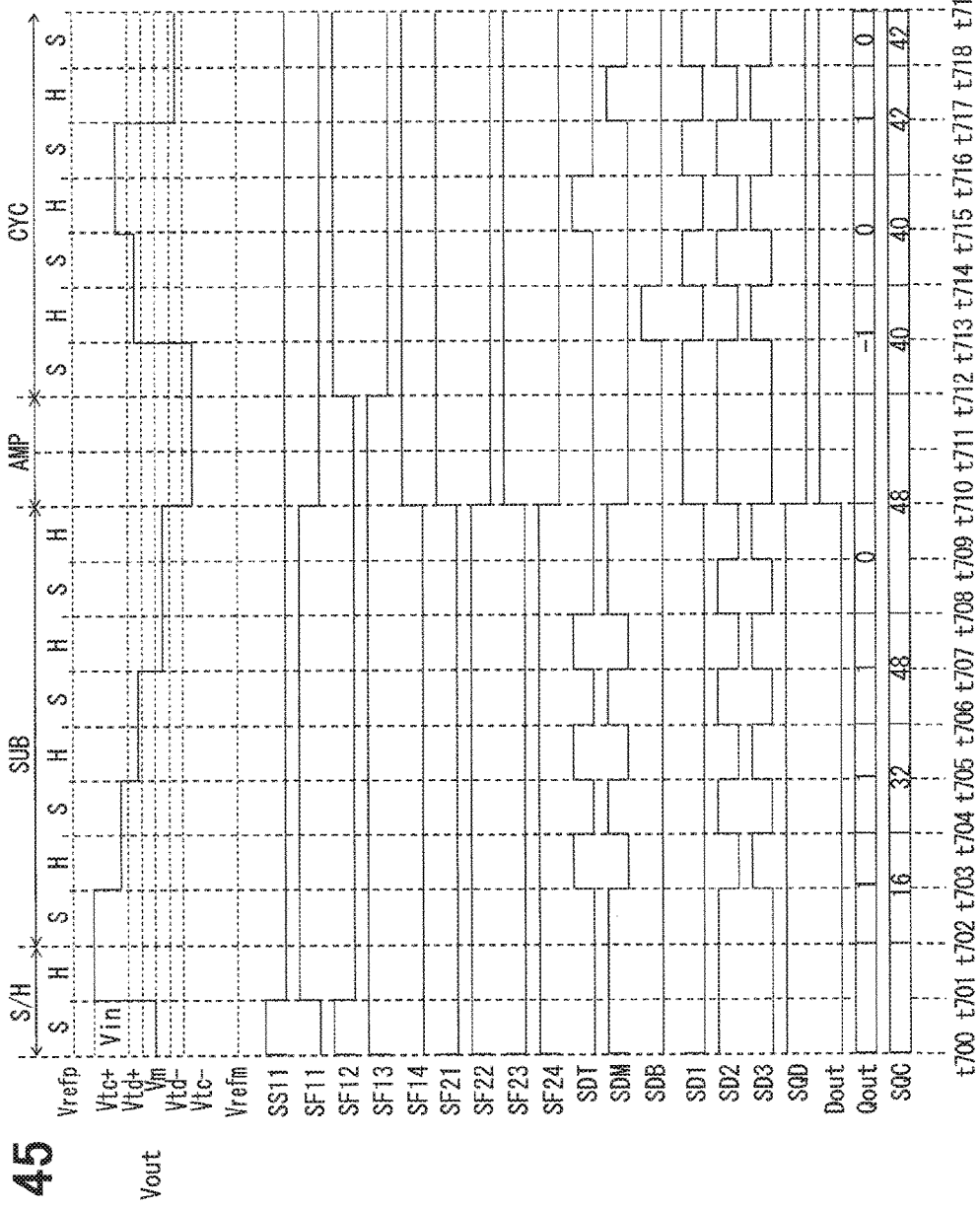
FIG. 45 is a timing chart showing the operation of the A/D converter.

As shown in FIG. 45, the A/D converter 160 relates to the A/D conversion of the input signal Vin, and performs a sample and hold operation (S/H in FIG. 45), a subtraction operation (SUB in FIG. 45), an amplification operation (AMP in FIG. 45), and a cyclic operation (CYC in FIG. 45).

Hereinafter, each operation will be described.

<Sample and Hold Operation (S/H): Sampling Period (S)>

Figure 46:
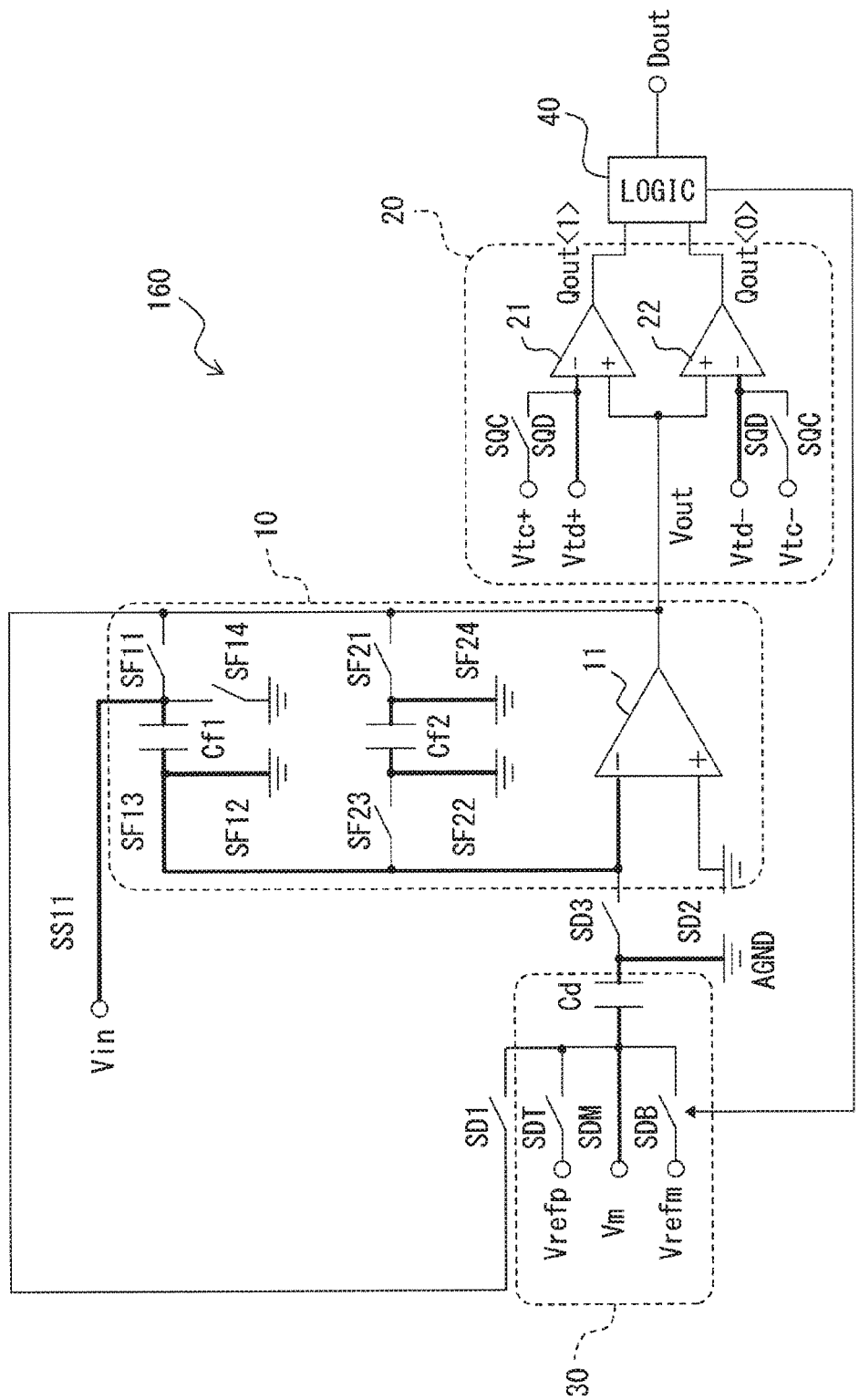
FIG. 46 is a connection diagram showing the operation of a sampling period related to a sample and hold operation.

At time t700 to time t701 shown in FIG. 45, charges corresponding to the input signal Vin are accumulated in the first feedback capacitor Cf1 by turning on the switch SS11 as shown in FIG. 46. In other words, in the sampling period related to the sample and hold operation according to the present embodiment, the input signal Vin is sampled only by the first feedback capacitor Cf1.

When the switches SF21 and SF23 are turned off and the switches SF22 and SF24 are turned on, the second feedback capacitor Cf2 is electrically disconnected from the operational amplifier 11 and is reset. After that, the second feedback capacitor Cf2 is kept in the same state in the holding period and the subtraction operation related to the sample and hold operation, which will be described later. Further, the switches SD1, SD3, SDT, and SDB are turned off, and the switches SDM and SD2 are turned on, so that the D/A converter capacitor Cd is reset.

<Sample and Hold Operation (S/H): Holding Period (H)>

Figure 47:
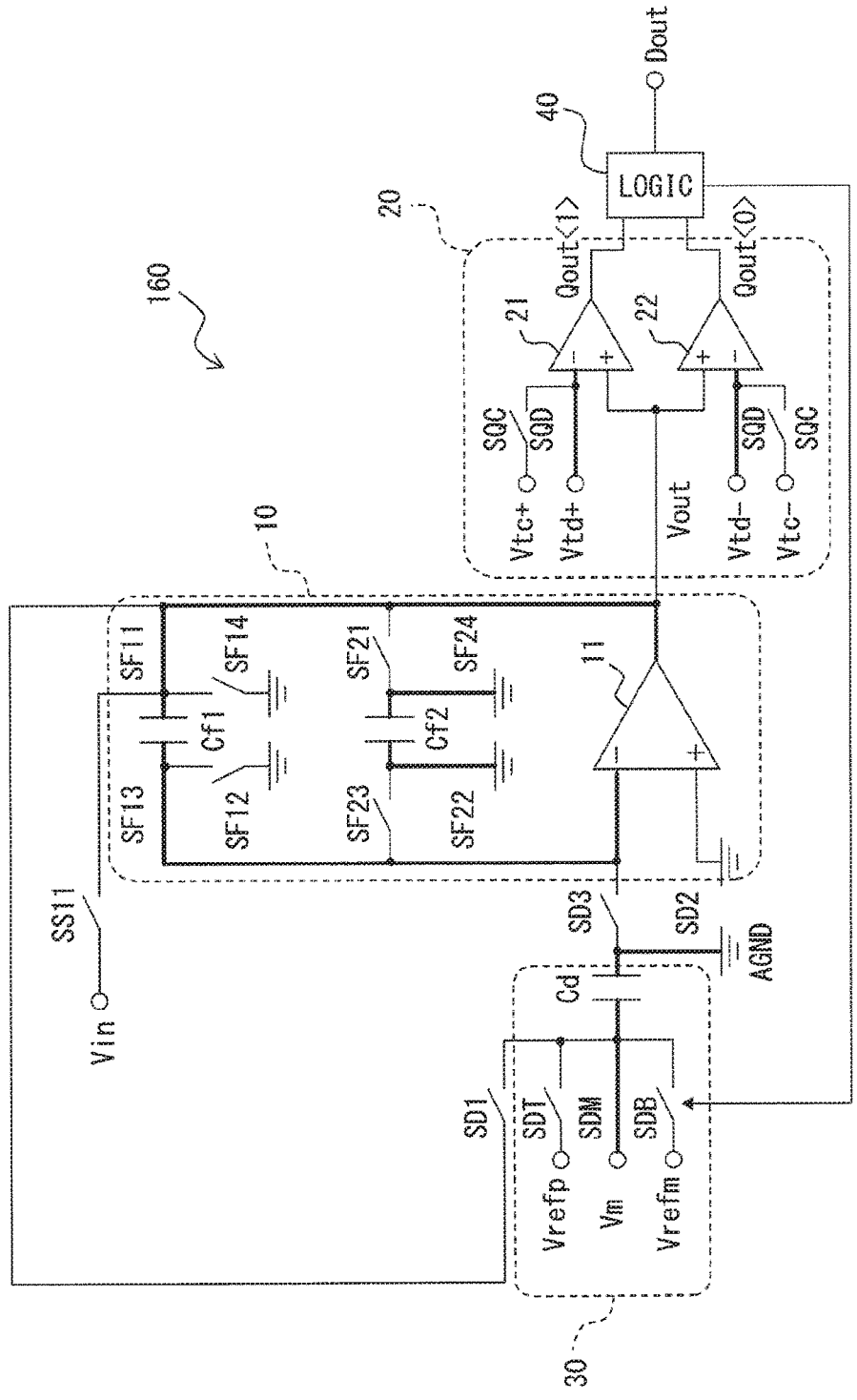
FIG. 47 is a connection diagram showing the operation of a sampling period related to a subtraction operation.

As shown in FIG. 47, when the switch SF12 and the switch SS11 are turned off and the first feedback switch SF11 is turned on, the output voltage Vout corresponding to the input signal Vin is output and the state of the input signal Vin is held.

<Subtraction Operation (SUB)>

Figure 48:
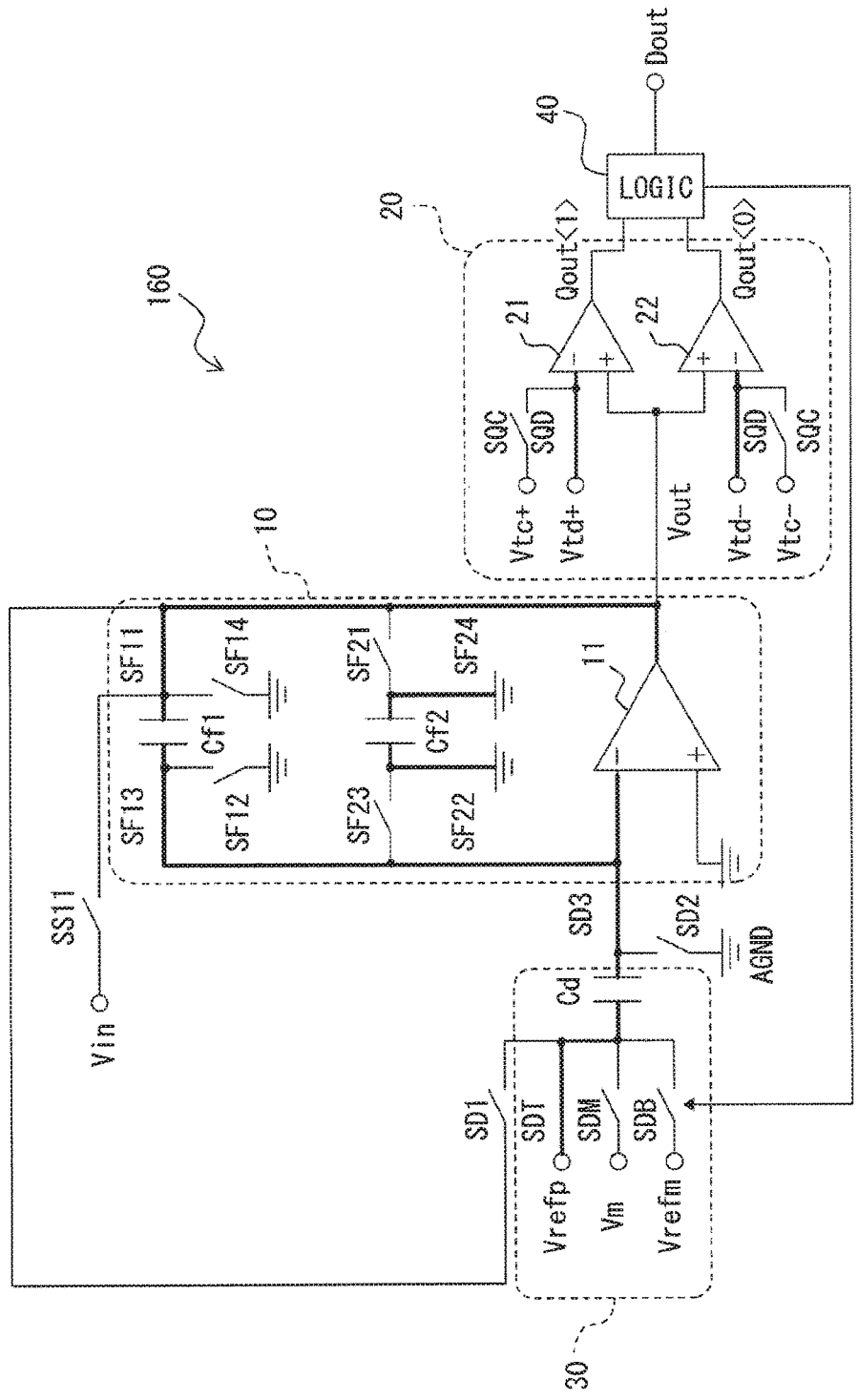
FIG. 48 is a connection diagram showing the operation of a holding period related to the subtraction operation.

The subtraction operation has a sampling period and a holding period as in the other embodiments. The state of connection of the switches in the sampling period related to the subtraction operation is the same as the holding period related to the sample and hold operation shown in FIG. 47. FIG. 48 shows the state of connection of the switches in the holding period related to the subtraction operation. Similar to the first embodiment, in the subtraction operation, subtraction based on the quantization result Qout is repeatedly performed with the use of the D/A converter 30.

<Amplification Operation (AMP)>

Figure 49:
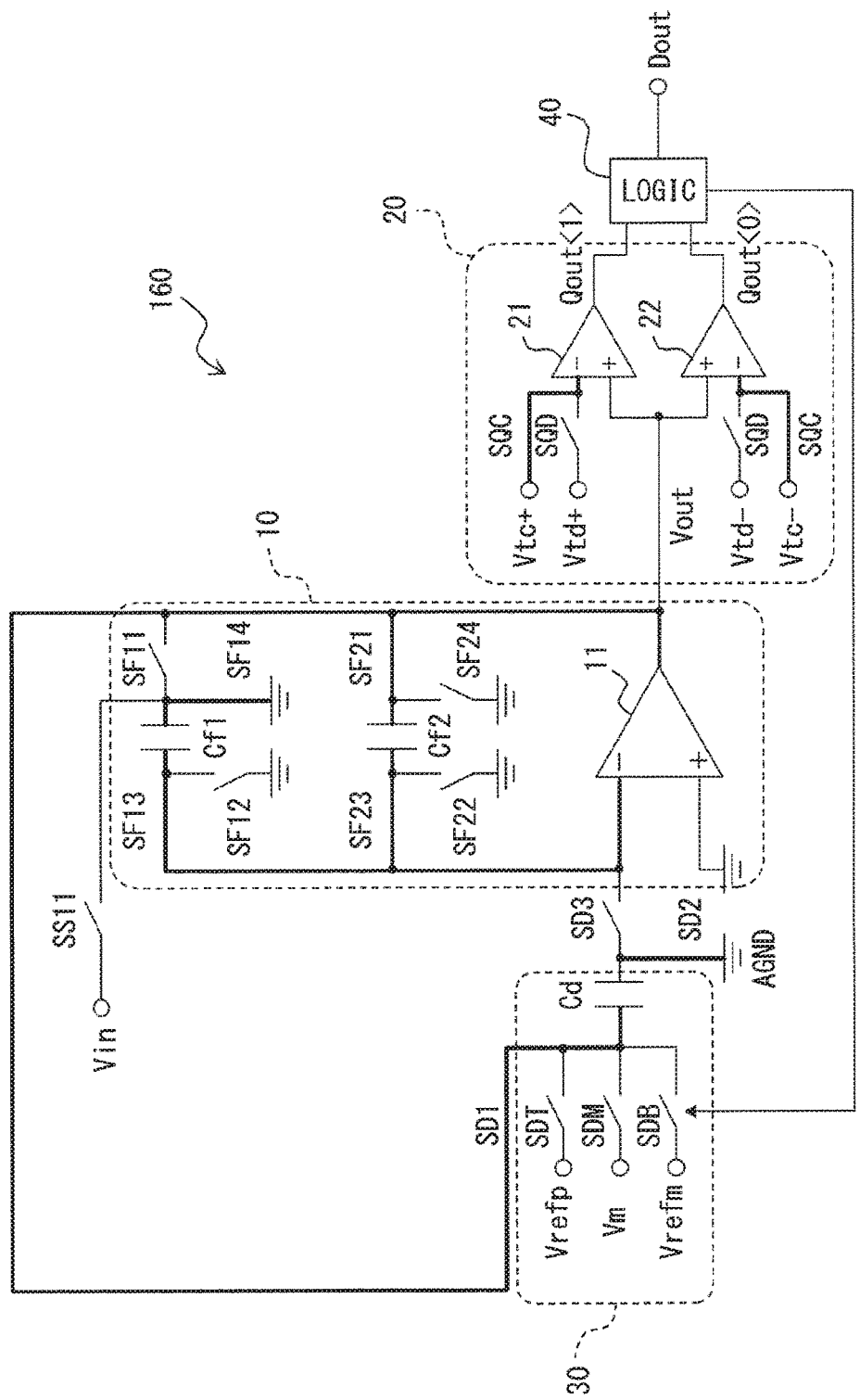
FIG. 49 is a connection diagram showing an amplification operation.

At time t710 to time t712 shown in FIG. 49, the amplification operation is executed. When the switches SF22 and SF24 are turned off and the switches SF21 and SF23 are turned on, the charges accumulated in the first feedback capacitor Cf1 are transferred to the second feedback capacitor Cf2, and the output voltage Vout is amplified. At time t710, the thresholds of the comparators 21 and 22 are changed to Vtc+ and Vtc−, respectively.

<Cyclic Operation (CYC)>

At time t712 to time t719, A/D conversion by the cyclic operation is performed. In the cyclic operation, similarly to the amplification operation, the switches SF22 and SF24 are turned off and the switches SF21 and SF23 are kept on, and the circuit configuration is substantially the same as that of the cyclic operation in the first embodiment.

As described above, it is not essential to perform sampling of the input signal Vin using multiple feedback capacitors, and sampling of the input signal Vin can be performed with the use of only a single feedback capacitor even in a configuration having multiple feedback capacitors. Also in a configuration in which sampling is performed with the use of multiple feedback capacitors, a feedback capacitor which is not used for sampling may be provided.

Further, in the amplification operation of each of the above-described embodiments, a longer operation time than the sampling period and the holding period related to the subtraction operation and the cyclic operation may be secured, so that the performance required for the operational amplifier and the switch may be relaxed. Similarly, the sampling period and the holding period related to the sample and hold operation may be made longer than the sampling period and the holding period related to the subtraction operation and the cyclic operation, thereby reducing the performance required for the operational amplifier and the switch.

Further, in each of the embodiments described above, the single ended circuit configuration has been described as an example for simplifying the description, but the A/D converters 100 to 160 may be configured using a differential circuit configuration.

In each of the embodiments described above, a configuration using a 1.5-bit quantizer has been described as an example, but a 1-bit quantizer or a 2-bit or more quantizer can be employed. In addition, the configuration of the D/A converter may be appropriately changed in accordance with the configuration of the quantizer.

The quantization result Qout and the A/D conversion result Dout shown in the above embodiments are illustrative examples, and differ depending on the magnitude of the input signal Vin.

What is claimed is:

1. An A/D converter comprising:
   an integrator that includes an operational amplifier, and a first feedback capacitor and a second feedback capacitor which are connected in parallel with each other between a first input terminal and an output terminal of the operational amplifier;
   a quantizer that outputs a quantization result obtained by quantizing an output signal output from the output terminal of the operational amplifier; and
   a D/A converter that includes a D/A converter capacitor having a first terminal connected to the first input terminal of the operational amplifier, wherein
   the integrator includes a first feedback switch interposed between the first feedback capacitor and the output terminal of the operational amplifier and a second feedback switch interposed between the second feedback capacitor and the output terminal of the operational amplifier,
   an input signal is input to at least one of a portion between the first feedback capacitor and the first feedback switch, and a portion between the second feedback capacitor and the second feedback switch,
   the D/A converter capacitor has a second terminal on an opposite side to the first terminal of the D/A converter capacitor, and the second terminal of the D/A converter is connected to the output terminal of the operational amplifier,
   the D/A converter repeatedly subtracts charges from charges accumulated in the first feedback capacitor and the second feedback capacitor based on the quantization result to perform A/D conversion of the input signal, and performs subtraction operation for outputting a residual of the A/D conversion as the output signal of the operational amplifier,
   the D/A converter transfers the charges accumulated in the first feedback capacitor to the second feedback capacitor after the subtraction operation to perform amplification operation for amplifying the residual of the A/D conversion in the subtraction operation,
   the D/A converter repeats subtraction and amplification sequentially based on the quantization result for the residual of the A/D conversion in the subtraction operation amplified by the amplification operation, to perform cyclic operation for A/D converting the residual of the A/D conversion in the subtraction operation, and
   the D/A converter performs the A/D conversion of the input signal by adding a result of the A/D conversion in the cyclic operation to a result of the A/D conversion in the subtraction operation.

2. The A/D converter according to claim 1, further comprising
   a third feedback capacitor in addition to the first feedback capacitor and the second feedback capacitor, wherein
   the D/A converter performs the amplification operation a plurality of times by sequentially transferring the charges accumulated in the first feedback capacitor and the third feedback capacitor to the second feedback capacitor.

3. The A/D converter according to claim 1, wherein
   the D/A converter includes a first D/A converter and a second D/A converter which are connected in parallel to the first input terminal of the operational amplifier, and performs the cyclic operation by alternately using the first D/A converter and the second D/A converter.

4. The A/D converter according to claim 1, wherein
   the D/A converter performs an error cancellation operation for transferring the charges accumulated in the second feedback capacitor to the D/A converter capacitor after the subtraction operation and before transitioning to the cyclic operation.

5. The A/D converter according to claim 1, wherein
   a cycle in which the amplification operation operates is longer than a cycle in which the subtraction operation and the cyclic operation operate.

6. The A/D converter according to claim 1, wherein
   a cycle in which the subtraction operation operates is shorter than a cycle in which the cyclic operation operates.

7. The A/D converter according to claim 1, wherein
   the D/A converter is used as a 5-level D/A converter in the subtraction operation.

8. The A/D converter according to claim 1, wherein
   the D/A converter is used as a three-level D/A converter in the cyclic operation.

* * * * *